(12) United States Patent
Okazaki et al.

(10) Patent No.: US 10,276,724 B2
(45) Date of Patent: Apr. 30, 2019

(54) SEMICONDUCTOR DEVICE

(71) Applicant: Semiconductor Energy Laboratory Co., Ltd., Atsugi-shi, Kanagawa-ken (JP)

(72) Inventors: Yutaka Okazaki, Kanagawa (JP); Akihisa Shimomura, Kanagawa (JP); Naoto Yamade, Kanagawa (JP); Tomoya Takeshita, Kanagawa (JP); Tetsuhiro Tanaka, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/204,015

(22) Filed: Jul. 7, 2016

(65) Prior Publication Data
US 2017/0018655 A1    Jan. 19, 2017

(30) Foreign Application Priority Data

Jul. 14, 2015    (JP) .................................. 2015-140794

(51) Int. Cl.
*H01L 29/786* (2006.01)
*H01L 29/66* (2006.01)
(Continued)

(52) U.S. Cl.
CPC .... *H01L 29/78696* (2013.01); *H01L 27/1225* (2013.01); *H01L 27/1255* (2013.01);
(Continued)

(58) Field of Classification Search
CPC ........... H01L 29/78696; H01L 29/7869; H01L 29/66969; H01L 29/78648; H01L 29/78618
See application file for complete search history.

(56) References Cited

U.S. PATENT DOCUMENTS 5,391,394 A * 2/1995 Hansen ................... C23C 16/04
257/E21.165
5,434,096 A * 7/1995 Chu ................... H01L 21/28061
148/DIG. 147
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
(Continued)

*Primary Examiner* — Cuong B Nguyen
(74) *Attorney, Agent, or Firm* — Fish & Richardson P.C.

(57) ABSTRACT

A transistor with favorable electrical characteristics is provided. One embodiment of the present invention is a semiconductor device including a semiconductor, a first insulator in contact with the semiconductor, a first conductor in contact with the first insulator and overlapping with the semiconductor with the first insulator positioned between the semiconductor and the first conductor, and a second conductor and a third conductor, which are in contact with the semiconductor. One or more of the first to third conductors include a region containing tungsten and one or more elements selected from silicon, carbon, germanium, tin, aluminum, and nickel.

17 Claims, 46 Drawing Sheets

(51) Int. Cl.
*H01L 29/45* (2006.01)
*H01L 29/49* (2006.01)
*H01L 27/12* (2006.01)

(52) U.S. Cl.
CPC .......... *H01L 29/45* (2013.01); *H01L 29/4908* (2013.01); *H01L 29/66969* (2013.01); *H01L 29/7869* (2013.01); *H01L 29/78609* (2013.01); *H01L 29/78648* (2013.01)

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,403,981 | B1 * | 6/2002 | Yu ..................... H01L 29/66742 257/616 |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,547,771 | B2 | 10/2013 | Koyama |
| 8,995,174 | B2 | 3/2015 | Koyama |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0102313 | A1 * | 4/2010 | Miyairi ............... H01L 27/1225 257/43 |
| 2010/0109002 | A1 | 5/2010 | Itagaki et al. |
| 2011/0248261 | A1 * | 10/2011 | Yamazaki ........... H01L 29/7869 257/43 |
| 2012/0273773 | A1 * | 11/2012 | Ieda ..................... H01L 27/105 257/43 |
| 2013/0146959 | A1 * | 6/2013 | Cheng ............... H01L 29/66181 257/310 |
| 2014/0363942 | A1 * | 12/2014 | Hong ................ H01L 21/28097 438/287 |
| 2015/0194498 | A1 * | 7/2015 | Yuan ................ H01L 29/42384 257/43 |
| 2015/0280691 | A1 | 10/2015 | Koyama |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 4863176 B2 | 1/2012 |
| JP | 5078070 B2 | 11/2012 |

(56) References Cited

FOREIGN PATENT DOCUMENTS

| JP | 2012-257187 A1 | 12/2012 |
|---|---|---|
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350°°C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO sOxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW'02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '09 : SID International Symposium Digest of Technical Papers, May 20, 2009, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 589-592.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorpous In—Ga—Zn-Oxide TFT",

(56) References Cited

OTHER PUBLICATIONS

SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Scrystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol, 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Phisical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2009, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielecric Layers", J. Electrochem. Soc. (Journal of The Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Cavaleiro.A et al., "Oxidation of sputtered W-based coatings", Surface and Contaings Technology, Sep. 1, 2000, vol. 131, pp. 441-447.

\* cited by examiner

FIG. 5A
FIG. 5B
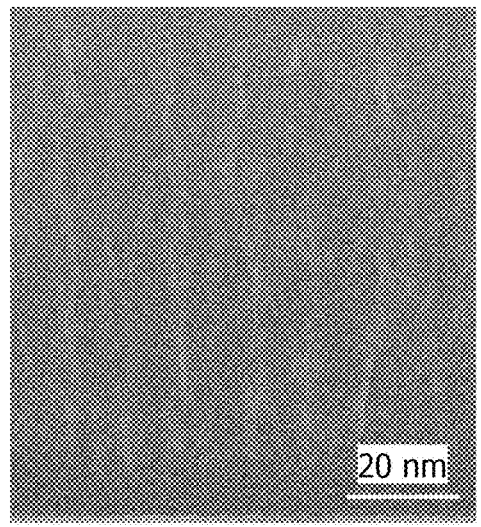
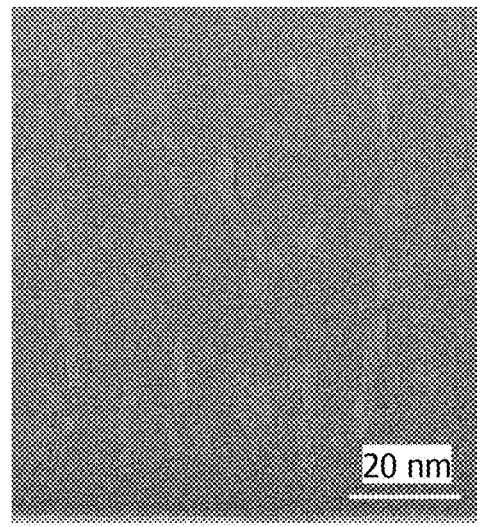

FIG. 39A1
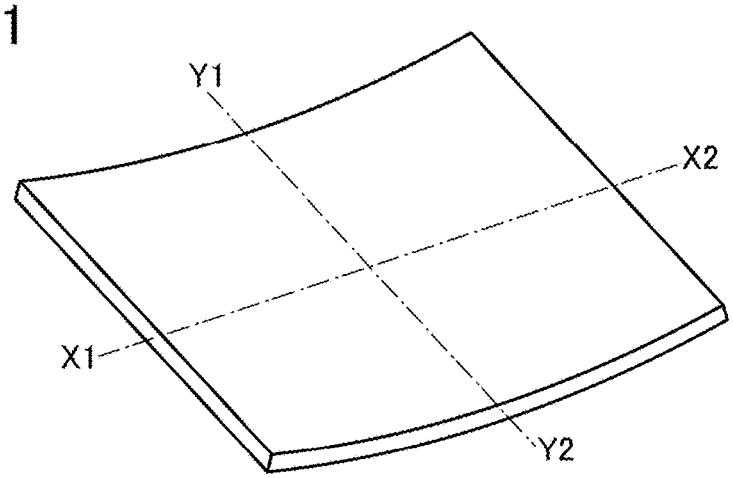
FIG. 39A2
FIG. 39A3
FIG. 39B1
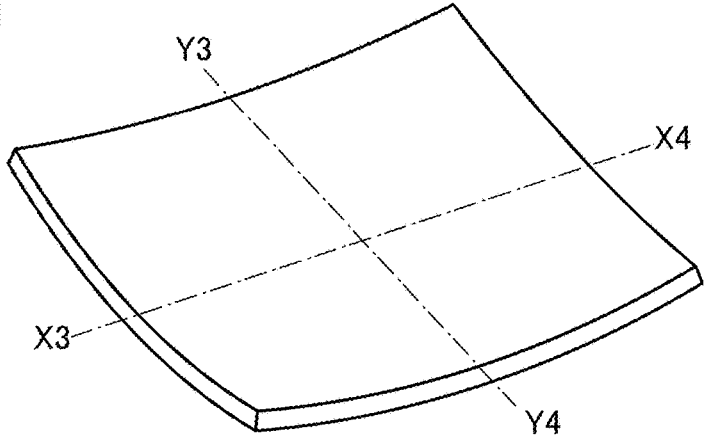
FIG. 39B2
FIG. 39B3

SEMICONDUCTOR DEVICE

BACKGROUND OF THE INVENTION

1. Field of the Invention

The present invention relates to, for example, a transistor, a semiconductor device, and manufacturing methods thereof. The present invention relates to, for example, a display device, a light-emitting device, a lighting device, a power storage device, a memory device, an imaging device, a processor, and an electronic device. The present invention relates to a method for manufacturing a display device, a liquid crystal display device, a light-emitting device, a memory device, an imaging device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

In recent years, a transistor including an oxide semiconductor has attracted attention. It is known that a transistor including an oxide semiconductor has an extremely low leakage current in an off state. For example, a low-power-consumption CPU utilizing a characteristic of low leakage current of the transistor including an oxide semiconductor is disclosed (see Patent Document 1).

Patent Document

[Patent Document 1] Japanese Published Patent Application No. 2012-257187

SUMMARY OF THE INVENTION

Heat treatment at a high temperature is performed in some cases to reduce impurities such as water or hydrogen in a transistor including an oxide semiconductor. Therefore, a gate electrode, a source electrode, or a drain electrode which is used in the transistor is preferably formed using a material having heat resistance and oxidation resistance.

Here, an object of one embodiment of the present invention is to provide a transistor including a conductor having heat resistance and oxidation resistance.

Another object is to provide a transistor with stable electrical characteristics. Another object is to provide a transistor having a low leakage current in an off state. Another object is to provide a transistor with high frequency characteristics. Another object is to provide a transistor having normally-off electrical characteristics. Another object is to provide a transistor having a small subthreshold swing value. Another object is to provide a transistor having high reliability.

Another object is to provide a semiconductor device including any of the transistors. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the description of these objects does not preclude the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a semiconductor, a first insulator in contact with the semiconductor, a first conductor in contact with the first insulator and overlapping with the semiconductor with the first insulator positioned between the semiconductor and the first conductor, and second and third conductors in contact with the semiconductor. One or more of the first to third conductors include a region containing tungsten (W) and one or more elements selected from silicon (Si), carbon (C), germanium (Ge), tin (Sn), aluminum (Al), and nickel (Ni).

Another embodiment of the present invention is the semiconductor device in which one or more of the first to third conductors include a region with a silicon concentration measured by Rutherford back scattering spectrometry (RBS) of greater than or equal to 5 atomic % and less than or equal to 70 atomic %.

Another embodiment of the present invention is the semiconductor device in which at least one of the first to the third conductors includes a region containing silicon and oxygen on a surface of the conductor. The thickness of the region is greater than or equal to 0.2 nm and less than or equal to 20 nm.

Another embodiment of the present invention is the semiconductor device including a second insulator in contact with the semiconductor, and a fourth conductor in contact with the second insulator and overlapping with the semiconductor with the second insulator positioned between the fourth conductor and the semiconductor. The fourth conductor includes a region containing tungsten and one or more elements selected from silicon, carbon, germanium, tin, aluminum, and nickel.

Another embodiment of the present invention is the semiconductor device in which the fourth conductor includes a region with a silicon concentration measured by Rutherford back scattering spectrometry (RBS) of greater than or equal to 5 atomic % and less than or equal to 70 atomic %.

Another embodiment of the present invention is the semiconductor device in which the fourth conductor includes a region containing silicon and oxygen on a surface of the conductor. The thickness of the region is greater than or equal to 0.2 nm and less than or equal to 20 nm.

Another embodiment of the present invention is the semiconductor device in which the semiconductor includes an oxide semiconductor.

According to one embodiment of the present invention, a transistor that is formed using a conductor having heat resistance and oxidation resistance.

A transistor with stable electrical characteristics can be provided. A transistor having a low leakage current in an off state can be provided. A transistor with high frequency characteristics can be provided. A transistor with normally-off electrical characteristics can be provided. A transistor with a small subthreshold swing value can be provided. A highly reliable transistor can be provided.

A semiconductor device including the transistor can be provided. A module including the semiconductor device can be provided. An electronic device including the semiconductor device or the module can be provided. A novel semiconductor device can be provided. A novel module can be provided. A novel electronic device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 5A and 5B show cross-sectional TEM images of an a-like OS.

FIGS. 39A1, 39A2, 39A3, 39B1, 39B2, and 39B3 are perspective views and cross-sectional views of a semiconductor device of one embodiment of the present invention.

DETAILED DESCRIPTION OF THE INVENTION

Figure 1A:
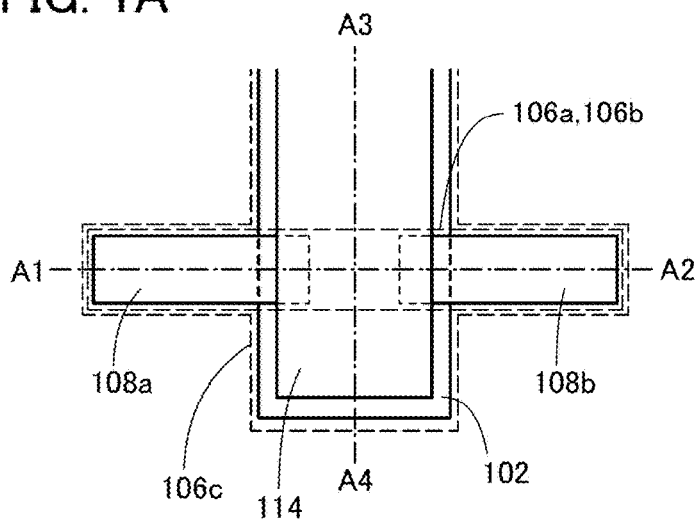
FIGS. 1A to 1D are a top view and cross-sectional views illustrating a transistor of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential. Note that in general, a potential (a voltage) is relative and is determined depending on the amount relative to a reference potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon layer, examples of an impurity which changes characteristics of the semiconductor include oxygen, Group 1 elements except hydrogen, Group 2 elements, Group 13 elements, and Group 15 elements.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values might be different from those calculated by using an effective channel width.

Note that in this specification, the description "A has a shape such that an end portion extends beyond an end portion of B" may indicate, for example, the case where at least one of end portions of A is positioned on an outer side than at least one of end portions of B in a plan view or a cross-sectional view. Thus, the description "A has a shape such that an end portion extends beyond an end portion of B" can be read as the description "one end portion of A is positioned on an outer side than one end portion of B in a top view," for example.

In this specification, the term "semiconductor" can be replaced with any term for various semiconductors in some cases. For example, the term "semiconductor" can be replaced with the term for a Group 14 semiconductor such as silicon or germanium; an oxide semiconductor; a compound semiconductor such as silicon carbide, germanium silicide, gallium arsenide, indium phosphide, zinc selenide, or cadmium sulfide; or an organic semiconductor.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, structures of semiconductor devices of embodiments of the present invention are described with reference to FIGS. 1A to 1D to FIGS. 12A to 12D.
<Structure of Transistor>

The structure of a transistor is described below as an example of the semiconductor device of one embodiment of the present invention.

Figure 1B:
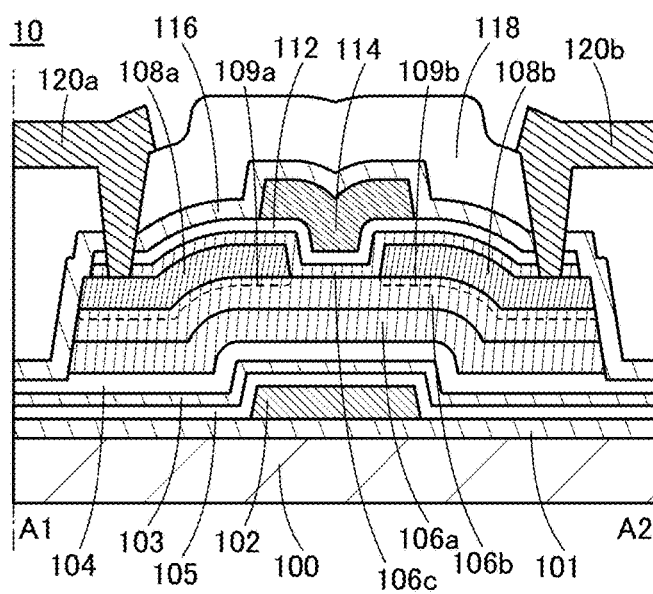
Figure 1C:
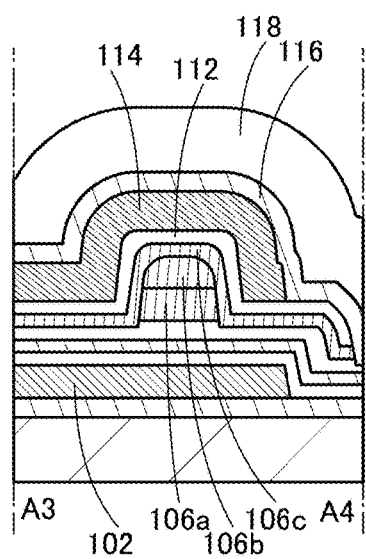

The structure of a transistor 10 is described with reference to FIGS. 1A to 1C. FIG. 1A is a top view of the transistor 10. FIG. 1B is a cross-sectional view taken along a dashed-dotted line A1-A2 in FIG. 1A, and FIG. 1C is a cross-sectional view taken along a dashed-dotted line A3-A4 in FIG. 1A. A region along dashed-dotted line A1-A2 shows a structure of the transistor 10 in the channel length direction, and a region along dashed-dotted line A3-A4 shows a structure of the transistor 10 in the channel width direction. The channel length direction of a transistor refers to a direction in which carriers move between a source (a source region or a source electrode) and a drain (a drain region or a drain electrode). The channel width direction refers to a direction perpendicular to the channel length direction in a plane parallel to a substrate. An insulator 106a, a semiconductor 106b, and an insulator 106c can be provided to substantially overlap with conductors 108a and 108b and the like; however, for clarity of the top view, the insulator 106a, the semiconductor 106b, and the insulator 106c are denoted with a thin dashed line in FIG. 1A as being misaligned.

The transistor 10 includes an insulator 101, a conductor 102, and insulators 105, 103, and 104 which are over the substrate 100; the insulator 106a, the semiconductor 106b and the insulator 106c which are over the insulator 104; the conductors 108a and 108b over the semiconductor 106b; an insulator 112 over the insulator 106c; a conductor 114 over the insulator 112; an insulator 116 over the conductor 114; an insulator 118; and conductors 120a and 120b.

Here, the insulator 101, the insulator 103, the insulator 104, the insulator 105, the insulator 106a, the insulator 106c, the insulator 112, the insulator 116, and the insulator 118 can also be referred to as insulating films or insulating layers. The conductor 102, the conductor 108a, the conductor 108b, the conductor 114, the conductor 120a, and the conductor 120b can also be referred to as conductive films or conductive layers. The semiconductor 106b can also be referred to as a semiconductor film or a semiconductor layer.

Note that the insulator 106a and/or the insulator 106c are/is not necessarily provided.

One or more of the insulator 105, the insulator 103, and the insulator 104 may be provided. For example, the structure may be either a single layer structure of the insulator 104 or a stacked layer structure of the insulator 103 and the insulator 104.

As will be described in detail later, the insulator 106a and the insulator 106c are sometimes formed using a material that can function as a conductor or a semiconductor when the material is used alone. However, when the transistor is formed using the semiconductor 106b between the insulator 106a and the insulator 106c as a stack, carriers flow in the semiconductor 106b, in the vicinity of the interface between the semiconductor 106b and the insulator 106a, and in the vicinity of the interface between the semiconductor 106b and the insulator 106c; thus, the insulator 106a and the insulator 106c have a region not functioning as a channel of the transistor. For that reason, in the present specification and the like, the insulators 106a and 106c are not referred to as conductors or semiconductors but referred to as insulators.

Over the insulator 101 formed over the substrate 100, the conductor 102 is formed. At least part of the conductor 102 overlaps with the insulator 106a, the semiconductor 106b, and the insulator 106c. The insulator 105 is formed over and in contact with the conductor 102 to cover the conductor 102. The insulator 103 is formed over the insulator 105, and the insulator 104 is formed over the insulator 103.

The insulator 106a is formed over the insulator 104, and the semiconductor 106b is formed in contact with a top surface of the insulator 106a. Although end portions of the insulator 106a and the semiconductor 106b are substantially aligned in FIG. 1B, the structure of the semiconductor device described in this embodiment is not limited to this example.

The conductor 108a and the conductor 108b are formed in contact with the semiconductor 106b. The conductor 108a and the conductor 108b are spaced from each other and function as a source electrode and a drain electrode of the transistor 10.

The insulator 106c is formed in contact with the semiconductor 106b. The insulator 106c is preferably in contact with the semiconductor 106b in a region sandwiched between the conductor 108a and the conductor 108b. Although the insulator 106c is formed to cover top surfaces of the conductor 108a and the conductor 108b in FIG. 1B, the structure of the semiconductor device described in this embodiment is not limited to this example.

The insulator 112 is formed over the insulator 106c. The conductor 114 is formed over the insulator 112. Although the insulator 112 and the insulator 106c are formed such that end portions of the insulator 112 and the insulator 106c are substantially aligned to each other in FIG. 1B, the structure of the semiconductor device described in this embodiment is not limited to this example. Note that the conductor 114 can function as a gate electrode of the transistor 10.

The insulator 116 is formed over the conductor 114 and the insulator 112, and the insulator 118 is formed over the insulator 116. The conductor 120a and the conductor 120b are formed over the insulator 118. The conductor 120a and the conductor 120b are connected to the conductor 108a and the conductor 108b through openings formed in the insulator 106c, the insulator 112, the insulator 116, and the insulator 118.

One or more of the conductor 102, the conductor 114, the conductor 108a, and the conductor 108b preferably includes a region containing tungsten and one or more elements selected from silicon, carbon, germanium, tin, aluminum, and nickel.

In particular, conductors each including a region containing tungsten and silicon are preferably used as the conductors in this embodiment. Furthermore, the conductors preferably include a region with the silicon concentration higher than or equal to 5 atomic % and less than or equal to 70 atomic % that is measured by RBS.

When tungsten is deposited by a sputtering method or the like, the tungsten film may be a conductor having crystallinity. Accordingly, the surface flatness of the conductor is low in some cases. However, when the conductors described in the present invention are used, conductors each including an amorphous part can be formed. Thus, conductors having high surface flatness are easily formed.

The conductor preferably includes a region containing silicon and oxygen on the surface of the conductor, and the thickness of the region is preferably greater than or equal to 0.2 nm and less than or equal to 20 nm. The region contains a large amount of silicon and oxygen, in which case the region can function as an insulator. The region functions as a barrier layer against oxygen, whereby oxidation of the entire conductor can be prevented.

When the conductors described above are used as the conductor 102, the conductor 114, the conductor 108a, and the conductor 108b, oxidation of the entire conductors can be prevented even in the case where the conductors are subjected to heat treatment or exposed to an oxidation atmosphere in manufacturing the transistor 10, for example. Accordingly, an increase in the resistance of the conductors can be suppressed; thus, a transistor having favorable electrical characteristics (e.g., on-state current) can be manufactured.

<Semiconductor>

The structure of the semiconductor 106b is described in detail below.

A detailed structure of each of the insulator 106a and the insulator 106c will be described in addition to that of the semiconductor 106b.

The semiconductor 106b is an oxide semiconductor containing indium, for example. The semiconductor 106b can have high carrier mobility (electron mobility) by containing indium, for example. The semiconductor 106b preferably contains an element M. The element M is preferably Ti, Ga, Y, Zr, La, Ce, Nd, Sn, or Hf Note that two or more of the above elements may be used in combination as the element M in some cases. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 106b preferably contains zinc. When the oxide semiconductor contains zinc, the oxide semiconductor is easily crystallized, in some cases.

Note that the semiconductor 106b is not limited to the oxide semiconductor containing indium. The semiconductor 106b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For example, the insulator 106a and the insulator 106c are oxide semiconductors including one or more elements, or two or more elements other than oxygen included in the semiconductor 106b. Since the insulator 106a and the insulator 106c each include one or more elements, or two or more elements other than oxygen included in the semiconductor 106b, a defect state is less likely to be formed at the interface between the insulator 106a and the semiconductor 106b and the interface between the semiconductor 106b and the insulator 106c.

The insulator 106a, the semiconductor 106b, and the insulator 106c preferably include at least indium. In the case of using an In-M-Zn oxide as the insulator 106a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 106b, when the total proportion of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the insulator 106c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the insulator 106c may be an oxide that is of the same type as the oxide of the insulator 106a. Note that the insulator 106a and/or the insulator 106c do/does not necessarily contain indium in some cases. For example, the insulator 106a and/or the insulator 106c may be gallium oxide. Note that the atomic ratio between the elements included in the insulator 106a, the semiconductor 106b, and the insulator 106c is not necessarily a simple integer ratio. Furthermore, the composition is measured by RBS or the like.

In the case of deposition using a sputtering method, typical examples of the atomic ratio between the metal elements of a target that is used for the insulator 106a or the insulator 106c include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, and In:M:Zn=1:6:9.

In the case of deposition using a sputtering method, typical examples of the atomic ratio between the metal elements of a target that is used for the semiconductor 106b include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, and In:M:Zn=5:1:7. In particular, when a sputtering target containing In, Ga, and Zn at an atomic ratio of 4:2:4.1 is used, the deposited semiconductor 106b may contain In, Ga, and Zn at an atomic ratio of around 4:2:3.

An indium gallium oxide has small electron affinity and a high oxygen-blocking property. Therefore, the insulator 106c preferably includes an indium gallium oxide. The gallium atomic ratio [Ga/(In+Ga)] is, for example, higher than or equal to 70%, preferably higher than or equal to 80%, further preferably higher than or equal to 90%.

For the semiconductor 106b, an oxide with a wide energy gap may be used, for example. For example, the energy gap of the semiconductor 106b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Here, the energy gap of the insulator 106a is larger than that of the semiconductor 106b. The energy gap of the insulator 106c is larger than that of the semiconductor 106b.

As the semiconductor 106b, an oxide having an electron affinity higher than those of the insulators 106a and 106c is used. For example, as the semiconductor 106b, an oxide having an electron affinity higher than those of the insulators 106a and 106c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum. In other words, the energy level of the conduction band minimum of the insulator 106a or the insulator 106c is closer to the vacuum level than the energy level of the conduction band minimum of the semiconductor 106b is.

In that case, when a gate voltage is applied, a channel is formed in the semiconductor 106b having the highest electron affinity among the insulator 106a, the semiconductor 106b, and the insulator 106c. Note that when a high gate voltage is applied, a current also flows in the insulator 106a near the interface with the semiconductor 106b and in the insulator 106c near the interface with the semiconductor 106b in some cases.

The insulator 106a and the insulator 106c are formed using a substance that can function as a conductor, a semiconductor, or an insulator when they are used alone. However, when the transistor is formed using a stack including the insulator 106a, the semiconductor 106b, and the insulator 106c, electrons flow in the semiconductor 106b in the vicinity of the interface between the semiconductor 106b and the insulator 106a, and in the vicinity of the interface between the semiconductor 106b and the insulator 106c; thus, the insulator 106a and the insulator 106c have a region not functioning as a channel of the transistor. For that reason, in this specification and the like, the insulator 106a and the insulator 106c are not referred to as a semiconductor but an insulator. Note that the reason why the insulator 106a and the insulator 106c are referred to as an insulator is because they are closer to an insulator than the semiconductor 106b is in terms of their function in the transistor; thus, a substance that can be used for the semiconductor 106b is used for the insulator 106a and the insulator 106c in some cases.

Here, in some cases, there is a mixed region of the insulator 106a and the semiconductor 106b between the insulator 106a and the semiconductor 106b. Furthermore, in some cases, there is a mixed region of the semiconductor 106b and the insulator 106c between the semiconductor 106b and the insulator 106c. The mixed region has a low density of interface states. For that reason, the stack including the insulator 106a, the semiconductor 106b, and the insulator 106c has a band structure where energy is changed continuously at each interface and in the vicinity of the interface (continuous junction). Note that the boundary between the insulator 106a and the semiconductor 106b and the boundary between the insulator 106c and the semiconductor 106b are not clear in some cases.

At this time, electrons move mainly in the semiconductor 106b, not in the insulator 106a and the insulator 106c. As described above, when the density of interface states at the interface between the insulator 106a and the semiconductor 106b and the density of interface states at the interface between the semiconductor 106b and the insulator 106c are decreased, electron movement in the semiconductor 106b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of the top surface or the bottom surface (a formation surface; here, the top surface of the insulator 106a) of the semiconductor 106b is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using, for example, a scanning probe microscope SPA-500 manufactured by SII Nano Technology Inc.

Moreover, the thickness of the insulator 106c is preferably as small as possible to increase the on-state current of the transistor. It is preferable that the thickness of the insulator 106c be smaller than that of the insulator 106a and smaller than that of the semiconductor 106b. For example, the insulator 106c is formed to include a region having a thickness of less than 10 nm, preferably less than or equal to 5 nm, more preferably less than or equal to 3 nm. Meanwhile, the insulator 106c has a function of blocking entry of elements other than oxygen (such as hydrogen and silicon) included in the adjacent insulator into the semiconductor 106b where a channel is formed. For this reason, it is preferable that the insulator 106c have a certain thickness. For example, the insulator 106c is formed to include a region having a thickness of greater than or equal to 0.3 nm, preferably greater than or equal to 1 nm, more preferably greater than or equal to 2 nm.

To improve reliability, preferably, the thickness of the insulator 106a is large. For example, the insulator 106a includes a region with a thickness of, for example, greater than or equal to 10 nm, preferably greater than or equal to 20 nm, more preferably greater than or equal to 40 nm, still more preferably greater than or equal to 60 nm. When the thickness of the insulator 106a is made large, a distance from an interface between the adjacent insulator and the insulator 106a to the semiconductor 106b in which a channel is formed can be large. Since the productivity of the semiconductor device might be decreased, the insulator 106a has a region with a thickness of, for example, less than or equal to 200 nm, preferably less than or equal to 120 nm, more preferably less than or equal to 80 nm.

Silicon in the oxide semiconductor might serve as a carrier trap or a carrier generation source. Thus, the silicon concentration in the semiconductor 106b is preferably as low as possible. For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $2\times10^{18}$ atoms/cm$^3$ is provided between the semiconductor 106b and the insulator 106a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $2\times10^{18}$ atoms/cm$^3$ is provided between the semiconductor 106b and the insulator 106c.

It is preferable to reduce the hydrogen concentration in the insulator 106a and the insulator 106c in order to reduce the hydrogen concentration in the semiconductor 106b. The insulator 106a and the insulator 106c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, or still more preferably higher than or equal to $1\times10^{16}$ atoms/cm$^3$ and lower than or equal to $5\times10^{18}$ atoms/cm$^3$. It is preferable to reduce the nitrogen concentration in the insulator 106a and the insulator 106c in order to reduce the nitrogen concentration in the semiconductor 106b. The insulator 106a and the insulator 106c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, more preferably higher than or equal to $1\times10^{15}$ atoms/cm$^3$ and lower than or equal to $1\times10^{18}$ atoms/cm$^3$, or still more preferably higher than or equal to $1\times10^{15}$ atoms/cm$^3$ and lower than or equal to $5\times10^{17}$ atoms/cm$^3$.

The insulator 106a, the semiconductor 106b, and the insulator 106c described in this embodiment (in particular, the semiconductor 106b) are oxide semiconductors having a low impurity concentration and a low density of defect states (a small number of oxygen vacancies), and can be referred to as "highly purified intrinsic" or "substantially highly purified intrinsic" oxide semiconductors. A highly purified intrinsic or substantially highly purified intrinsic oxide semiconductor has few carrier generation sources, and thus has a low carrier density in some cases. Thus, a transistor including a channel region in the oxide semiconductor is less likely to have a negative threshold voltage (normally-on characteristics). A highly purified intrinsic or substantially highly purified intrinsic oxide semiconductor film has a low density of defect states and thus has a low density of trap states in some cases. Furthermore, a highly purified intrinsic or substantially highly purified intrinsic oxide semiconductor has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V even when an element has a channel width W of $1\times10^6$ µm and a channel length L of 10 µm Accordingly, the transistor in which the channel region is formed in the highly purified intrinsic or substantially highly purified intrinsic oxide semiconductor can have a small variation in electrical characteristics and high reliability. Charge trapped by the trap states in the oxide semiconductor takes a long time to be released and may behave like fixed charge. Thus, the transistor whose channel region is formed in the oxide semiconductor having a high density of trap states has unstable electrical characteristics in some cases. Examples of impurities that form trap states in an oxide semiconductor are hydrogen, nitrogen, alkali metal, and alkaline earth metal.

Hydrogen contained in the insulator 106a, the semiconductor 106b, and the insulator 106c reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Hydrogen trapped by an oxygen vacancy might form a shallow donor level in a band structure of a semiconductor. Thus, a transistor including an oxide semiconductor that contains hydrogen is likely to be normally on. For this reason, it is preferable that hydrogen be reduced as much as possible in the insulator 106a, the semiconductor 106b, and the insulator 106c. Specifically, the hydrogen concentration in the insulator 106a, the semiconductor 106b, and the insulator 106c, which is measured by SIMS, is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$, yet more preferably lower than or equal to $1\times10^{18}$ atoms/cm$^3$, even more preferably lower than or equal to $5\times10^{17}$ atoms/cm$^3$, and more preferably lower than or equal to $1\times10^{16}$ atoms/cm$^3$.

When the insulator 106a, the semiconductor 106b, and the insulator 106c contain silicon or carbon, which is one of elements belonging to Group 14, oxygen vacancies in the insulator 106a and the semiconductor 106b are increased, which makes the insulator 106a, the semiconductor 106b, and the insulator 106c n-type. Thus, the concentration of silicon or carbon (measured by SIMS) in the insulator 106a, the semiconductor 106b, and the insulator 106c or the concentration of silicon or carbon (measured by SIMS) in the vicinity of the interface with the insulator 106a, the semiconductor 106b, and the insulator 106c is set to be lower than or equal to $2\times10^{18}$ atoms/cm$^3$, preferably lower than or equal to $2\times10^{17}$ atoms/cm$^3$.

In addition, the concentration of an alkali metal or alkaline earth metal in the insulator 106a, the semiconductor 106b, and the insulator 106c, which is measured by SIMS, is set to be lower than or equal to $1\times10^{18}$ atoms/cm$^3$, preferably lower than or equal to $2\times10^{16}$ atoms/cm$^3$. An alkali metal and an alkaline earth metal might generate carriers when bonded to an oxide semiconductor, in which case the off-state current of the transistor might be increased. Thus, it is preferable to reduce the concentration of an alkali metal or alkaline earth metal in the insulator 106a, the semiconductor 106b, and the insulator 106c.

Furthermore, when containing nitrogen, the insulator 106a, the semiconductor 106b, and the insulator 106c easily become n-type by generation of electrons serving as carriers and an increase in carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

Figure 1D:
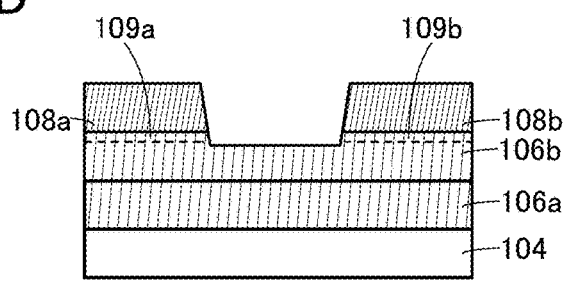

FIG. 1D is an enlarged cross-sectional view illustrating the middle portion of the insulator 106a and the semiconductor 106b and the vicinity of the middle portion. As illustrated in FIGS. 1B and 1D, regions of the semiconductor 106b that are in contact with the conductor 108a and the conductor 108b (which are denoted with dotted lines in FIGS. 1B and 1D) include a low-resistance region 109a and a low-resistance region 109b in some cases. The low-resistance region 109a and the low-resistance region 109b may be formed when oxygen is extracted by the conductor 108a and the conductor 108b that are in contact with the semiconductor 106b, or when a conductive material in the conductor 108a or the conductor 108b is bonded to an element in the semiconductor 106b. The formation of the low-resistance region 109a and the low-resistance region 109b leads to a reduction in contact resistance between the conductor 108a or 108b and the semiconductor 106b, whereby the transistor 10 can have high on-state current.

Although not illustrated, a low-resistance region is sometimes formed in regions of the insulator 106c that are in contact with the conductor 108a and the conductor 108b. In the following drawings, a dotted line denotes a low-resistance region.

As illustrated in FIG. 1D, the semiconductor 106b might have a smaller thickness in a region between the conductor 108a and the conductor 108b than in regions overlapping with the conductor 108a and the conductor 108b. The thin region is formed because part of the top surface of the semiconductor 106b is removed during formation of the conductor 108a and the conductor 108b. In formation of the conductor to be the conductor 108a and the conductor 108b, a region with low resistance like the low-resistance regions 109a and 109b is formed on the top surface of the semiconductor 106b in some cases. The removal of the region that is on the top surface of the semiconductor 106b and between the conductor 108a and the conductor 108b can prevent a channel from being formed in the low-resistance region on the top surface of the semiconductor 106b. In the drawings, even when a thin region is not drawn in an enlarged view or the like, such a thin region might be formed.

Note that the three-layer structure including the insulator 106a, the semiconductor 106b, and the insulator 106c is an example. For example, a two-layer structure not including the insulator 106a or the insulator 106c may be employed. Alternatively, a single-layer structure not including the insulator 106a and the insulator 106c may be employed. Further alternatively, it is possible to employ an n-layer structure (n is an integer of four or more) that includes any of the insulator, semiconductor, and conductor given as examples of the insulator 106a, the semiconductor 106b, and the insulator 106c.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 2A:
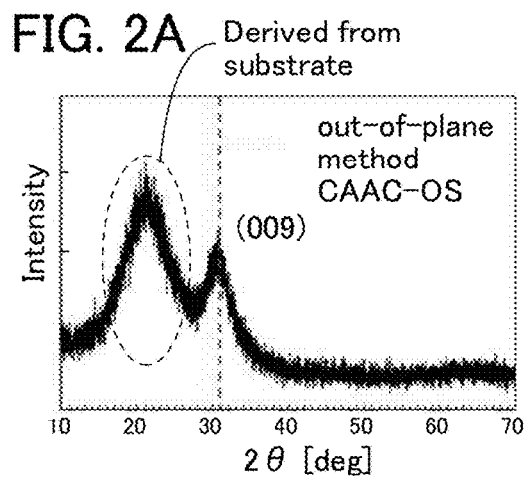
FIGS. 2A to 2E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 2A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 2B:
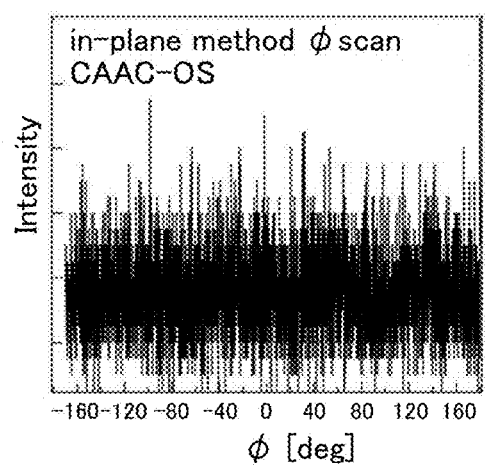
Figure 2C:
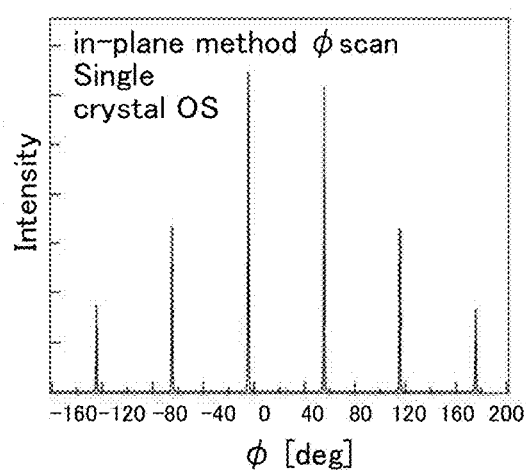

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 2B, a peak is not clearly observed. In contrast, in the case where single crystal InGaZnO$_4$ is subjected to φ scan with 2θ fixed at around 56°, as shown in FIG. 2C, six peaks which are derived from crystal planes equivalent to the (110) plane are observed. Accordingly, the structural analysis using XRD shows that the directions of a-axes and b-axes are irregularly oriented in the CAAC-OS.

Figure 2D:
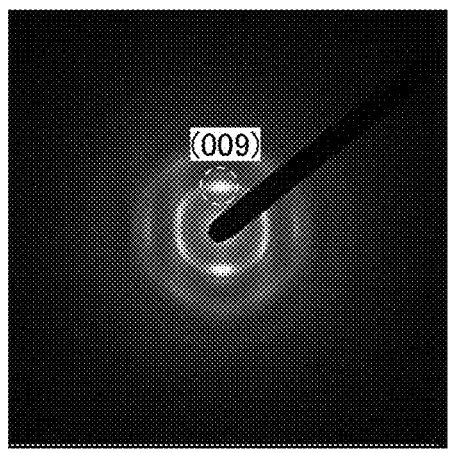
Figure 2E:
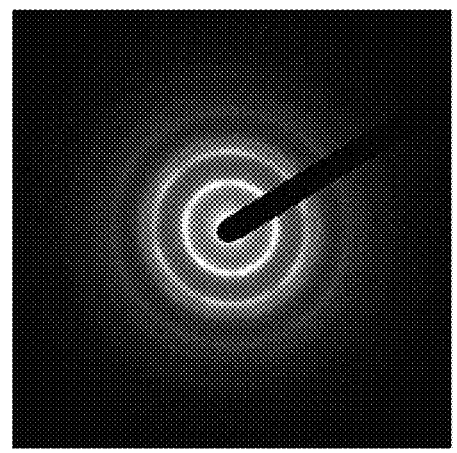

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 2D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 2E shows a diffraction pattern obtained in such a manner that an electron beam with a probe diameter of 300 nm is incident on the same sample in a direction perpendicular to the sample surface. As shown in FIG. 2E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 2E is considered to be derived from the (010) plane, the (100) plane, and the like of the InGaZnO$_4$ crystal. The second ring in FIG. 2E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 3A:
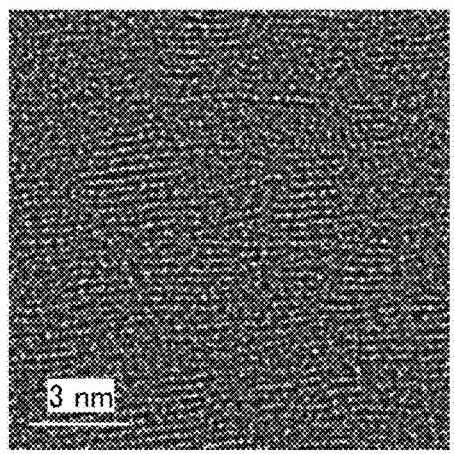
FIGS. 3A to 3E show a cross-sectional TEM image and plan-view TEM images of a CAAC-OS and images obtained through analysis thereof.

FIG. 3A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 3A shows pellets in which metal atoms are arranged in a layered manner. FIG. 3A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 3B:
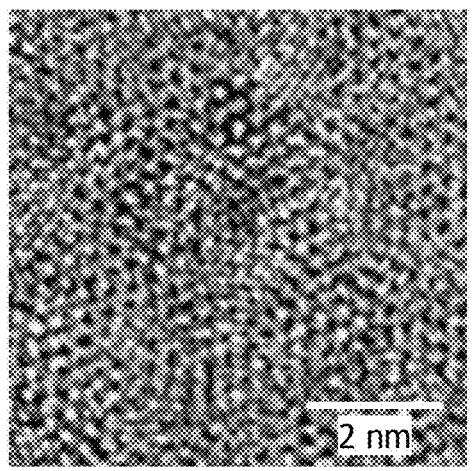
Figure 3C:
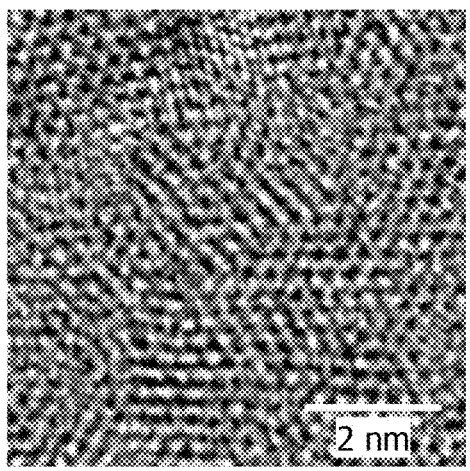
Figure 3D:
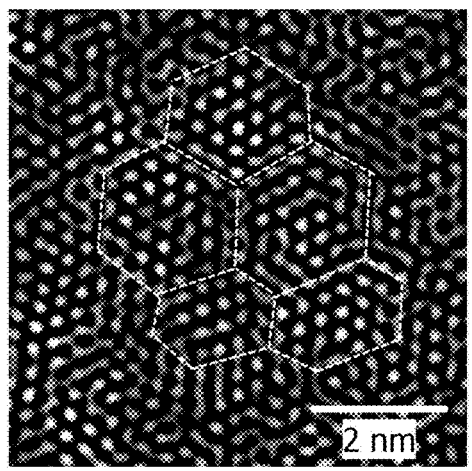
Figure 3E:
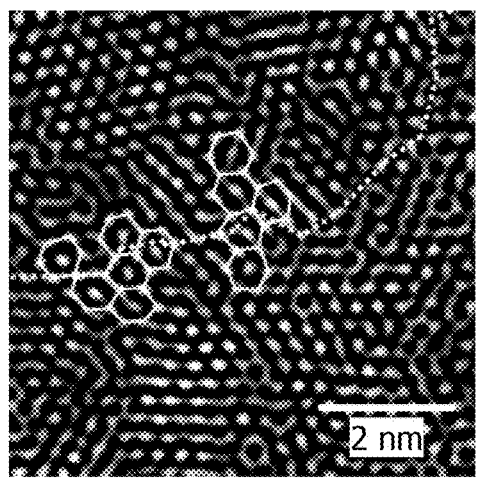

FIGS. 3B and 3C show Cs-corrected high-resolution TEM images of a plane of the CAAC-OS observed from a direction substantially perpendicular to the sample surface. FIGS. 3D and 3E are images obtained through image processing of FIGS. 3B and 3C. The method of image processing is as follows. The image in FIG. 3B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 3D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 3E, a dotted line denotes a boundary between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor film with a low carrier density; specifically, lower than $8\times10^{11}/cm^3$, preferably lower than $1\times10^{11}/cm^3$, and further preferably lower than $1\times10^{10}/cm^3$ and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 4A:
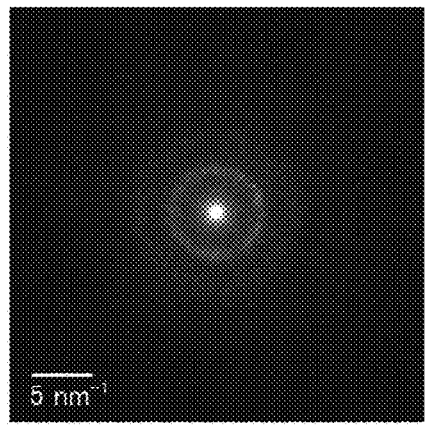
FIGS. 4A to 4D show electron diffraction patterns and a cross-sectional TEM image of an nc-OS.
Figure 4B:
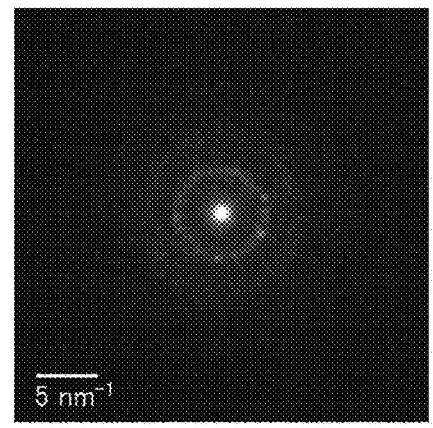

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 4A is observed. FIG. 4B shows a diffraction pattern obtained when an electron beam with a probe diameter of 1 nm is incident on the same sample. As shown in FIG. 4B, a plurality of spots are observed in a ring-like region. In other words, ordering in an nc-OS is not observed with an electron beam with a probe diameter of 50 nm but is observed with an electron beam with a probe diameter of 1 nm.

Figure 4C:
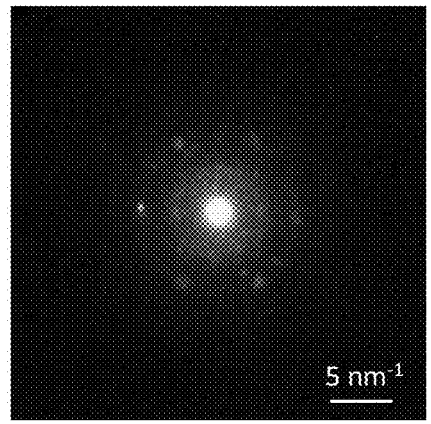

Furthermore, an electron diffraction pattern in which spots are arranged in an approximately hexagonal shape is observed in some cases as shown in FIG. 4C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 4D:
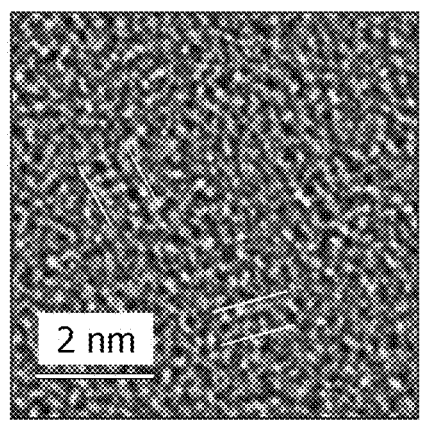

FIG. 4D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 4D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

FIGS. 5A and 5B are high-resolution cross-sectional TEM images of an a-like OS. FIG. 5A is the high-resolution cross-sectional TEM image of the a-like OS at the start of the electron irradiation. FIG. 5B is the high-resolution cross-sectional TEM image of a-like OS after the electron (e) irradiation at $4.3 \times 10^8$ $e^-/nm^2$. FIGS. 5A and 5B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 6:
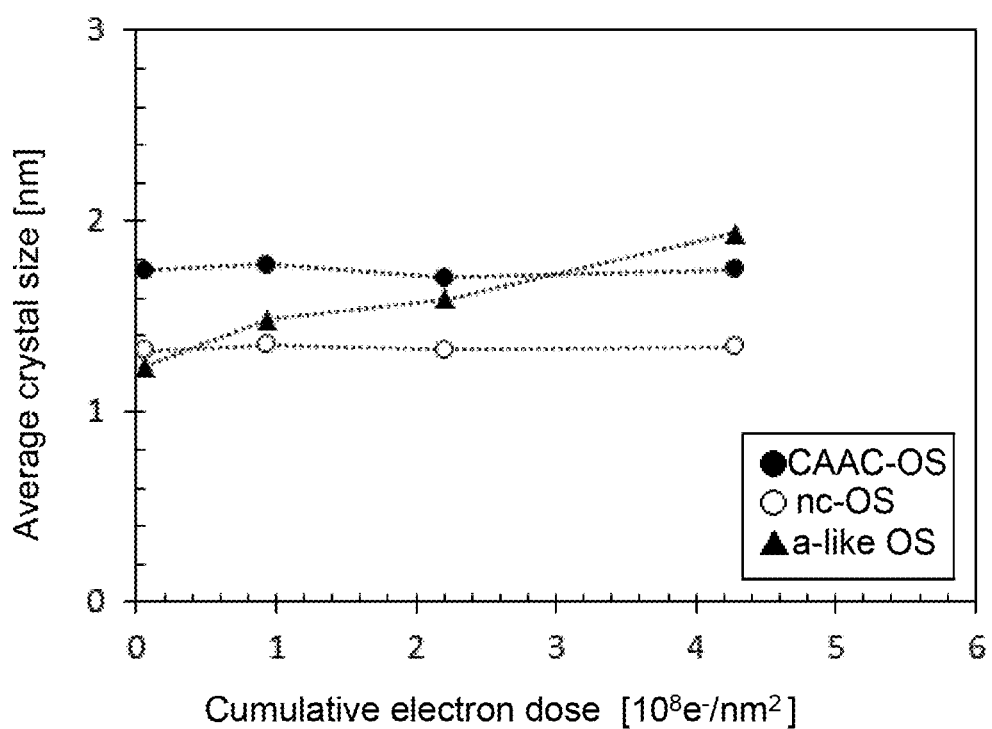
FIG. 6 shows a change in a crystal part of an In—Ga—Zn oxide by electron irradiation.

FIG. 6 shows change in the average size of crystal parts (at 22 points to 30 points) in each sample. Note that the crystal part size corresponds to the length of a lattice fringe. FIG. 6 indicates that the crystal part size in the a-like OS increases with an increase in the cumulative electron dose in obtaining TEM images, for example. As shown in FIG. 6, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 6, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Substrate, Insulator, Conductor>

Components other than the semiconductor of the transistor 10 are described in detail below.

As the substrate 100, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate formed using silicon, germanium, or the like or a semiconductor substrate formed using silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate resistant to heat treatment performed in manufacture of the transistor may be used as the substrate 100. As a method for providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 100 because of its low coefficient of linear expansion.

As the insulator 101, an insulator having a function of blocking hydrogen or water is used. Hydrogen or water in the insulator provided near the insulator 106a, the semiconductor 106b, and the insulator 106c is one of the factors of carrier generation in the insulator 106a, the semiconductor 106b, and the insulator 106c. As a result, the reliability of the transistor 10 might decrease. Particularly when the substrate 100 is a substrate that is provided with a silicon-based semiconductor element such as a switching element, hydrogen used to terminate a dangling bond in the semiconductor element might be diffused to the transistor 10. In that case, the insulator 101 that has a function of blocking hydrogen or water can inhibit diffusion of hydrogen or water from below the transistor 10, increasing the reliability of the transistor 10. It is preferable that the insulator 101 be less permeable to hydrogen or water than the insulator 105 and the insulator 104.

The insulator 101 preferably has a function of blocking oxygen. If oxygen diffused from the insulator 104 can be blocked by the insulator 101, oxygen can be effectively supplied from the insulator 104 or the like to the insulator 106a, the semiconductor 106b, and the insulator 106c.

The insulator 101 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 101 to function as an insulating film blocking diffusion of oxygen, hydrogen, or water. The insulator 101 can be formed using, for example, silicon nitride or silicon nitride oxide. The use of such a material enables the insulator 101 to function as an insulating film blocking diffusion of hydrogen or water.

At least part of the conductor 102 preferably overlaps with the semiconductor 106b in a region where the semiconductor 106b is positioned between the conductor 108a and the conductor 108*b*. The conductor 102 functions as a back gate of the transistor 10. The conductor 102 can control the threshold voltage of the transistor 10. The conductor 102 can also be used for injecting electric charges to the insulator 103. Control of the threshold voltage can prevent the transistor 10 from being turned on when voltage applied to the gate (conductor 114) of the transistor 10 is low, e.g., 0 V or lower. Thus, the electrical characteristics of the transistor 10 can be easily made normally-off characteristics.

As the conductor 102, a conductor including a region containing tungsten and one or more elements selected from silicon, carbon, germanium, tin, aluminum, and nickel is used. Specifically, a conductor containing tungsten and silicon is preferable. Furthermore, the conductor 102 preferably includes a region with a silicon concentration measured by RBS of greater than or equal to 5 atomic % and less than or equal to 70 atomic %, further preferably includes a region with a silicon concentration of greater than or equal to 10 atomic % and less than or equal to 60 atomic %. The conductor 102 may have a single layer or a stacked layer formed of an alloy or a compound, for example.

The conductor 102 preferably includes a region containing silicon and oxygen on the surface of the conductor 102, and the thickness of the region is preferably greater than or equal to 0.2 nm and less than or equal to 20 nm. The region contains a large amount of silicon and oxygen, in which case the region can function as an insulator. The region functions as a barrier layer, whereby oxidation of the entire conductor can be prevented.

The conductor 102 may be formed by a sputtering method. Alternatively, the conductor 102 may be formed by a metal chemical vapor deposition (MCVD) method.

The insulator 105 is provided to cover the conductor 102. An insulator similar to the insulator 104 or the insulator 112 to be described later can be used as the insulator 105.

The insulator 103 is provided to cover the insulator 105. The insulator 103 preferably has a function of blocking oxygen. Providing the insulator 103 can prevent extraction of oxygen from the insulator 104 by the conductor 102. Accordingly, oxygen can be effectively supplied from the insulator 104 to the insulator 106*a*, the semiconductor 106*b*, and the insulator 106*c*.

For the insulator 103, for example, an oxide or a nitride containing boron, aluminum, silicon, scandium, titanium, gallium, yttrium, zirconium, indium, lanthanum, cerium, neodymium, hafnium, or thallium may be used. It is preferable to use hafnium oxide or aluminum oxide.

Of the insulators 105, 103, and 104, the insulator 103 preferably includes an electron trap region. When the insulators 105 and 104 have a function of inhibiting release of electrons, the electrons trapped in the insulator 103 might behave as if they are negative fixed charge.

The amounts of hydrogen and water contained in the insulator 104 are preferably small. The insulator 104 preferably contains excess oxygen. For example, the insulator 104 may be formed to have a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used for the insulator 104. Preferably, silicon oxide or silicon oxynitride is used.

The amounts of hydrogen and water contained in the insulator 104 are preferably small. For example, the number of water molecules released from the insulator 104 is preferably greater than or equal to $1.0 \times 10^{13}$ molecules/cm$^2$ and less than or equal to $1.4 \times 10^{16}$ molecules/cm$^2$, more preferably greater than or equal to $1.0 \times 10^{13}$ molecules/cm$^2$ and less than or equal to $4.0 \times 10^{15}$ molecules/cm$^2$, still more preferably greater than or equal to $1.0 \times 10^{13}$ molecules/cm$^2$ and less than or equal to $2.0 \times 10^{15}$ molecules/cm$^2$ in thermal desorption spectroscopy (TDS) analysis in the range of surface temperatures from 100° C. to 700° C. or from 100° C. to 500° C. The number of hydrogen molecules released from the insulator 104 is preferably greater than or equal to $1.0 \times 10^{13}$ molecules/cm$^2$ and less than or equal to $1.2 \times 10^{15}$ molecules/cm$^2$, more preferably greater than or equal to $1.0 \times 10^{13}$ molecules/cm$^2$ and less than or equal to $9.0 \times 10^{14}$ molecules/cm$^2$ in TDS in the range of surface temperatures from 100° C. to 700° C. or from 100° C. to 500° C. The details of the method for measuring the number of released molecules using TDS will be described later.

Impurities such as water and hydrogen form defect states in the insulator 106*a*, the semiconductor 106*b*, and the insulator 106*c*, and particularly in the semiconductor 106*b*, which causes a change in electrical characteristics of the transistor. Accordingly, by reducing the amounts of water and hydrogen contained in the insulator 104 under the insulator 106*a*, the semiconductor 106*b*, and the insulator 106*c*, formation of defect states formed by supply of water, hydrogen, and the like from the insulator 104 to the semiconductor 106*b* can be suppressed. The use of such an oxide semiconductor with a reduced density of defect states makes it possible to provide a transistor with stable electrical characteristics.

The insulator 104 is preferably formed by a plasma enhanced CVD (PECVD) method because a high-quality film can be obtained at a relatively low temperature. However, in the case where a silicon oxide film, for example, is formed by a PECVD method, silicon hydride or the like is often used as a source gas, and as a result, hydrogen, water, or the like enters the insulator 104 during the formation of the insulator 104. For this reason, a silicon halide is preferably used as the source gas for the formation of the insulator 104 of this embodiment. Here, silicon tetrafluoride (SiF$_4$), silicon tetrachloride (SiCl$_4$), silicon trichloride (SiHCl$_3$), dichlorosilane (SiH$_2$Cl$_2$), silicon tetrabromide (SiBr$_4$) or the like can be used as silicon halide. In particular, silicon tetrafluoride (SiF$_4$) is preferably used.

When a silicon halide is used as the source gas for the formation of the insulator 104, a silicon hydride may be used in addition to the silicon halide. In that case, the amounts of hydrogen and water in the insulator 104 can be reduced as compared with the case where only a silicon hydride is used as the source gas, and the deposition rate can be improved as compared with the case where only a silicon halide is used as the source gas. For example, SiF$_4$ and SiH$_4$ may be used as the source gas for the formation of the insulator 104. Note that the flow ratio of SiF$_4$ to SiH$_4$ may be determined as appropriate in view of the amounts of water and hydrogen in the insulator 104 and the deposition rate.

The insulator 104 preferably contains excess oxygen. Such insulator 104 makes it possible to supply oxygen from the insulator 104 to the insulator 106*a*, the semiconductor 106*b*, and the insulator 106*c*. The supplied oxygen can reduce oxygen vacancies which are to be defects in the insulator 106*a*, the semiconductor 106*b*, and the insulator 106*c* which are oxide semiconductors. As a result, the insulator 106*a*, the semiconductor 106*b*, and the insulator 106c can be oxide semiconductors with a low density of defect states and stable characteristics.

In this specification and the like, excess oxygen refers to oxygen in excess of the stoichiometric composition, for example. Alternatively, excess oxygen refers to oxygen released from a film or layer containing the excess oxygen by heating, for example. Excess oxygen can move inside a film or a layer. Excess oxygen moves between atoms in a film or a layer, or replaces oxygen that is a constituent of a film or a layer and moves like a billiard ball, for example.

The insulator 104 including excess oxygen releases oxygen molecules, the number of which is greater than or equal to $1.0\times10^{14}$ molecules/cm$^2$ and less than or equal to $1.0\times10^{16}$ molecules/cm$^2$, preferably greater than or equal to $1.0\times10^{15}$ molecules/cm$^2$ and less than or equal to $5.0\times10^{15}$ molecules/cm$^2$ in TDS in the range of surface temperatures of 100° C. to 700° C. or 100° C. to 500° C.

A method for measuring the amount of released molecules using TDS is described below by taking the amount of released oxygen as an example.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following equation using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times\alpha$$

The value $N_{H2}$ is obtained by conversion of the amount of hydrogen molecules desorbed from the standard sample into densities. The value $S_{H2}$ is the integral value of ion intensity when the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing certain amount of hydrogen atoms as the reference sample.

Furthermore, in the TDS, oxygen is partly detected as an oxygen atom. The ratio between oxygen molecules and oxygen atoms can be calculated from the ionization rate of the oxygen molecules. Note that since the above α includes the ionization rate of the oxygen molecules, the amount of the released oxygen atoms can also be estimated through the measurement of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5\times10^{17}$ spins/cm$^3$. Note that the insulator containing a peroxide radical may have an asymmetric signal with a g factor of approximately 2.01 in ESR.

The insulator 104 may have a function of preventing diffusion of impurities from the substrate 100.

As described above, the top surface or the bottom surface of the semiconductor 106b preferably has high planarity. Thus, to improve the planarity, the top surface of the insulator 104 may be subjected to planarization treatment performed by a chemical mechanical polishing (CMP) method or the like.

The conductors 108a and 108b serve as a source electrode and a drain electrode of the transistor 10.

The conductors 108a and 108b may be formed in a manner similar to that for the conductor 102.

At least part of the conductors 108a and 108b preferably overlaps with the insulator 112 with the insulator 106c provided therebetween in a region not overlapping with the conductor 114. For example, the insulator 106c covers most of the top surfaces of the conductors 108a and 108b as illustrated in FIG. 1B. This structure can inhibit extraction of oxygen from the insulator 112 at the top surfaces of the conductors 108a and 108b. Accordingly, oxygen can be effectively supplied from the insulator 112 to the insulator 106a, the semiconductor 106b, and the insulator 106c.

The insulator 112 can function as a gate insulating film of the transistor 10. Like the insulator 104, the insulator 112 may be an insulator containing excess oxygen. Such insulator 112 makes it possible to supply oxygen from the insulator 112 to the insulator 106a, the semiconductor 106b, and the insulator 106.

The insulator 112 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 112 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 114 can function as a gate electrode of the transistor 10. The conductor 114 may be formed in a manner similar to that for the conductor 102.

Here, as illustrated in FIG. 1C, the semiconductor 106b can be electrically surrounded by an electric field of the conductor 102 and the conductor 114 (a structure in which a semiconductor is electrically surrounded by an electric field of a conductor is referred to as a surrounded channel (s-channel) structure). Therefore, a channel is formed in the entire semiconductor 106b (the top, bottom, and side surfaces). In the s-channel structure, a large amount of current can flow between a source and a drain of the transistor, so that an on-state current can be increased.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

The insulator 116 can function as a protective insulating film of the transistor 10. Here, the thickness of the insulator 116 can be greater than or equal to 1 nm, or greater than or equal to 20 nm, for example. It is preferable that at least part of the insulator 116 be in contact with the top surface of the insulator 104 and the insulator 112.

The insulator 116 may be formed so as to have a single-layer structure or a layered structure including an insulator containing, for example, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 116 preferably has a blocking effect against oxygen, hydrogen, water, alkali metal, alkaline earth metal, and the like. As such an insulator, for example, a nitride insulating film can be used. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Here, it is preferable that the insulator 116 be formed by a sputtering method and it is further preferable that the insulator 116 be formed by a sputtering method in an atmosphere containing oxygen. When the insulator 116 is formed by a sputtering method, oxygen is added to the vicinity of a surface of the insulator 104 or a surface of the insulator 112 (after the formation of the insulator 116, an interface between the insulator 116 and the insulator 104 or the insulator 112) at the same time as the formation.

It is preferable that the insulator 116 be less permeable to oxygen than the insulator 104 and the insulator 112 and have a blocking effect against oxygen. Providing the insulator 116 can prevent oxygen from being externally released to above the insulator 116 at the time of supply of oxygen from the insulator 104 and the insulator 112 to the insulator 106a, the semiconductor 106b, and the insulator 106c.

Aluminum oxide is preferably used as the insulator 116 because it is highly effective in preventing transmission of both oxygen and impurities such as hydrogen and moisture.

An oxide that can be used for the insulator 106a or the insulator 106c can be used for the insulator 116. Such an oxide can be relatively easily formed by a sputtering method, and thus, oxygen can be effectively added to the insulator 104 and the insulator 112. The insulator 116 is preferably formed with an oxide insulator containing In, such as an In—Al oxide, an In—Ga oxide, or an In—Ga—Zn oxide. An oxide insulator containing In is favorably used for the insulator 116 because the number of particles generated at the time of the deposition by a sputtering method is small.

The insulator 118 functions as the interlayer insulating film. The insulator 118 may be formed in a similar manner to that of the insulator 105.

The conductor 120a and the conductor 120b function as wirings electrically connected to the source electrode and the drain electrode of the transistor 10. As the conductor 120a and the conductor 120b, the conductor that can be used for the conductor 108a and the conductor 108b is used. Thus, the conductor 120a and the conductor 120b can function as wirings having heat resistance and oxidation resistance.

With the above structure, a transistor including conductors having heat resistance and oxidation resistance can be provided. A transistor with stable electrical characteristics can be provided. Alternatively, the transistor having a small leakage current in an off state can be provided. Alternatively, the transistor with high frequency characteristics can be provided. Alternatively, the transistor with normally-off electrical characteristics can be provided. Alternatively, the transistor having a small subthreshold swing value can be provided. Alternatively, the transistor having high reliability can be provided.

<Modification Example of Transistor>

Modification examples of the transistor 10 are described below with reference to FIGS. 7A to 7C to FIGS. 12A to 12D. FIGS. 7A to 7C to FIGS. 12A to 12D are cross-sectional views in the channel length direction and those in the channel width direction like FIGS. 1B and 1C.

Figure 7A:
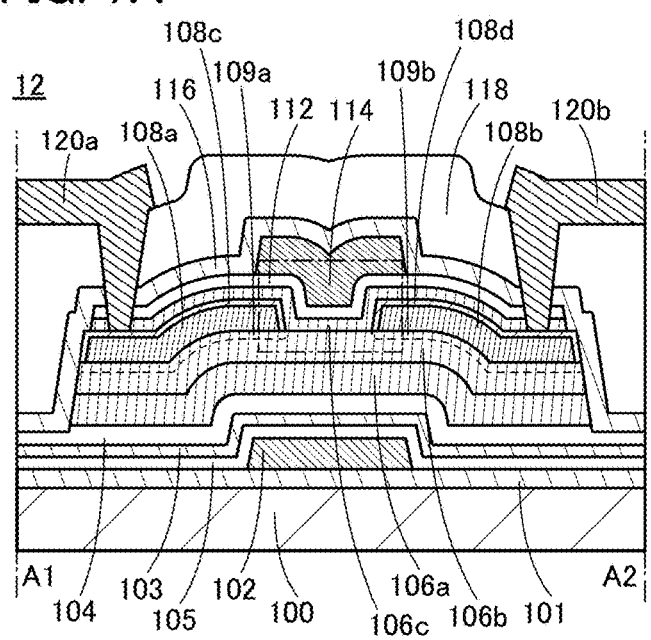
FIGS. 7A to 7C are cross-sectional views illustrating a transistor of one embodiment of the present invention.
Figure 7B:
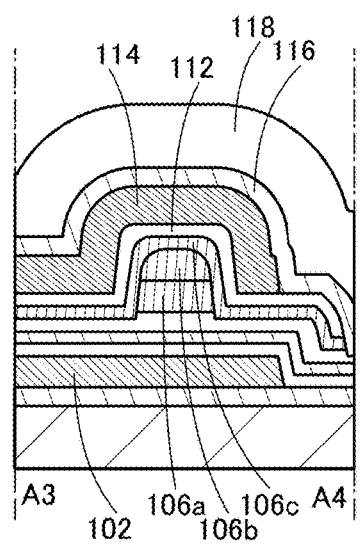
Figure 7C:
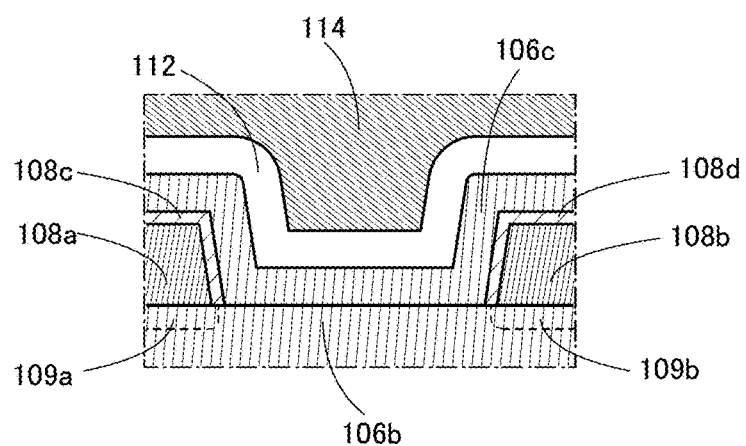

A transistor 12 illustrated in FIGS. 7A and 7B is different from the transistor 10 in that the transistor 12 includes a region 108c containing silicon and oxygen on a surface of the conductor 108a and a region 108d containing silicon and oxygen on a surface of the conductor 108b. FIG. 7C illustrates an enlarged view of a portion surrounded by a dashed-dotted line in FIG. 7A.

Oxygen is supplied to the surfaces of the conductor 108a and the conductor 108b, and silicon in the conductor 108a and the conductor 108b is segregated to the surfaces of the conductor 108a and the conductor 108b to bond with oxygen, whereby the region 108c and the region 108d are formed. The region 108c and the region 108d can function as insulators in some cases. Therefore, the region 108c functioning as an insulator between the conductor 114 and the conductor 108a in FIG. 7C reduces parasitic capacitance between the conductor 114 and the conductor 108a, for example. In the same manner, the region 108d reduces parasitic capacitance between the conductor 114 and the conductor 108b. Electrical characteristics of the transistor 12 can be improved by reducing parasitic capacitance.

Furthermore, the region 108c and the region 108d functioning as insulators can reduce leakage current between the conductors 108a and 108b and the conductor 114.

When the region 108c and the region 108d are too thin, the regions cannot have a sufficient function as insulators. When the region 108c and the region 108d are too thick, the areas of the regions of the conductors 108a and 108b decrease and the electric resistance of the conductor 108a and the conductor 108b increases. For these reasons, the thicknesses of the region 108c and the region 108d are preferably greater than or equal to 0.2 nm and less than or equal to 20 nm.

The region 108c and the region 108d are formed spontaneously by exposing the conductors to air in some cases. Alternatively, the region 108c and the region 108d can be formed intentionally. As a method for forming the region 108c and the region 108d intentionally, heat treatment is performed in an oxidation atmosphere, for example. Alternatively, plasma treatment is performed in an atmosphere containing oxygen. As the plasma treatment, a high-density plasma treatment using power source with a frequency of 2.45 GHz is preferably performed, for example. At this time, oxygen vacancies in the semiconductor 106b may be filled by adding oxygen to the semiconductor 106b.

Figure 8A:
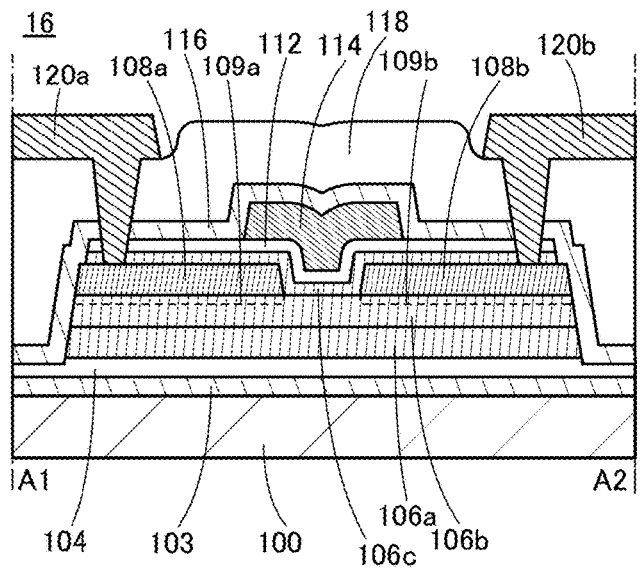
FIGS. 8A to 8D are cross-sectional views each illustrating a transistor of one embodiment of the present invention.
Figure 8B:
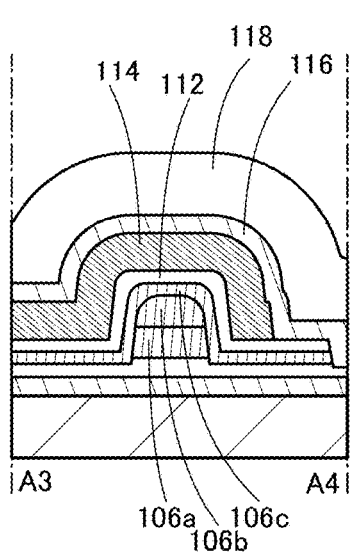

A transistor 16 illustrated in FIGS. 8A and 8B differs from the transistor 10 in that the conductor 102, the insulator 101, and the insulator 105 are not provided.

Figure 8C:
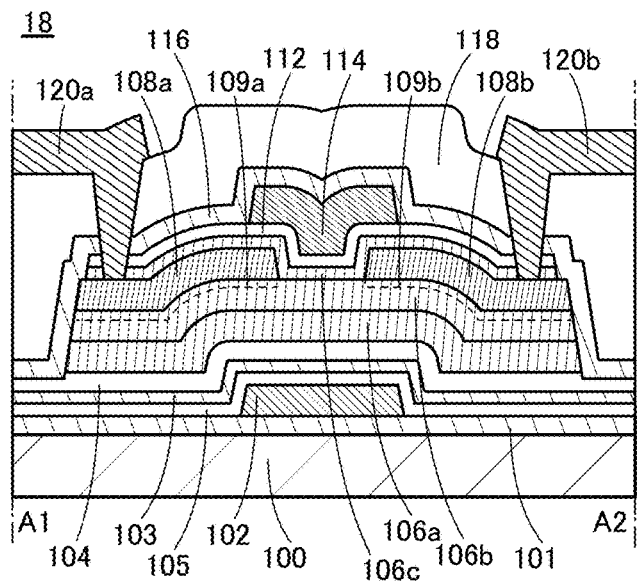
Figure 8D:
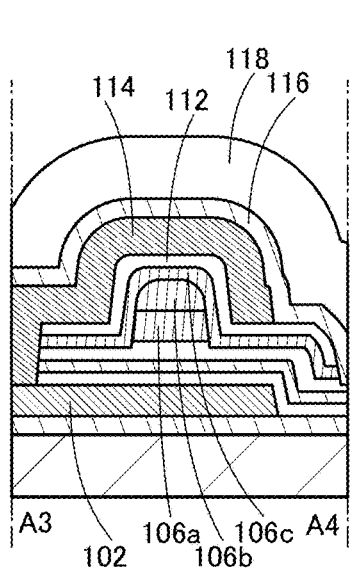

A transistor 18 illustrated in FIGS. 8C and 8D is different from the transistor 10 in that the conductor 114 is connected to the conductor 102 through an opening formed in the insulator 112, the insulator 106c, the insulator 104, the insulator 103, the insulator 105, and the like.

Figure 9A:
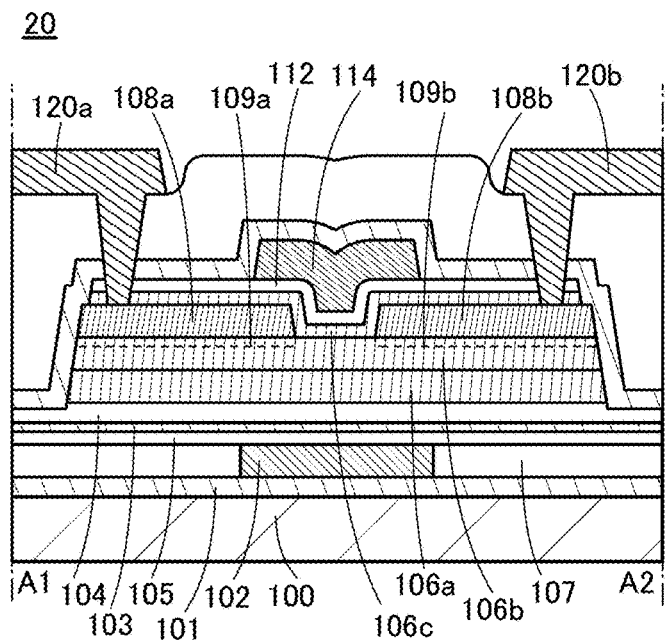
FIGS. 9A and 9B are cross-sectional views illustrating a transistor of one embodiment of the present invention.
Figure 9B:
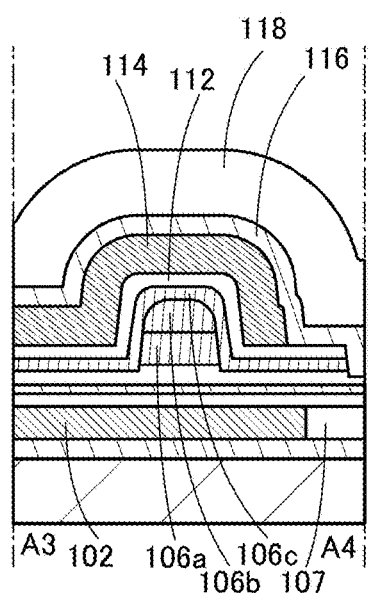

A transistor 20 illustrated in FIGS. 9A and 9B differs from the transistor 10 in that an insulator 107 is provided over the insulator 101 and the conductor 102 is embedded in an opening in the insulator 107. The insulator 107 may be formed with the insulator that can be used as the insulator 105. It is preferable that top surfaces of the insulator 107 and the conductor 102 be subjected to planarization treatment such as a CMP method in order to improve its planarity. With this structure, the planarity of a surface on which the semiconductor 106b is formed is not degraded even when the conductor 102 serving as a back gate is provided. Accordingly, the carrier mobility can be improved and the on-state current of the transistor 20 can be increased. Moreover, since there is no surface unevenness of the insulator 104 caused by the shape of the conductor 102, leakage current generated between the conductor 108a or 108b serving as a drain and the conductor 102 through an uneven portion of the insulator 104 can be reduced. Thus, the off-state current of the transistor 20 can be reduced.

Figure 10A:
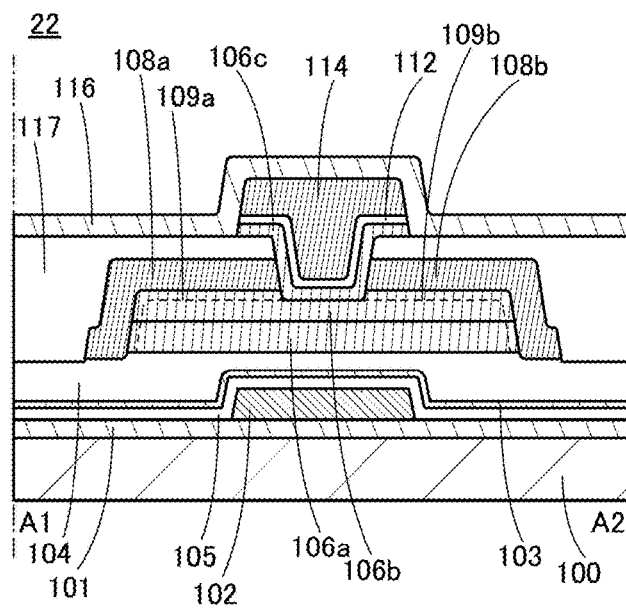
FIGS. 10A to 10D are cross-sectional views illustrating transistors of embodiments of the present invention.
Figure 10B:
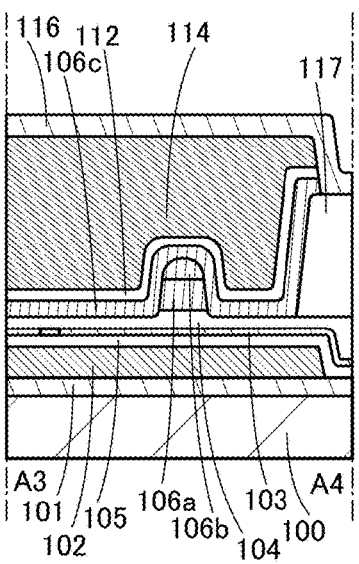

In a transistor 22 illustrated in FIGS. 10A and 10B, an insulator 117 is formed over the conductor 108a, the conductor 108b, and the insulator 104, and an opening reaching the semiconductor 106b is formed in the insulator 117. The transistor 22 is different from the transistor 10 in that the insulator 106c, the insulator 112, and the conductor 114 are formed to fill the opening. The conductor 108a and the conductor 108b are separated by the opening. In the transistor 22, the conductor 114 which can function as a gate electrode is formed in a self-aligned manner to fill the opening formed in the insulator 117; thus, the transistor 22 can be called a trench gate self-aligned (TGSA) s-channel FET.

The insulator 117 may be formed with the insulator that can be used as the insulator 104. The top surface of the insulator 117 may be planarized by a CMP method or the like.

In the transistor 22, the insulator 117, the insulator 106c, and the insulator 112 are provided between the conductor 108a and the conductor 114 and between the conductor 108b and the conductor 114. Accordingly, the distance between a top surface of the conductor 108a and a bottom surface of the conductor 114 and the distance between a top surface of the conductor 108b and the bottom surface of the conductor 114 can be increased by the thickness of the insulator 117. Therefore, parasitic capacitance generated in a region where the conductor 114 and the conductors 108a and 108b overlap each other can be reduced. The reduction in the parasitic capacitance enables the switching speed of the transistor to be improved; thus, a transistor with high frequency characteristics can be provided.

Figure 10C:
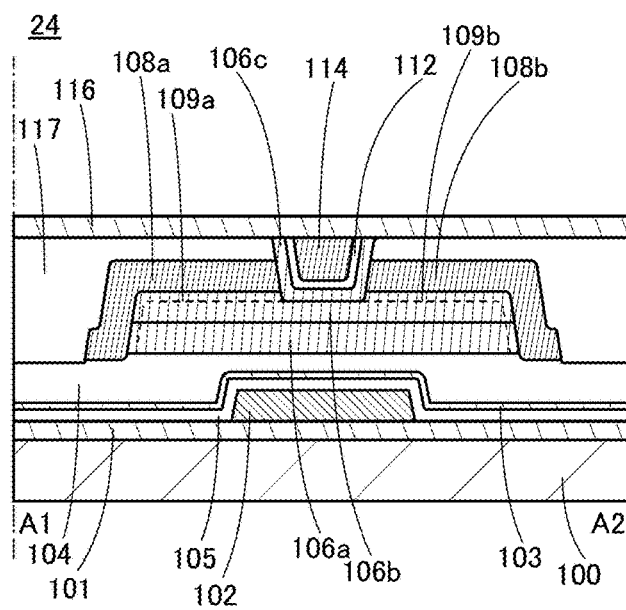
Figure 10D:
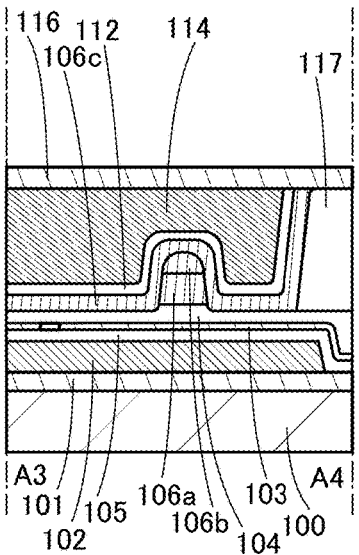

A transistor 24 illustrated in FIGS. 10C and 10D differs from the transistor 22 in that top surfaces of the insulator 117, the insulator 106c, the insulator 112, and the conductor 114 are substantially aligned with one another and flat. In order to form the transistor 24 to have such a structure, the top surfaces of the insulator 117, the insulator 106c, the insulator 112, and the conductor 114 are planarized by a CMP method or the like.

In this structure, there is hardly any region where the conductor 114 and the conductors 108a and 108b overlap with each other; as a result, parasitic capacitance in the transistor 24 between a gate and a source and between the gate and a drain can be reduced. The reduction in the parasitic capacitance enables the switching speed of the transistor to be improved; thus, a transistor with high frequency characteristics can be provided.

Figure 11A:
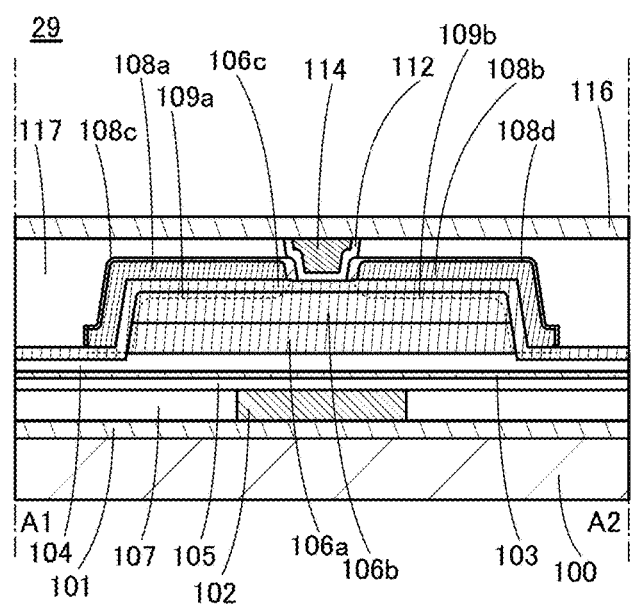
FIGS. 11A and 11B are cross-sectional views illustrating a transistor of one embodiment of the present invention.
Figure 11B:
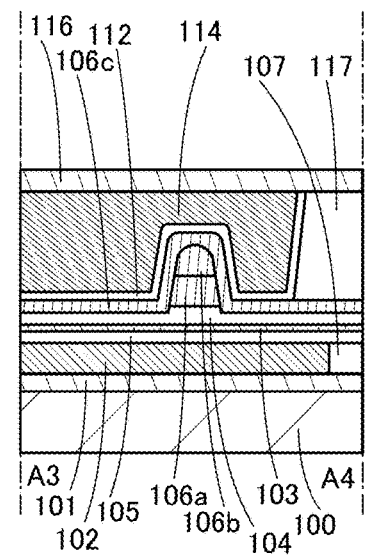

A transistor 29 illustrated in FIGS. 11A and 11B differs from the transistor 24 in that the insulator 107 is provided over the insulator 101 and the conductor 102 is embedded in an opening in the insulator 107. In addition, the transistor 29 differs from the transistor 24 also in that the insulator 106c covers the insulator 106a and the semiconductor 106b. In the transistor 29, the insulator 106c is not provided on a side surface of the opening formed in the insulator 117. With this structure, the conductor 114 in the opening in the insulator 117 can have a longer length in the channel length direction than the conductor 114 in the transistor 24 or the like.

The transistor 29 is different from the transistor 24 also in that the transistor 29 includes the region 108c containing silicon and oxygen on a surface of the conductor 108a and the region 108d containing silicon and oxygen on a surface of the conductor 108b. The region 108c and the region 108d may be formed in a manner similar to that of the transistor 12 illustrated in FIGS. 7A to 7C.

Note that the region 108c and the region 108d are not provided only in the transistor 12 and the transistor 29. For example, another transistor may include the region 108c and the region 108d.

Figure 12A:
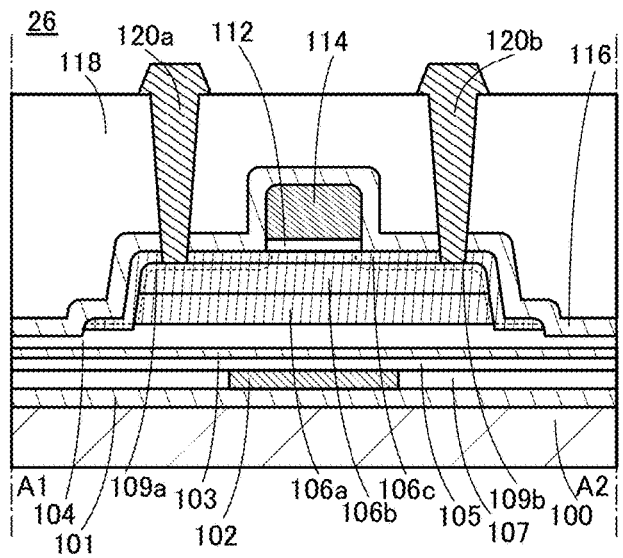
FIGS. 12A to 12D are cross-sectional views illustrating transistors of embodiments of the present invention.
Figure 12B:
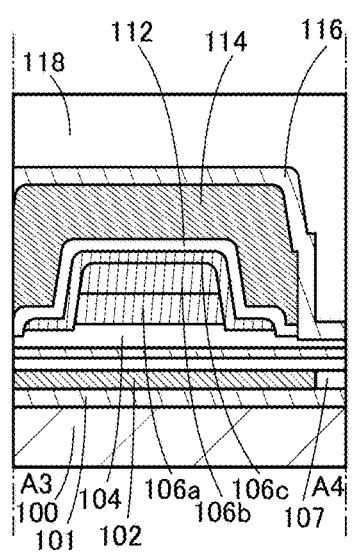

A transistor 26 illustrated in FIGS. 12A and 12B differs from the transistor 10 in that the conductors 108a and 108b are not provided and end portions of side surfaces of the conductor 114 and the insulator 112 are substantially aligned with each other.

The low-resistance regions 109a and 109b in the transistor 26 may include at least one of elements contained in the insulator 116. Furthermore, various elements may be added to the low-resistance regions 109a and 109b in order to reduce electric resistance.

Preferable examples of the element that is added to the low-resistance regions 109a and 109b are boron, phosphorus, nitrogen, argon, helium, magnesium, aluminum, silicon, titanium, vanadium, chromium, nickel, cobalt, germanium, yttrium, zirconium, niobium, molybdenum, indium, tin, lanthanum, cerium, neodymium, hafnium, tantalum, and tungsten. For example, the concentration of the element in the low-resistance regions 109a and 109b is preferably higher than or equal to $1\times10^{14}$/cm$^2$ and lower than or equal to $2\times10^{16}$/cm$^2$. The concentration of the element in the low-resistance regions 109a and 109b in the insulator 106c is higher than that in the region of the insulator 106c other than the low-resistance regions 109a and 109b (for example, the region of the semiconductor 106c overlapping with the conductor 114).

In the transistor 26, the semiconductor 106b is surrounded by the insulator 106a and the insulator 106c. Therefore, the insulator 106a and the insulator 106c are in contact with the end portion of a side surface of the semiconductor 106b, especially, the vicinity of the end portion of the side surface thereof in the channel width direction, whereby continuous junction of the semiconductor 106b with the insulator 106a or the insulator 106c is formed in the vicinity of the end portion of the side surface of the semiconductor 106b. As a result, the density of defect states is reduced. Thus, even when an on-state current easily flows due to low-resistance regions 109a and 109b, the end portion of the side surface in the channel width direction of the semiconductor 106*b* does not serve as a parasitic channel, which enables stable electrical characteristics. Note that the insulator 106*a* and/or the insulator 106*c* can be omitted in some cases.

Figure 12C:
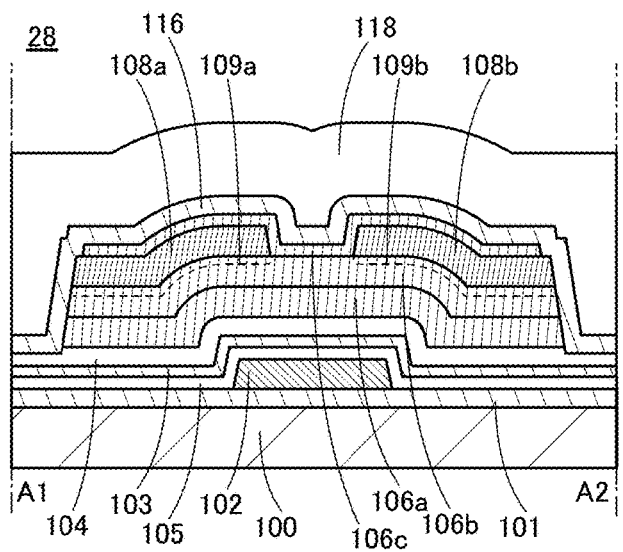
Figure 12D:
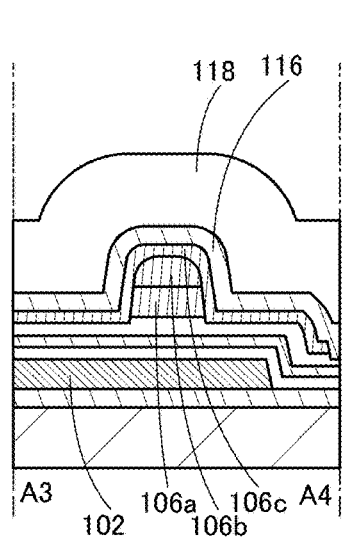

A transistor 28 illustrated in FIGS. 12C and 12D differs from the transistor 10 in that the insulator 112 and the conductor 114 are not provided. That is, the transistor 28 is what we call a bottom gate transistor.

In this embodiment, although a conductor including a region containing tungsten and one or more elements selected from silicon, carbon, germanium, tin, aluminum, and nickel is used for a gate electrode, a source electrode, a drain electrode, or the like of a transistor, one embodiment of the present invention is not limited thereto. For example, a conductor including a region containing tungsten and one or more elements selected from silicon, carbon, germanium, tin, aluminum, and nickel may be used in an electrode of a capacitor such as a metal-insulator-metal (MIM). In that case, the conductor may include a region containing silicon and oxygen on its surface, and the region functioning as an insulator may be used as a dielectric of a capacitor.

According to this embodiment, a transistor that is formed using a conductor having heat resistance and oxidation resistance can be provided.

The structure and method described in this embodiment can be implemented by being combined as appropriate with any of the other structures and methods described in the other embodiments.

Embodiment 2

In this embodiment, methods for manufacturing semiconductor devices of embodiments of the present invention are described with reference to FIGS. 13A to 13H to FIGS. 19A to 19F.

<Fabrication Method 1 of Transistor>

A method for fabricating the transistor 10 is described below with reference to FIGS. 13A to 13H, FIGS. 14A to 14F, and FIGS. 15A to 15D.

First, the substrate 100 is prepared. Any of the above-mentioned substrates can be used for the substrate 100.

Next, the insulator 101 is formed. Any of the above-mentioned insulators can be used for the insulator 101.

The insulator 101 may be formed by a sputtering method, a chemical vapor deposition (CVD) method, a molecular beam epitaxy (MBE) method, a pulsed laser deposition (PLD) method, an atomic layer deposition (ALD) method, or the like.

Next, a conductor to be the conductor 102 is formed. Any of the above-described conductors can be used for the conductor to be the conductor 102. The conductor can be formed by a sputtering method, a CVD method, an MBE method, a PLD method, an ALD method, or the like.

Figure 13A:
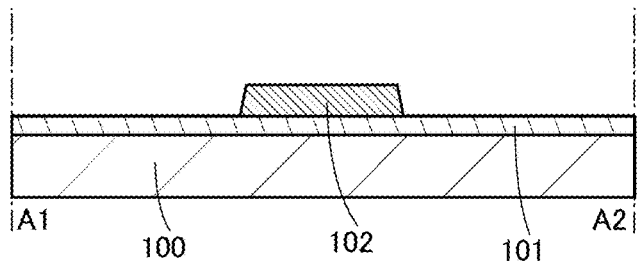
FIGS. 13A to 13H are cross-sectional views illustrating a method for fabricating a transistor of one embodiment of the present invention.
Figure 13B:
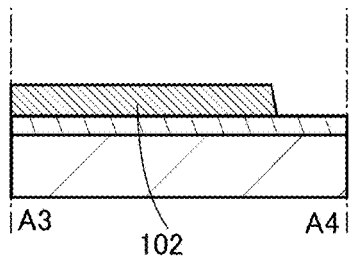

Next, a resist or the like is formed over the conductor and processing is performed using the resist or the like, whereby the conductor 102 is formed (see FIGS. 13A and 13B). Note that the case where the resist is simply formed also includes the case where a BARC is formed below the resist.

The resist is removed after the object is processed by etching or the like. For the removal of the resist, plasma treatment and/or wet etching are/is used. Note that as the plasma treatment, plasma ashing is preferable. In the case where the removal of the resist or the like is not enough, the remaining resist or the like may be removed using ozone water and/or hydrofluoric acid at a concentration higher than or equal to 0.001 volume % and lower than or equal to 1 volume %, and the like.

Then, the insulator 105 is formed. Any of the above-described insulators can be used for the insulator 105. The insulator 105 can be formed by a sputtering method, a CVD method, an MBE method, a PLD method, an ALD method, or the like. In order to reduce water and hydrogen contained in the insulator 105, the insulator 105 may be formed while the substrate is being heated. For example, in the case where a semiconductor element layer is provided below the transistor 10, the heat treatment may be performed in a relatively low temperature range (e.g., higher than or equal to 350° C. and lower than or equal to 445° C.).

Alternatively, the insulator 105 may be formed by a PECVD method in a manner similar to that of the insulator 104 to be described later in order to reduce water and hydrogen contained in the insulator 105.

Then, the insulator 103 is formed. Any of the above-described insulators can be used for the insulator 103. The insulator 103 can be formed by a sputtering method, a CVD method, an MBE method, a PLD method, an ALD method, or the like. In order to reduce water and hydrogen contained in the insulator 103, the insulator 103 may be formed while the substrate is being heated. For example, in the case where a semiconductor element layer is provided under the transistor 10, the heat treatment may be performed in a relatively low temperature range (e.g., higher than or equal to 350° C. and lower than or equal to 445° C.).

CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. For that reason, a formed film is less likely to have a pinhole or the like. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

In a conventional deposition apparatus utilizing a CVD method, one or a plurality of source gases for reaction are supplied to a chamber at the same time at the time of deposition. In a deposition apparatus utilizing an ALD method, a source gas (also called a precursor) for reaction and a gas serving as a reactant are alternately introduced into a chamber, and then the gas introduction is repeated. Note that the gases to be introduced can be switched using the respective switching valves (also referred to as high-speed valves).

For example, deposition is performed in the following manner. First, a precursor is introduced into a chamber and adsorbed onto a substrate surface (first step). Here, the precursor is adsorbed onto the substrate surface, whereby a self-limiting mechanism of surface chemical reaction works and no more precursor is adsorbed onto a layer of the precursor over the substrate. Note that the proper range of substrate temperatures at which the self-limiting mechanism of surface chemical reaction works is also referred to as an ALD window. The ALD window depends on the temperature characteristics, vapor pressure, decomposition temperature, and the like of a precursor. Next, an inert gas (e.g., argon or nitrogen) or the like is introduced into the chamber, so that an excessive precursor, a reaction product, and the like are released from the chamber (second step). Instead of introduction of an inert gas, vacuum evacuation can be performed to release an excessive precursor, a reaction product, and the like from the chamber. Then, a reactant (e.g., an oxidizer such as $H_2O$ or $O_3$) is introduced into the chamber to react with the precursor adsorbed onto the substrate surface, whereby part of the precursor is removed while the molecules of the film are adsorbed onto the substrate (third step). After that, introduction of an inert gas or vacuum evacuation is performed, whereby excessive reactant, a reaction product, and the like are released from the chamber (fourth step).

Note that the introduction of a reactant at the third step and the introduction of an inert gas at the fourth step may be repeatedly performed. That is, after the first step and the second step are performed, the third step, the fourth step, the third step, and the fourth step may be performed, for example.

For example, it is possible to introduce $O_3$ as an oxidizer at the third step, to perform $N_2$ purging at the fourth step, and to repeat these steps.

In the case where the third and fourth steps are repeated, the same reactant is not necessarily used for the repeated introduction. For example, $H_2O$ may be used as an oxidizer at the third step (for the first time), and $O_3$ may be used as an oxidizer at the third steps (at the second and subsequent times).

As described above, the introduction of an oxidizer and the introduction of an inert gas (or vacuum evacuation) in the chamber are repeated multiple times in a short time, whereby excess hydrogen atoms and the like can be more certainly removed from the precursor adsorbed onto the substrate surface and eliminated from the chamber. In the case where two kinds of oxidizers are introduced, more excess hydrogen atoms and the like can be removed from the precursor adsorbed onto the substrate surface. In this manner, hydrogen atoms are prevented from entering the insulator 103 and the like during the deposition, so that the amounts of water, hydrogen, and the like in the insulator 103 and the like can be small.

A first single layer can be formed on the substrate surface in the above manner. By performing the first to fourth steps again, a second single layer can be stacked over the first single layer. With the introduction of gases controlled, the first to fourth steps are repeated plural times until a film having a desired thickness is obtained, whereby a thin film with excellent step coverage can be formed. The thickness of the thin film can be adjusted by the number of repetition times; therefore, an ALD method makes it possible to adjust a thickness accurately and thus is suitable for fabricating a minute transistor.

In an ALD method, a film is formed through reaction of the precursor using thermal energy. An ALD method in which the reactant becomes a radical state with the use of plasma in the above-described reaction of the reactant is sometimes called a plasma ALD method. An ALD method in which reaction between the precursor and the reactant is performed using thermal energy is sometimes called a thermal ALD method.

By an ALD method, an extremely thin film can be formed to have a uniform thickness. In addition, the coverage of an uneven surface with the film is high.

When the plasma ALD method is employed, the film can be formed at a lower temperature than when the thermal ALD method is employed. With the plasma ALD method, for example, the film can be formed without decreasing the deposition rate even at 100° C. or lower. Furthermore, in the plasma ALD method, any of a variety of reactants, including a nitrogen gas, can be used without being limited to an oxidizer; therefore, it is possible to form various kinds of films of not only an oxide but also a nitride, a fluoride, a metal, and the like.

In the case where the plasma ALD method is employed, as in an inductively coupled plasma (ICP) method or the like, plasma can be generated apart from a substrate. When plasma is generated in this manner, plasma damage can be minimized.

Figure 16A:
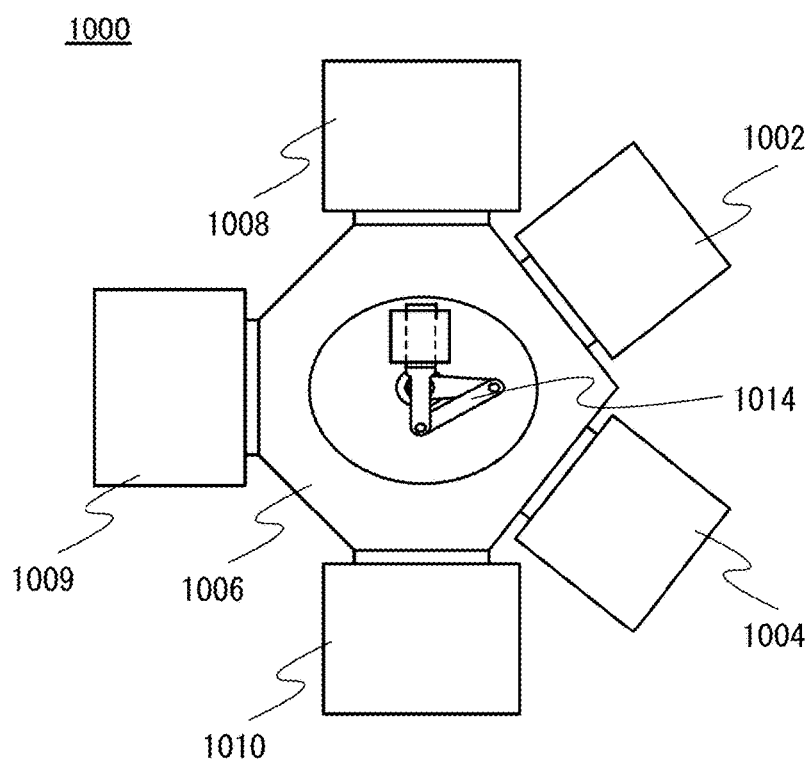
FIGS. 16A and 16B are a schematic diagram and a cross-sectional view illustrating a deposition apparatus.
Figure 16B:
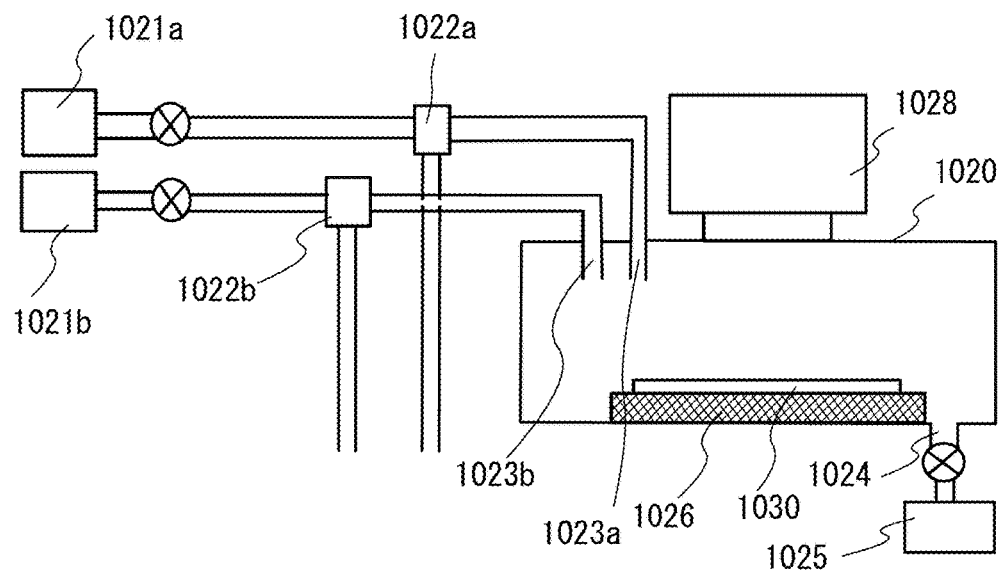

Here, a structure of a deposition apparatus 1000 is described with reference to FIGS. 16A and 16B as an example of an apparatus with which a film can be formed by an ALD method. FIG. 16A is a schematic diagram of a multi-chamber deposition apparatus 1000, and FIG. 16B is a cross-sectional view of an ALD apparatus that can be used for the deposition apparatus 1000.

<Example of Structure of Deposition Apparatus>

The deposition apparatus 1000 includes a carrying-in chamber 1002, a carrying-out chamber 1004, a transfer chamber 1006, a deposition chamber 1008, a deposition chamber 1009, a deposition chamber 1010, and a transfer arm 1014. Here, the carrying-in chamber 1002, the carrying-out chamber 1004, and the deposition chambers 1008 to 1010 are connected to the transfer chamber 1006. Thus, successive film formation can be performed in the deposition chambers 1008 to 1010 without exposure to the air, whereby entry of impurities into a film can be prevented.

Note that in order to prevent attachment of moisture, the carrying-in chamber 1002, the carrying-out chamber 1004, the transfer chamber 1006, and the deposition chambers 1008 to 1010 are preferably filled with an inert gas (such as a nitrogen gas) whose dew point is controlled, more preferably maintain reduced pressure.

An ALD apparatus can be used for the deposition chambers 1008 to 1010. A deposition apparatus other than an ALD apparatus may be used for any of the deposition chambers 1008 to 1010. Examples of the deposition apparatus used for the deposition chambers 1008 to 1010 include a sputtering apparatus, a PECVD apparatus, a TCVD apparatus, and an MOCVD apparatus.

For example, when an ALD apparatus and a PECVD apparatus are provided in the deposition chambers 1008 to 1010, the insulator 105 made of silicon oxide and included in the transistor 10 in FIGS. 1B and 1C can be formed by a PECVD method, the insulator 103 made of hafnium oxide can be formed by an ALD method, and the insulator 104 made of silicon oxide containing halogen can be formed by a PECVD method. Because the series of film formation is successively performed without exposure to the air, films can be formed without entry of impurities into the films.

Although the deposition apparatus 1000 includes the carrying-in chamber 1002, the carrying-out chamber 1004, and the deposition chambers 1008 to 1010, the present invention is not limited to this structure. The deposition apparatus 1000 may have four or more deposition chambers, or may additionally include a treatment chamber for heat treatment or plasma treatment. The deposition apparatus 1000 may be of a single-wafer type or may be of a batch type, in which case film formation is performed on a plurality of substrates at a time.

<ALD Apparatus>

Next, a structure of an ALD apparatus that can be used for the deposition apparatus 1000 is described. The ALD apparatus includes a deposition chamber (chamber 1020), source material supply portions 1021a and 1021b, high-speed valves 1022a and 1022b which are flow rate controllers, source material introduction ports 1023a and 1023b, a source material exhaust port 1024, and an evacuation unit 1025. The source material introduction ports 1023a and 1023b provided in the chamber 1020 are connected to the source material supply portions 1021a and 1021b, respectively, through supply tubes and valves. The source material exhaust port 1024 is connected to the evacuation unit 1025 through an exhaust tube, a valve, and a pressure controller.

A plasma generation apparatus 1028 is connected to the chamber 1020 as illustrated in FIG. 16B, whereby film formation can be performed by a plasma ALD method instead of a thermal ALD method. By a plasma ALD method, a film can be formed without decreasing the deposition rate even at low temperatures; thus, a plasma ALD method is preferably used for a single-wafer type deposition apparatus with low deposition efficiency.

A substrate holder 1026 with a heater is provided in the chamber, and a substrate 1030 over which a film is to be formed is provided over the substrate holder 1026.

In the source material supply portions 1021a and 1021b, a source gas is formed from a solid source material or a liquid source material by using a vaporizer, a heating unit, or the like. Alternatively, the source material supply portions 1021a and 1021b may supply a source gas.

Although two source material supply portions 1021a and 1021b are provided as an example, the number of source material supply portions is not limited thereto, and three or more source material supply portions may be provided. The high-speed valves 1022a and 1022b can be accurately controlled by time, and a source gas and an inert gas are supplied by the high-speed valves 1022a and 1022b. The high-speed valves 1022a and 1022b are flow rate controllers for a source gas, and can also be referred to as flow rate controllers for an inert gas.

In the deposition apparatus illustrated in FIG. 16B, a thin film is formed over a surface of the substrate 1030 in the following manner: the substrate 1030 is transferred to be put on the substrate holder 1026, the chamber 1020 is sealed, the substrate 1030 is heated to a desired temperature (e.g., higher than or equal to 80° C., higher than or equal to 100° C., or higher than or equal to 150° C.) by heating the substrate holder 1026 with a heater; and supply of a source gas, evacuation with the evacuation unit 1025, supply of an inert gas, and evacuation with the evacuation unit 1025 are repeated.

In the deposition apparatus illustrated in FIG. 16B, an insulating layer formed using an oxide (including a composite oxide) containing one or more elements selected from hafnium, aluminum, tantalum, zirconium, and the like can be formed by selecting a source material (e.g., a volatile organometallic compound) used for the source material supply portions 1021a and 1021b appropriately. Specifically, it is possible to use an insulating layer formed using hafnium oxide, an insulating layer formed using aluminum oxide, an insulating layer formed using hafnium silicate, or an insulating layer formed using aluminum silicate. Alternatively, a thin film, e.g., a metal layer such as a tungsten layer or a titanium layer, or a nitride layer such as a titanium nitride layer can be formed by selecting a source material (e.g., a volatile organometallic compound) used for the source material supply portions 1021a and 1021b appropriately.

For example, in the case where a hafnium oxide layer is formed by an ALD apparatus, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamido)hafnium (TDMAH)) are used. In this case, the first source gas supplied from the source material supply portion 1021a is TDMAH, and the second source gas supplied from the source material supply portion 1021b is ozone. Note that the chemical formula of tetrakis(dimethylamido)hafnium is $Hf[N(CH_3)_2]_4$. Examples of another material liquid include tetrakis(ethylmethylamido)hafnium.

For example, in the case where an aluminum oxide layer is formed by an ALD apparatus, two kinds of gases, i.e., $H_2O$ as an oxidizer and a source gas which is obtained by vaporizing a liquid containing a solvent and an aluminum precursor compound (e.g., trimethylaluminum (TMA)) are used. In this case, the first source gas supplied from the source material supply portion 1021a is TMA, and the second source gas supplied from the source material supply portion 1021b is $H_2O$. Note that the chemical formula of trimethylaluminum is $Al(CH_3)_3$. Examples of another material liquid include tris(dimethylamido)aluminum, triisobutylaluminum, and aluminum tris(2,2,6,6-tetramethyl-3,5-heptanedionate).

In the case where a tungsten layer is formed using an ALD apparatus, a $WF_6$ gas and a $B_2H_6$ gas are sequentially introduced a plurality of times to form an initial tungsten layer, and then a $WF_6$ gas and an $H_2$ gas are used to form a tungsten layer. Note that an $SiH_4$ gas may be used instead of a $B_2H_6$ gas. These gases may be controlled by mass flow controllers.

Figure 13C:
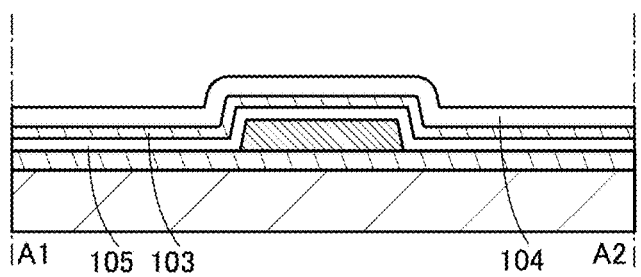
Figure 13D:
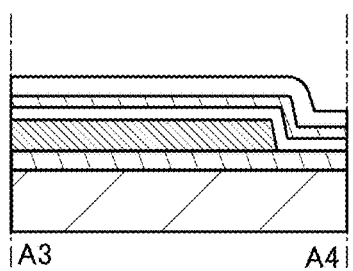

Then, the insulator 104 is formed (see FIGS. 13C and 13D). Any of the above-described insulators can be used for the insulator 104. The insulator 104 can be formed by a sputtering method, a CVD method, an MBE method, a PLD method, an ALD method, or the like.

A CVD method, in particular, a PECVD method is preferably used for the formation of the insulator 104.

In the case where the insulator 104 is formed by a PECVD method, a substance without containing hydrogen or a substance containing a small amount of hydrogen is preferably used as a source gas; for example, a halide is preferably used. For example, in the case where silicon oxide or silicon oxynitride is deposited as the insulator 104, silicon halide is preferably used as a source gas. As the silicon halide, for example, silicon tetrafluoride ($SiF_4$), silicon tetrachloride ($SiCl_4$), silicon trichloride ($SiHCl_3$), dichlorosilane ($SiH_2Cl_2$), or silicon tetrabromide ($SiBr_4$) can be used.

In the case where the insulator 104 is formed by a PECVD method, an oxidation gas (e.g., $N_2O$) is introduced. Since the above-described silicon halides are less reactive than $SiH_4$, the oxidation gas readily interacts with the insulator 103. Accordingly, there is a possibility that water and hydrogen in the insulator 103 can be released by the oxidation gas, and the amounts of water and hydrogen in the insulator 103 can be reduced.

When a silicon halide is used as the source gas for the formation of the insulator 104, a silicon hydride may be used in addition to the silicon halide. In that case, the amounts of hydrogen and water in the insulator 104 can be reduced as compared with the case where only a silicon hydride is used as the source gas, and the deposition rate can be improved as compared with the case where only a silicon halide is used as the source gas. For example, $SiF_4$ and $SiH_4$ may be used as the source gas for the formation of the insulator 104. For example, the flow rate of $SiH_4$ is set to greater than 1 sccm and less than 10 sccm, preferably, greater than or equal to 2 sccm and less than or equal to 4 sccm, in which case the amounts of water and hydrogen in the insulator 104 and the deposition rate can be relatively favorable values. Note that the flow ratio of $SiF_4$ to $SiH_4$ can be determined as appropriate in view of the amounts of water and hydrogen in the insulator 104 and the deposition rate.

In order to reduce water and hydrogen contained in the insulator 104, the insulator 104 may be formed while the substrate is being heated.

The top surface or the bottom surface of the semiconductor 106b to be formed later preferably has high planarity. Thus, to improve the planarity, the top surface of the insulator 104 may be subjected to planarization treatment such as CMP treatment.

Next, heat treatment is preferably performed. The heat treatment can further reduce water or hydrogen in the insulators 105, 103, and 104. In addition, the insulator 104 can contain excess oxygen in some cases. The heat treatment can be performed at a temperature higher than or equal to 250° C. and lower than or equal to 650° C., preferably higher than or equal to 450° C. and lower than or equal to 600° C., more preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator 126a and the semiconductor 126b and can remove impurities, such as hydrogen and water, for example. For the heat treatment, lamp heating can be performed with use of a rapid thermal annealing (RTA) apparatus. Heat treatment with an RTA apparatus is effective for an improvement in productivity because it needs short time as compared with the case of using a furnace.

Note that in the case where a semiconductor element layer is provided below the transistor 10, the heat treatment can be performed in a relatively low temperature range (e.g., higher than or equal to 350° C. and lower than or equal to 445° C.). For example, the temperature is preferably set lower than or equal to the highest heating temperature among the substrate heating temperatures for forming the insulator 105, the insulator 103, and the insulator 104.

Next, an insulator 126a is formed. Any of the above-described insulators and semiconductors that can be used for the insulator 106a can be used for the insulator 126a. The insulator 126a can be formed by a sputtering method, a CVD method, an MBE method, a PLD method, an ALD method, or the like.

Next, a semiconductor 126b is formed. Any of the above-described semiconductors that can be used for the semiconductor 106b can be used for the semiconductor 126b. The semiconductor 126b can be formed by a sputtering method, a CVD method, an MBE method, a PLD method, an ALD method, or the like. Note that successive film formation of the insulator 126a and the semiconductor 126b without exposure to the air can reduce entry of impurities into the films and their interface.

Next, heat treatment is preferably performed. The heat treatment can reduce the hydrogen concentration of the insulator 126a and the semiconductor 176b in some cases. The heat treatment can reduce oxygen vacancies in the insulator 126a and the semiconductor 126b in some cases. The heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator 126a and the semiconductor 126b and can remove impurities such as hydrogen and water, for example. For the heat treatment, lamp heating can be performed with use of an RTA apparatus. Heat treatment with an RTA apparatus is effective for an improvement in productivity because it needs short time as compared with the case of using a furnace. By heat treatment, the peak intensity is increased and a full width at half maximum is decreased when a CAAC-OS is used for the insulator 126a and the semiconductor 126b. In other words, the crystallinity of a CAAC-OS is increased by heat treatment.

Note that in the case where a semiconductor element layer is provided below the transistor 10, the heat treatment can be performed in a relatively low temperature range (e.g., higher than or equal to 350° C. and lower than or equal to 445° C.). For example, the temperature is preferably set lower than or equal to the highest heating temperature among the substrate heating temperatures for forming the insulator 105, the insulator 103, and the insulator 104 and the temperature of the heat treatment after the formation of the insulator 104. Since water, hydrogen, and the like in the insulator 104 can be sufficiently small when the above-described method for forming the insulator 104 is employed, water and hydrogen supplied to the insulator 126a and the semiconductor 126b can be sufficiently reduced.

By the heat treatment, oxygen can be supplied from the insulator 104 to the insulator 126a and the semiconductor 126b. The heat treatment performed on the insulator 104 makes it very easy to supply oxygen to the insulator 126a and the semiconductor 126b.

Here, the insulator 103 serves as a barrier film that blocks oxygen. The insulator 103 provided under the insulator 104 can prevent oxygen diffused in the insulator 104 from being diffused into layers under the insulator 104.

Oxygen is supplied to the insulator 126a and the semiconductor 126b to reduce oxygen vacancies, whereby highly purified intrinsic or substantially highly purified intrinsic oxide semiconductor with a low density of defect states can be achieved.

High-density plasma treatment or the like may be performed. High-density plasma may be generated using microwaves. For the high-density plasma treatment, for example, an oxidation gas such as oxygen or nitrous oxide may be used. Alternatively, a mixed gas of an oxidation gas and a rare gas such as He, Ar, Kr, or Xe may be used. In the high-density plasma treatment, a bias may be applied to the substrate. Thus, oxygen ions and the like in the plasma can be extracted to the substrate side. The high-density plasma treatment may be performed while the substrate is being heated. For example, in the case where the high-density plasma treatment is performed instead of the heat treatment, the similar effect can be obtained at a temperature lower than the heat treatment temperature. The high-density plasma treatment may be performed before the formation of the insulator 126a, before the formation of the insulator 126a described later, after the formation of the insulator 112, or after the formation of the insulator 116.

Figure 13E:
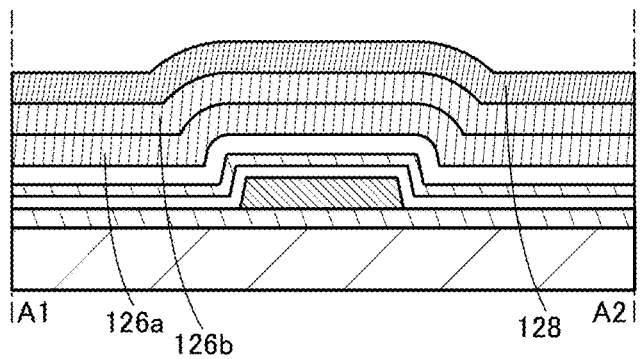
Figure 13F:
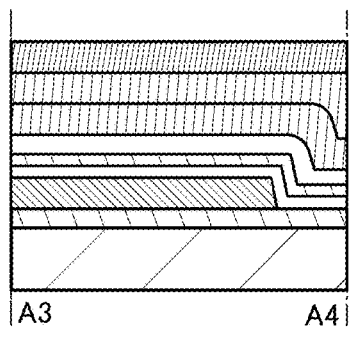

Next, a conductor 128 is formed (see FIGS. 13E and 13F). Any of the above-described conductors that can be used for the conductors 108a and 108b can be used for the conductor 128. The conductor 128 can be formed by a sputtering method, a CVD method, an MBE method, a PLD method, an ALD method, or the like.

Next, a resist or the like is formed over the conductor 128 and processing is performed using the resist or the like, whereby the conductors 108a and 108b are formed.

Figure 13G:
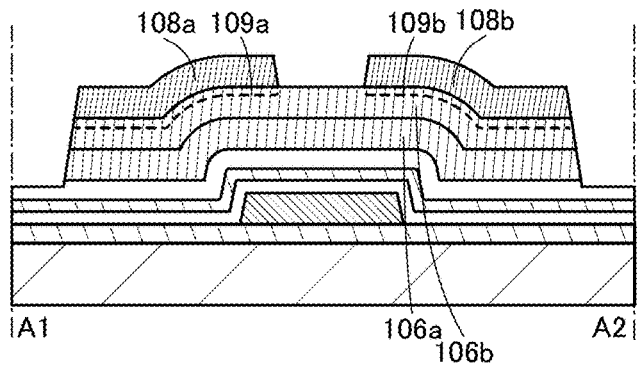
Figure 13H:
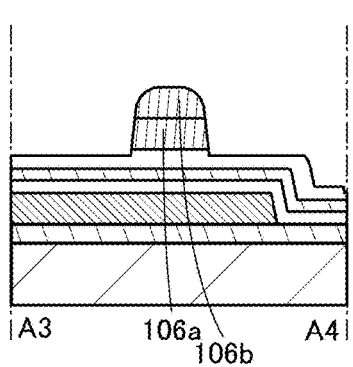

Next, a resist or the like is formed over the semiconductor 126b and processing is performed using the resist or the like and the conductors 108a and 108b, whereby the insulator 106a and the semiconductor 106b are formed (see FIGS. 13G and 13H).

Here, regions of the semiconductor 106b that are in contact with the conductor 108a and the conductor 108b include the low-resistance region 109a and the low-resistance region 109b in some cases. The semiconductor 106b might have a smaller thickness in a region between the conductor 108a and the conductor 108b than in regions overlapping with the conductor 108a and the conductor 108b. This is because part of the top surface of the semiconductor 106b is sometimes removed at the time of the formation of the conductor 108a and the conductor 108b.

Note that after formation of the conductor 128, the insulator 126a, the semiconductor 126b, and the conductor 128 may be collectively processed to form the insulator 106a, the semiconductor 106b, and a conductor having a shape overlapping with the semiconductor 106b, and the conductor having the shape overlapping with the semiconductor 106b may be further processed to form the conductor 108a and the conductor 108b.

Then, the insulator 126c is formed. Any of the above-described insulators or semiconductors that can be used for the insulator 106c can be used for the insulator 126c, for example. The insulator 126c can be formed by a sputtering method, a CVD method, an MBE method, a PLD method, an ALD method, or the like. Before the formation of the insulator 126c, surfaces of the semiconductor 106b, the conductor 108a, and the conductor 108b may be etched. For example, plasma containing a rare gas can be used for the etching. After that, the insulator 126c is successively formed without being exposed to the air, whereby impurities can be prevented from entering interfaces between the insulator 106c and the semiconductor 106b, the conductor 108a, and the conductor 108b. In some cases, impurities at an interface between films are diffused more easily than impurities in a film. For this reason, a reduction in impurity at the interfaces leads to stable electrical characteristics of a transistor.

Then, the insulator 132 is formed. Any of the above-described insulators that can be used for the insulator 112 can be used for the insulator 132. The insulator 132 can be formed by a sputtering method, a CVD method, an MBE method, a PLD method, an ALD method, or the like. Note that successive film formation of the insulator 126c and the insulator 132 without exposure to the air can reduce entry of impurities into the films and their interface.

Figure 14A:
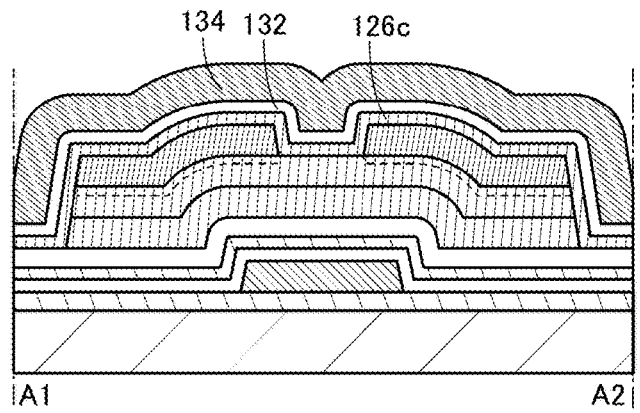
FIGS. 14A to 14F are cross-sectional views illustrating a method for fabricating a transistor of one embodiment of the present invention.
Figure 14B:
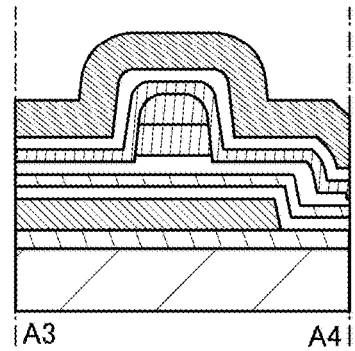

Next, the conductor 134 is formed (see FIGS. 14A and 14B). Any of the above-described conductors that can be used for the conductor 114 can be used for the conductor 134. The conductor 134 can be formed by a sputtering method, a CVD method, an MBE method, a PLD method, an ALD method, or the like. Note that successive film formation of the insulator 132 and the conductor 134 without exposure to the air can reduce entry of impurities into the films and their interface.

Next, a resist or the like is formed over the conductor 134 and processing is performed using the resist, whereby the conductor 114 is formed.

Figure 14C:
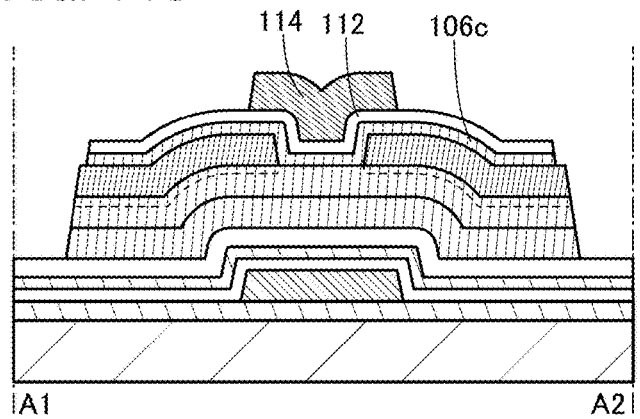
Figure 14D:
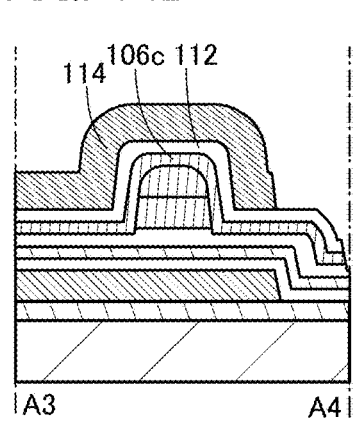

Then, a resist or the like is formed over the conductor 114 and the insulator 132 and processing is performed using the resist, whereby the insulator 106c and the insulator 112 are formed (see FIGS. 14C and 14D). Note that at this time, the insulator 106c and the insulator 112 may be formed to expose regions where the conductor 120a and the conductor 120b that are formed later are in contact with the conductor 108a and the conductor 108b.

Figure 14E:
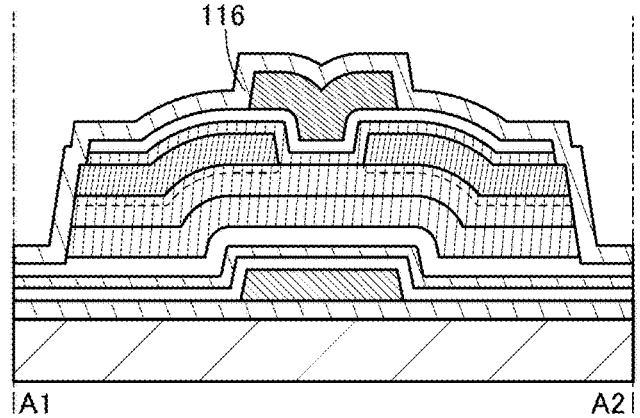
Figure 14F:
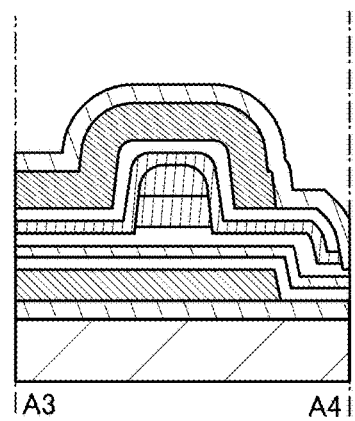

Then, the insulator 116 is formed (see FIGS. 14E and 14F). Any of the above-described insulators can be used for the insulator 116. The insulator 116 can be formed by a sputtering method, a CVD method, an MBE method, a PLD method, an ALD method, or the like.

Here, as the insulator 116, an oxide insulating film of aluminum oxide or the like having a blocking effect against oxygen, hydrogen, water, or the like is preferably provided.

The insulator 116 is preferably formed by utilizing plasma, further preferably a sputtering method, still further preferably a sputtering method in an atmosphere containing oxygen.

As the sputtering method, a direct current (DC) sputtering method in which a direct-current power source is used as a sputtering power source, a DC sputtering method in which a pulsed bias is applied (i.e., a pulsed DC sputtering method), or a radio frequency (RF) sputtering method in which a high frequency power source is used as a sputtering power source may be used. Alternatively, a magnetron sputtering method using a magnet mechanism inside a chamber, a bias sputtering method in which voltage is also applied to a substrate during deposition, a reactive sputtering method performed in a reactive gas atmosphere, or the like may be used. The oxygen gas flow rate or deposition power for sputtering can be set as appropriate in accordance with the amount of oxygen to be added.

When the insulator 116 is formed by a sputtering method, oxygen is added to the vicinity of a surface of the insulator 104 or a surface of the insulator 112 (after the formation of the insulator 116, an interface between the insulator 116 and the insulator 104 or the insulator 112) at the same time as the formation. Although the oxygen is added to the insulator 104 or the insulator 104 as an oxygen radical, for example, the state of the oxygen at the time of being added is not limited thereto. The oxygen may be added to the insulator 104 or the insulator 112 as an oxygen atom, an oxygen ion, or the like. Note that by addition of oxygen, oxygen in excess of the stoichiometric composition is contained in the insulator 104 or the insulator 112 in some cases, and the oxygen in such a case can be called excess oxygen.

Figure 15A:
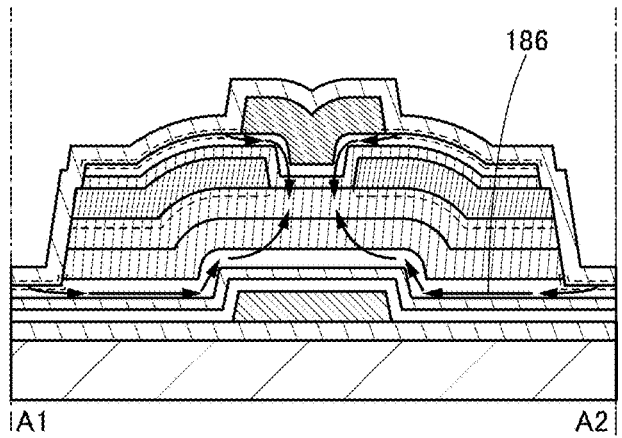
FIGS. 15A to 15D are cross-sectional views illustrating a method for fabricating a transistor of one embodiment of the present invention.
Figure 15B:
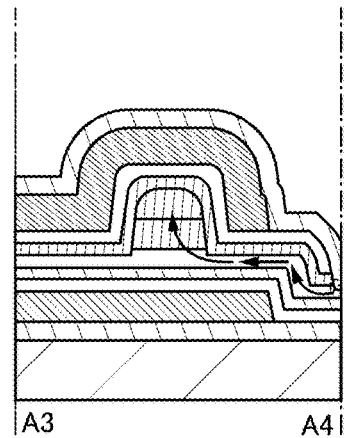

Next, heat treatment is preferably performed (see FIGS. 15A and 15B). By the heat treatment, oxygen added to the insulator 104 or the insulator 112 can be diffused to be supplied to the insulator 106a, the semiconductor 106b, and the insulator 106c. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

This heat treatment is preferably performed at a temperature lower than that of the heat treatment performed after formation of the semiconductor 126b. A temperature difference between the heat treatment and the heat treatment performed after formation of the semiconductor 126b is to be 20° C. or more and 150° C. or less, preferably 40° C. or more and 100° C. or less. Accordingly, superfluous release of excess oxygen (oxygen) from the insulator 104 and the like can be inhibited. Note that in the case where heating at the time of formation of the layers (e.g., heating at the time of formation of the insulator 118) doubles as the heat treatment after formation of the insulator 118, the heat treatment after formation of the insulator 118 is not necessarily performed.

Oxygen (hereinafter referred to as an oxygen 186) added to the insulator 104 and the insulator 112 by the deposition of the insulator 116 is diffused in the insulator 104 or the insulator 112 by the heat treatment (see FIGS. 15A and 15B). The insulator 116 is less permeable to oxygen than the insulator 104 or the insulator 112 and functions as a barrier film that blocks oxygen. Since the insulator 116 is provided over the insulator 104 or the insulator 112, the oxygen 186 diffused in the insulator 104 or the insulator 112 is prevented from being diffused in layers over the insulator 104 or the insulator 112, so that the oxygen 186 is diffused mainly laterally or downward in the insulator 104 or the insulator 112.

The oxygen 186 that is diffused in the insulator 104 or the insulator 112 is supplied to the insulator 106a, the insulator 106c, and the semiconductor 106b as indicated by arrows. The insulator 103 having a function of blocking oxygen is provided below the insulator 104, thereby preventing the oxygen 186 diffused into the insulator 104 from being diffused below the insulator 104.

Thus, the oxygen 186 can be effectively supplied to the insulator 106a, the insulator 106c, and the semiconductor 106b, especially to a channel formation region in the semiconductor 106b. Oxygen is supplied to the insulator 106a, the insulator 106c, and the semiconductor 106b to reduce oxygen vacancies in this manner, whereby a highly purified intrinsic or substantially highly purified intrinsic oxide semiconductor with a low density of defect states can be achieved.

Note that heat treatment after the formation of the insulator 116 may be performed at any time after the insulator 116 is formed. For example, the heat treatment may be performed after the insulator 118 is formed or after the conductors 120a and 120b are formed.

Next, the insulator 118 is formed. Any of the above-described insulators can be used for the insulator 118. The insulator 118 can be formed by a sputtering method, a CVD method, an MBE method, a PLD method, an ALD method, or the like.

Next, a resist or the like is formed over the insulator 118, and openings are formed in the insulator 118, the insulator 116, the insulator 112, and the insulator 106c. Then, a conductor to be the conductor 120a and the conductor 120b is formed. Any of the above-described conductors can be used for the conductor to be the conductor 120a and the conductor 120b. The conductor can be formed by a sputtering method, a CVD method, an MBE method, a PLD method, an ALD method, or the like.

Figure 15C:
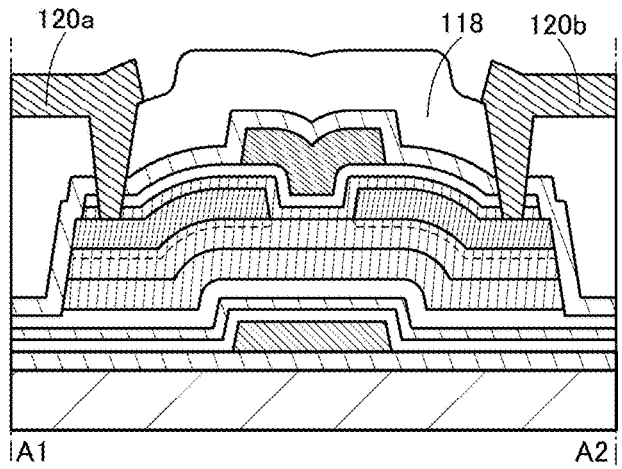
Figure 15D:
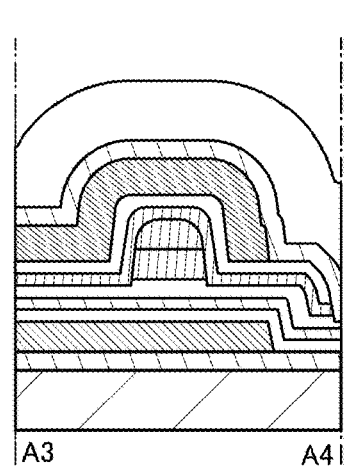

Next, a resist or the like is formed over the conductor and processing is performed using the resist or the like, whereby the conductors 120a and 120b are formed (see FIGS. 15C and 15D).

Through the above process, the transistor 10 of one embodiment of the present invention can be fabricated.

<Method 2 for Manufacturing Transistor>

A method for fabricating the transistor 29 is described below with reference to FIGS. 17A to 17H, FIGS. 18A to 18F, and FIGS. 19A to 19F. Note that for the method for fabricating the transistor 29, any of the above-mentioned methods for fabricating a transistor can be referred to, as appropriate.

First, the substrate 100 is prepared. Any of the above-mentioned substrates can be used for the substrate 100.

Next, the insulator 101 is formed. Any of the above-mentioned insulators can be used for the insulator 101.

Then, an insulator to be the insulator 107 is formed. Any of the above-described insulators can be used for the insulator. The insulator can be formed by a sputtering method, a CVD method, an MBE method, a PLD method, an ALD method, or the like.

Next, a resist or the like is formed over the insulator and processing is performed using the resist or the like, whereby the insulator 107 having an opening is formed.

Next, a conductor to be the conductor 102 is formed. Any of the above-described conductors can be used for the conductor to be the conductor 102. The conductor can be formed by a sputtering method, a CVD method, an MBE method, a PLD method, an ALD method, or the like.

Figure 17A:
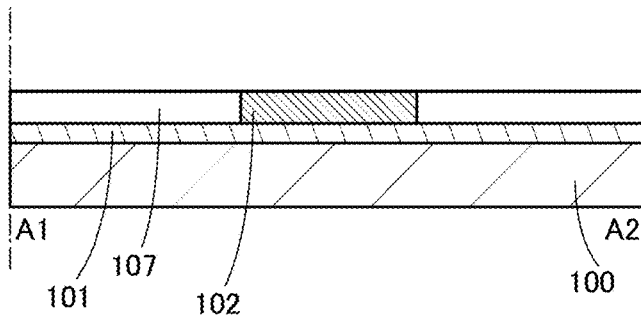
FIGS. 17A to 17H are cross-sectional views illustrating a method of fabricating a transistor according to one embodiment of the invention.
Figure 17B:
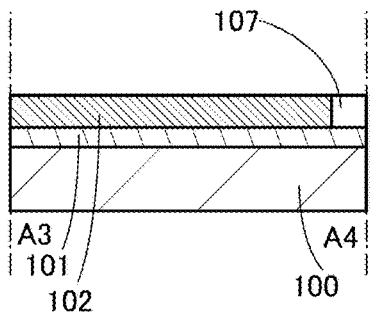

Next, the conductor is polished until the insulator 107 is exposed, whereby the conductor 102 is formed (see FIGS. 17A and 17B). For example, CMP treatment may be performed as the polishing.

Then, the insulator 105 is formed. Any of the above-described insulators can be used for the insulator 105. The insulator 105 can be formed by a sputtering method, a CVD method, an MBE method, a PLD method, an ALD method, or the like. In order to reduce water and hydrogen contained in the insulator 105, the insulator 105 may be formed while the substrate is being heated. For example, in the case where a semiconductor element layer is provided below the transistor 29, the heat treatment may be performed in a relatively low temperature range (e.g., higher than or equal to 350° C. and lower than or equal to 445° C.).

Alternatively, the insulator 105 may be formed by a PECVD method in a manner similar to that of the insulator 104 described above in order to reduce water and hydrogen contained in the insulator 105.

Then, the insulator 103 is formed. Any of the above-described insulators can be used for the insulator 103. The insulator 103 can be formed by a sputtering method, a CVD method, an MBE method, a PLD method, an ALD method, or the like. In order to reduce water and hydrogen contained in the insulator 103, the insulator 103 may be formed while the substrate is being heated. For example, in the case where a semiconductor element layer is provided under the transistor 10, the heat treatment may be performed in a relatively low temperature range (e.g., higher than or equal to 350° C. and lower than or equal to 445° C.).

Figure 17C:
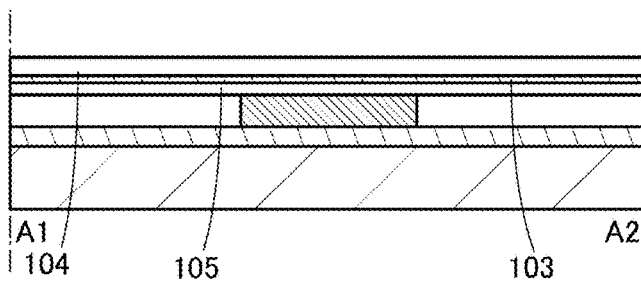
Figure 17D:
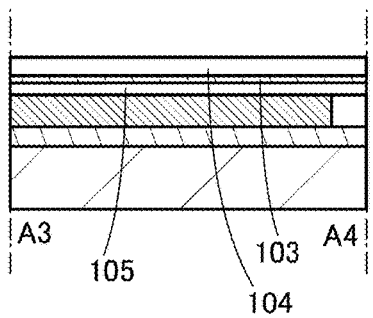

Then, the insulator 104 is formed (see FIGS. 17C and 17D). Any of the above-described insulators can be used for the insulator 104. The insulator 104 can be formed by a sputtering method, a CVD method, an MBE method, a PLD method, an ALD method, or the like.

The top surface or the bottom surface of the semiconductor 106b to be formed later preferably has high planarity. Thus, to improve the planarity, the top surface of the insulator 104 may be subjected to planarization treatment such as CMP treatment.

Next, heat treatment is preferably performed.

Next, an insulator to be the insulator 106a is formed. Any of the above-described insulators and semiconductors that can be used for the insulator 106a can be used for the insulator. The insulator can be formed by a sputtering method, a CVD method, an MBE method, a PLD method, an ALD method, or the like.

Next, a semiconductor to be the semiconductor 106b is formed. Any of the above-described semiconductors that can be used for the semiconductor 106b can be used for the semiconductor. The semiconductor can be formed by a sputtering method, a CVD method, an MBE method, a PLD method, an ALD method, or the like. Note that successive film formation of the insulator and the semiconductor without exposure to the air can reduce entry of impurities into the films and their interface.

Next, heat treatment is preferably performed. The heat treatment can further reduce water and hydrogen in the insulator 105, the insulator 103, and the insulator 104. In addition, the insulator 104 can contain excess oxygen in some cases. The heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator to be the insulator 106a and the semiconductor to be the semiconductor 106b and can remove impurities, such as hydrogen and water, for example. For the heat treatment, lamp heating can be performed with use of an RTA apparatus. Heat treatment with an RTA apparatus is effective for an improvement in productivity because it needs short time as compared with the case of using a furnace.

Note that in the case where a semiconductor element layer is provided below the transistor 10, the heat treatment can be performed in a relatively low temperature range (e.g., higher than or equal to 350° C. and lower than or equal to 445° C.). For example, the temperature is preferably set lower than or equal to the highest heating temperature among the substrate heating temperatures for forming the insulator 105, the insulator 103, and the insulator 104.

Figure 17E:
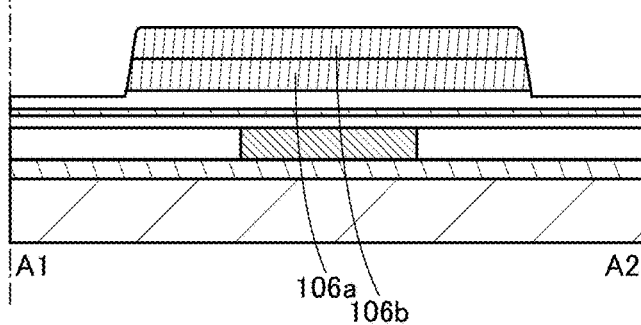
Figure 17F:
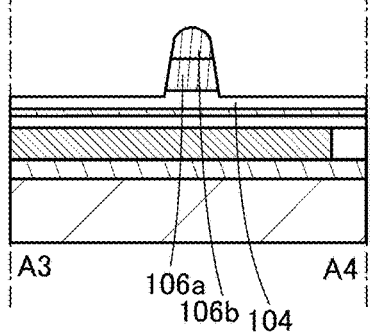

Next, a resist or the like is formed over the semiconductor and processing is performed using the resist or the like, whereby the insulator 106a and the semiconductor 106b are formed (see FIGS. 17E and 17F).

Next, heat treatment is preferably performed. The heat treatment can further reduce water and hydrogen in the insulator 105, the insulator 103, and the insulator 104. In addition, the insulator 104 can contain excess oxygen in some cases. The heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator to be the insulator 106a and the semiconductor 106b and can remove impurities, such as hydrogen and water, for example. For the heat treatment, lamp heating can be performed with use of an RTA apparatus. Heat treatment with an RTA apparatus is effective for an improvement in productivity because it needs short time as compared with the case of using a furnace.

Note that in the case where a semiconductor element layer is provided below the transistor 10, the heat treatment can be performed in a relatively low temperature range (e.g., higher than or equal to 350° C. and lower than or equal to 445° C.). For example, the temperature is preferably set lower than or equal to the highest heating temperature among the substrate heating temperatures for forming the insulator 105, the insulator 103, and the insulator 104.

Figure 17G:
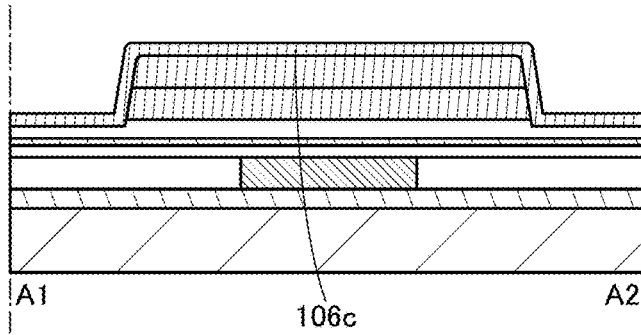
Figure 17H:
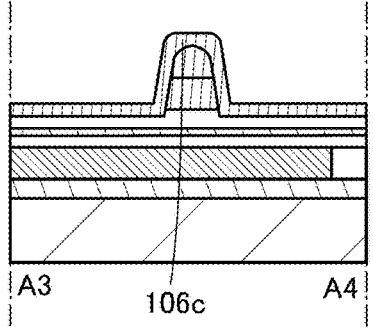

Next, the insulator 106c is formed (see FIGS. 17G and 17H). Any of the above-described insulators and semiconductors that can be used for the insulator 106c can be used for the insulator 106c. The insulator 106c can be formed by a sputtering method, a CVD method, an MBE method, a PLD method, an ALD method, or the like.

Next, a conductor to be the conductor 108a and the conductor 108b is formed. Any of the above-described conductors that can be used for the conductors 108a and 108b can be used for the conductor. The conductor can be formed by a sputtering method, a CVD method, an MBE method, a PLD method, an ALD method, or the like.

Here, the low-resistance region 109 is formed in a region in the semiconductor 106b and the insulator 106c near the conductor to be the conductor 108 in some cases.

Next, a resist or the like is formed over the conductor and processing is performed using the resist or the like, whereby the conductor 108 is formed.

Next, an insulator 113 that is to be the insulator 110 is formed. Any of the above-described insulators that can be used for the insulator 110 can be used for the insulator 113, for example. The insulator 113 can be formed by a sputtering method, a CVD method, an MBE method, a PLD method, an ALD method, or the like.

Figure 18A:
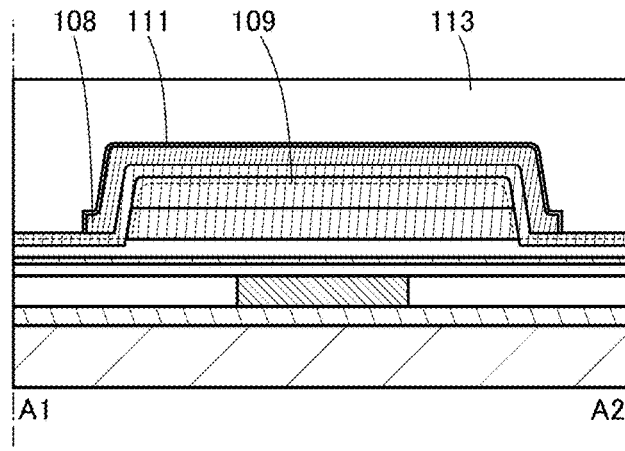
FIGS. 18A to 18F are cross-sectional views illustrating a method for manufacturing a transistor of one embodiment of the present invention.
Figure 18B:
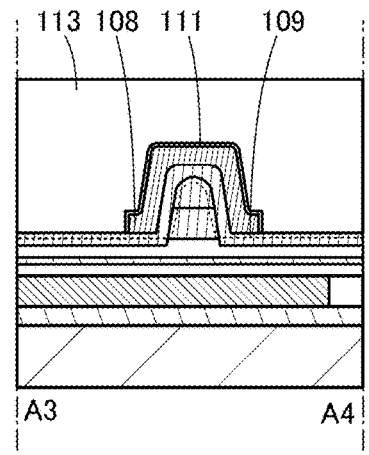

When the insulator 110 is formed, a region 111 containing silicon and oxygen is formed on a surface of the conductor 108 in some cases (see FIGS. 18A and 18B). Note that the region 111 may be formed even when the insulator 110 is not formed, and the region 111 is not formed in forming the insulator 110 depending on deposition conditions of the insulator 110.

Figure 18C:
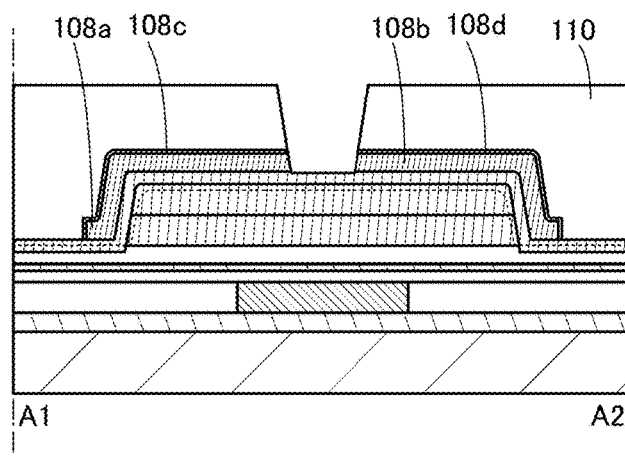
Figure 18D:
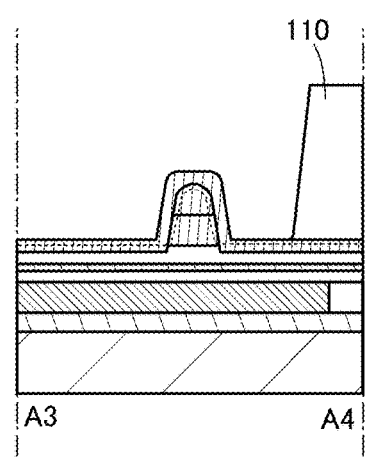
Figure 18E:
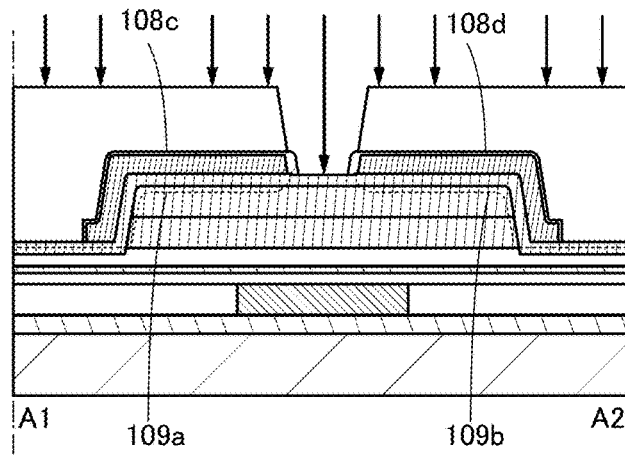
Figure 18F:
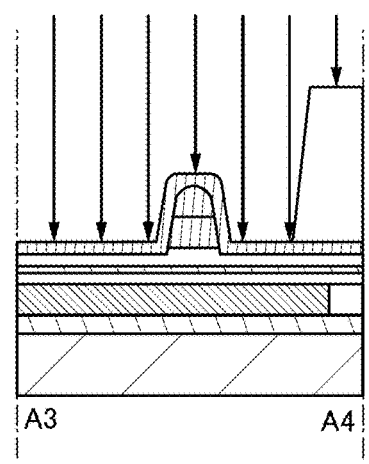

Next, a resist or the like is formed over the insulator 113 and processing is performed using the resist or the like, so that the insulator 110, the region 108c, the region 108d, the conductor 108a, and the conductor 108b are formed (see FIGS. 18C and 18D). At this time, part of the insulator 106c and the semiconductor 106b may be processed in order to remove the low-resistance region 109 in the semiconductor 106b.

Next, high-density plasma treatment may be performed. The high-density plasma treatment is preferably performed in an atmosphere containing oxygen. The atmosphere containing oxygen is a gas atmosphere containing an oxygen atom and refers to atmospheres of oxygen, ozone, and nitrogen oxide (e.g., nitrogen monoxide, nitrogen dioxide, dinitrogen monoxide, dinitrogen trioxide, dinitrogen tetroxide, or dinitrogen pentoxide). In an atmosphere containing oxygen, an inert gas such as nitrogen or a rare gas (e.g., helium or argon) may be contained. With this high-density plasma treatment performed in an atmosphere containing oxygen, carbon or hydrogen can be eliminated, for example. Furthermore, with the high-density plasma treatment in an atmosphere containing oxygen, an organic compound such as hydrocarbon is also easily eliminated from a treated object.

Annealing treatment may be performed before or after the high-density plasma treatment. Note that it is in some cases preferable to let an enough amount of gas flow in order to increase the plasma density. When the gas amount is not enough, the deactivation rate of radicals becomes higher than the generation rate of radicals in some cases. For example, it is preferable in some cases to let a gas flow at 100 sccm or more, 300 sccm or more, or 800 sccm or more.

The high-density plasma treatment is performed using a microwave generated with a high-frequency generator that generates a wave having a frequency of, for example, more than or equal to 0.3 GHz and less than or equal to 3.0 GHz, or more than or equal to 2.2 GHz and less than or equal to 2.8 GHz (typically, 2.45 GHz). The treatment pressure can be higher than or equal to 10 Pa and lower than or equal to 5000 Pa, preferably higher than or equal to 200 Pa and lower than or equal to 1500 Pa, further preferably higher than or equal to 300 Pa and lower than or equal to 1000 Pa. The substrate temperature can be higher than or equal to 100° C. and lower than or equal to 600° C. (typically, 400° C.). Furthermore, a mixed gas of oxygen and argon can be used.

For example, the high density plasma is generated using a 2.45 GHz microwave. The high density plasma treatment is preferably performed under the following conditions: an electron density is higher than or equal to $1\times10^{11}/cm^3$ and lower than or equal to $1\times10^{13}/cm^3$, an electron temperature is 2 eV or lower, or an ion energy is 5 eV or lower. Such high-density plasma treatment produces radicals with low kinetic energy and causes little plasma damage, compared with conventional plasma treatment. Thus, formation of a film with few defects is possible. The distance between an antenna that generates the microwave and the treated object is longer than or equal to 5 mm and shorter than or equal to 120 mm, preferably longer than or equal to 20 mm and shorter than or equal to 60 mm.

Alternatively, a plasma power source that applies a radio frequency (RF) bias to a substrate may be provided. The frequency of the RF bias may be 13.56 MHz, 27.12 MHz, or the like, for example. The use of high-density plasma enables high-density oxygen ions to be produced, and application of the RF bias to the substrate allows oxygen ions generated by the high-density plasma to be efficiently introduced into the treated object. Furthermore, oxygen ions can be efficiently introduced even into an opening with a high aspect ratio. Therefore, it is preferable to perform the high-density plasma treatment while a bias is applied to the substrate.

Following the high-density plasma treatment, annealing treatment may be successively performed without an exposure to the air. Following annealing treatment, the high-density plasma treatment may be successively performed without an exposure to the air. By performing high-density plasma treatment and annealing treatment in succession, entry of impurities during the treatment can be suppressed. Moreover, by performing annealing treatment after the high-density plasma treatment in an oxygen atmosphere, unnecessary oxygen that is added into the treated object but is not used to fill oxygen vacancies can be eliminated. The annealing treatment may be performed by lamp annealing or the like, for example.

The treatment time of the high-density plasma treatment is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

The treatment time of the annealing treatment at a temperature of higher than or equal to 250° C. and lower than or equal to 800° C., higher than or equal to 300° C. and lower than or equal to 700° C., or higher than or equal to 400° C. and lower than or equal to 600° C. is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

By the high-density plasma treatment and/or the annealing treatment, defect states in a region of the semiconductor 106b to be a channel formation region can be reduced. That is, the channel formation region can be a highly purified intrinsic region. At this time, in some cases, the resistance of part of the low-resistance region 109 is increased, so that the low-resistance region 109 is divided into the low-resistance region 109a and the low-resistance region 109b. The regions 108c and 108d can be formed also on the side surfaces of the conductors 108a and 108b (see FIGS. 18E and 18F).

Then, the insulator 132 is formed. Any of the above-described insulators that can be used for the insulator 112 can be used for the insulator 132. The insulator 132 can be formed by a sputtering method, a CVD method, an MBE method, a PLD method, an ALD method, or the like. Note that successive film formation of the insulator 126c and the insulator 132 without exposure to the air can reduce entry of impurities into the films and their interface.

Figure 19A:
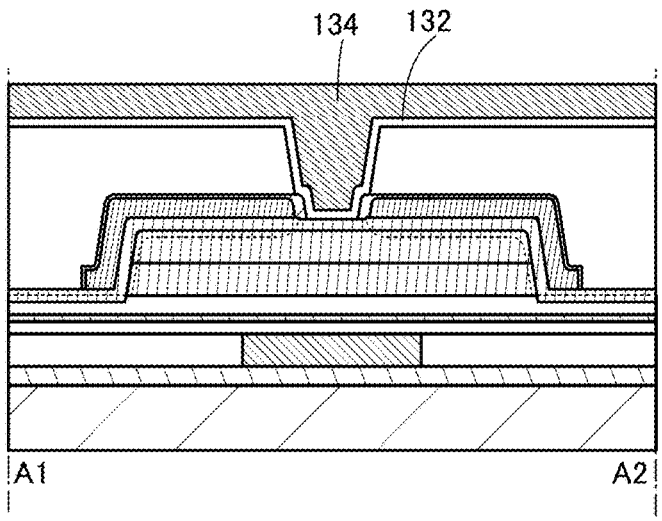
FIGS. 19A to 19F are cross-sectional views illustrating a method for manufacturing a transistor according to one embodiment of the present invention.
Figure 19B:
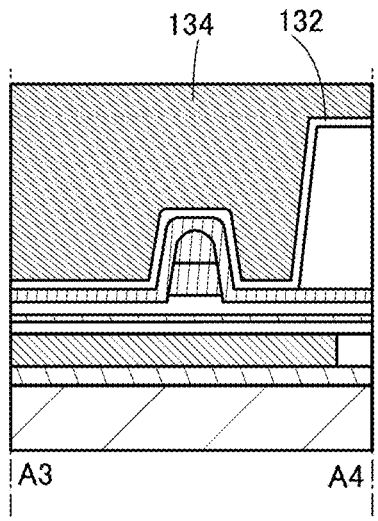

Next, the conductor 134 is formed (see FIGS. 19A and 19B). Any of the above-described conductors that can be used for the conductor 114 can be used for the conductor 134. The conductor 134 can be formed by a sputtering method, a CVD method, an MBE method, a PLD method, an ALD method, or the like. Note that successive film formation of the insulator 132 and the conductor 134 without exposure to the air can reduce entry of impurities into the films and their interface.

Figure 19C:
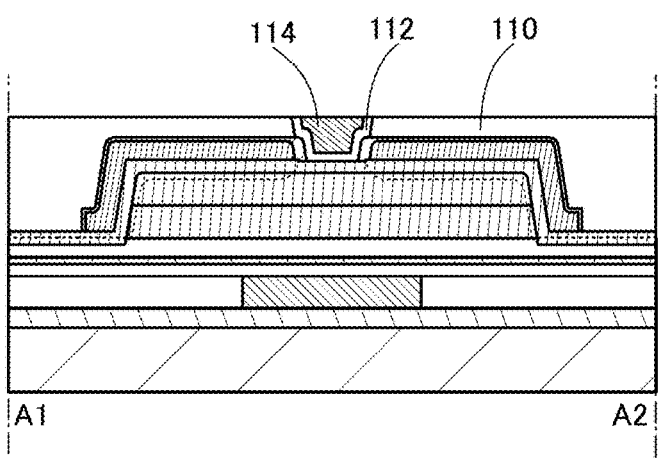
Figure 19D:
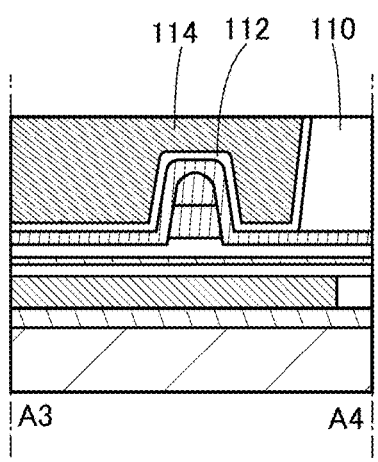

Next, the conductor 134 is polished until the insulator 113 is exposed, whereby the conductor 114, the insulator 112, and the insulator 110 are formed (see FIGS. 19C and 19D). The conductor 114 serves as a gate electrode of the transistor 29 and the insulator 112 serves as a gate insulator of the transistor 29. As described above, the conductor 114 and the insulator 112 can be formed in a self-aligned manner.

Figure 19E:
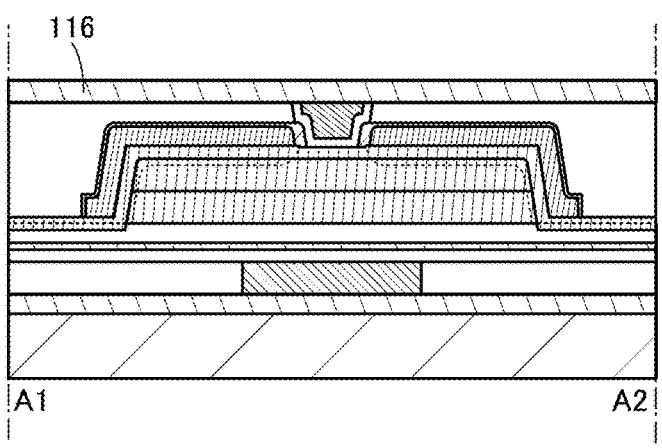
Figure 19F:
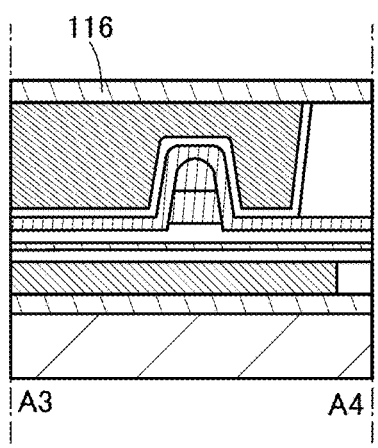

Then, the insulator 116 is formed (see FIGS. 19E and 19F). Any of the above-described insulators can be used for the insulator 116. The insulator 116 can be formed by a sputtering method, a CVD method, an MBE method, a PLD method, an ALD method, or the like.

Next, heat treatment is preferably performed.

Through the above process, the transistor 29 of one embodiment of the present invention can be fabricated.

By the method for fabricating a transistor described in this embodiment, it is possible to provide a transistor including a conductor having heat resistance and oxidation resistance.

A transistor with stable electrical characteristics can be provided. A transistor having a low leakage current in an off state can be provided. A transistor having normally-off electrical characteristics can be provided. A transistor having a small subthreshold swing value can be provided. A transistor having high reliability can be provided.

In the method for forming a transistor described in this embodiment, supply of water, hydrogen, and the like to the semiconductor 106b and the like can be prevented by heat treatment within a relatively low temperature range; accordingly, even when a semiconductor element layer, a wiring layer, or the like is formed below the transistor, the transistor can be formed without being degraded due to high temperature.

The structure and method described in this embodiment can be implemented by being combined as appropriate with any of the other structures and methods described in the other embodiments.

Embodiment 3

<Manufacturing Apparatus>

A manufacturing apparatus of one embodiment of the present invention in which high-density plasma treatment is performed is described below.

Figure 21:
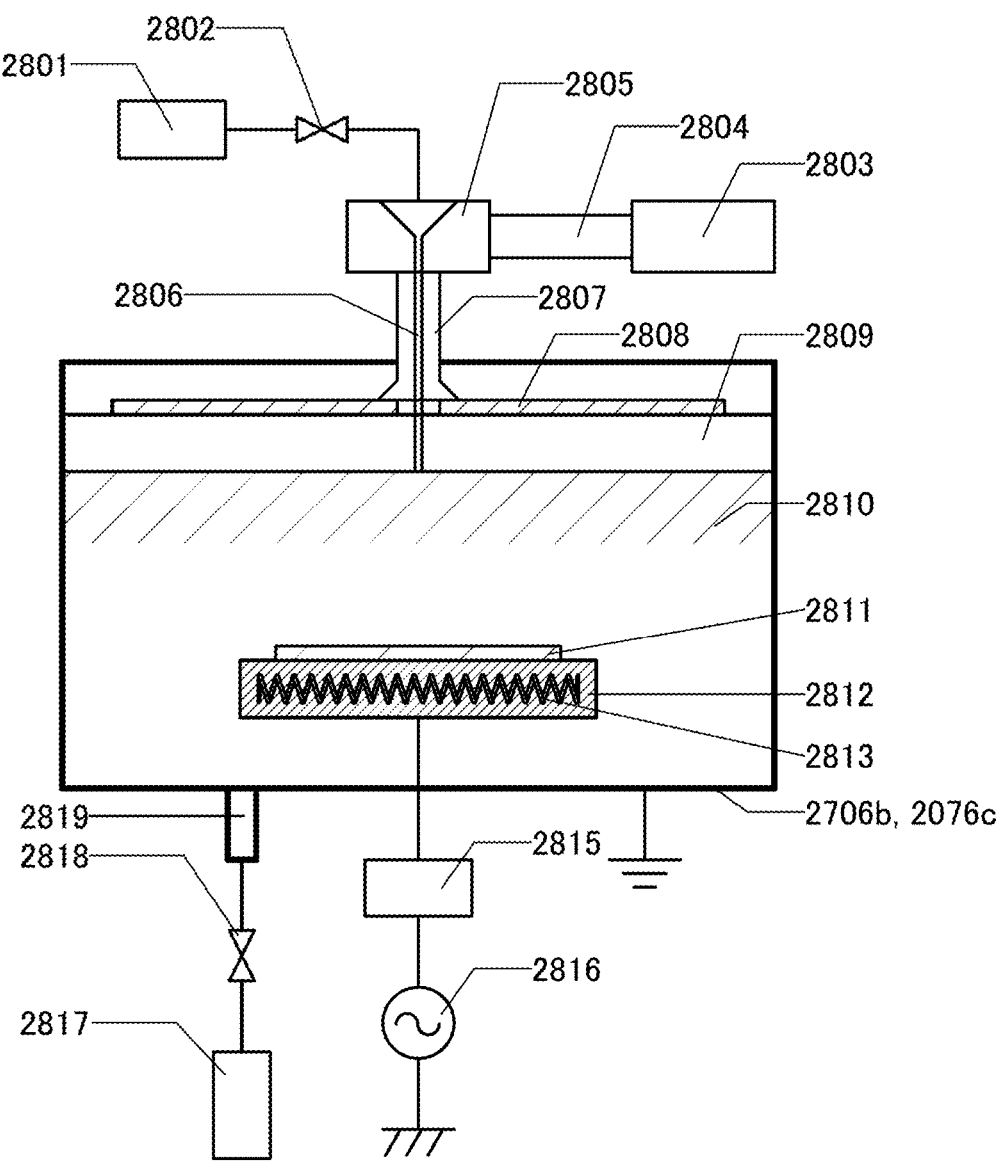
FIG. 21 is a cross-sectional view illustrating a chamber of one embodiment of the present invention.
Figure 22:
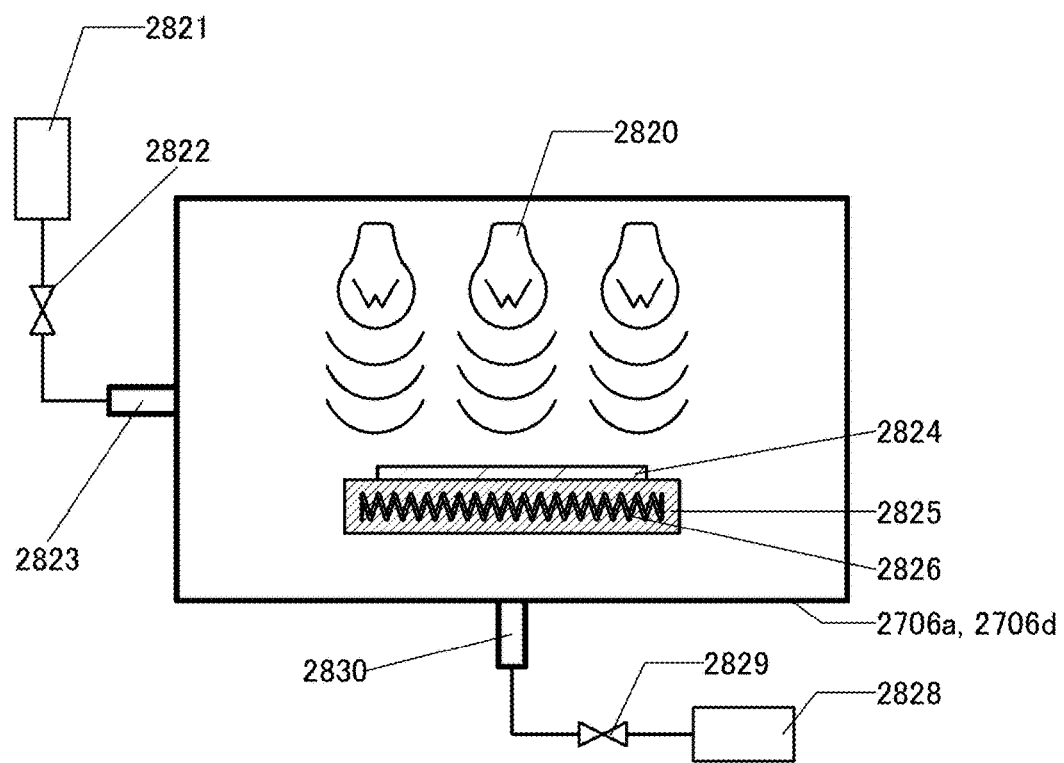
FIG. 22 is a cross-sectional view illustrating a chamber of one embodiment of the present invention.

First, a structure of a manufacturing apparatus which allows the entry of few impurities into a film at the time of formation of a semiconductor device or the like is described with reference to FIG. 20, FIG. 21, and FIG. 22.

Figure 20:
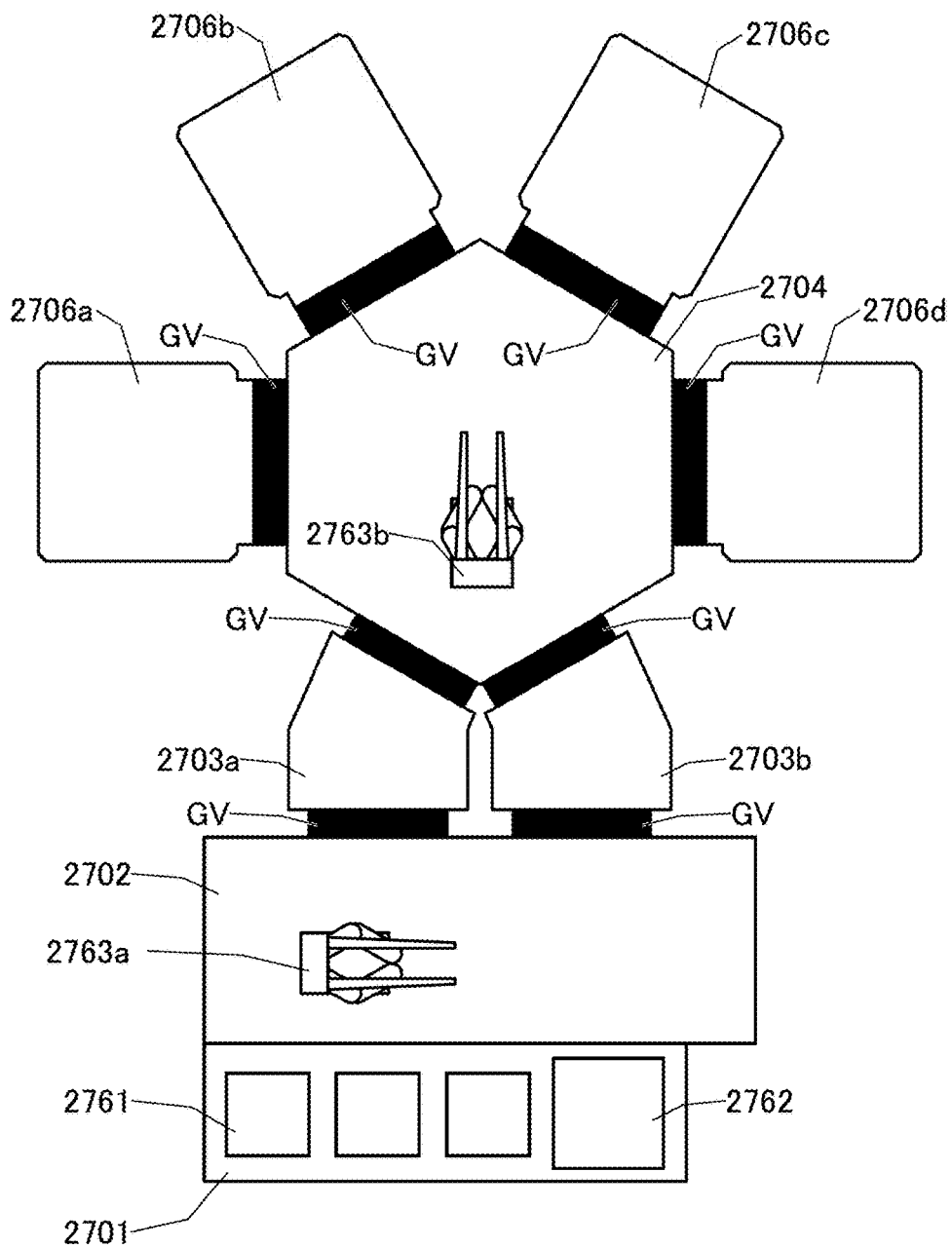
FIG. 20 is a top view illustrating a manufacturing apparatus of one embodiment of the present invention.

FIG. 20 is a top view schematically illustrating a single wafer multi-chamber manufacturing apparatus 2700. The manufacturing apparatus 2700 includes an atmosphere-side substrate supply chamber 2701 including a cassette port 2761 for holding a substrate and an alignment port 2762 for performing alignment of a substrate, an atmosphere-side substrate transfer chamber 2702 through which a substrate is transferred from the atmosphere-side substrate supply chamber 2701, a load lock chamber 2703a where a substrate is carried in and the pressure inside the chamber is switched from atmospheric pressure to reduced pressure or from reduced pressure to atmospheric pressure, an unload lock chamber 2703b where a substrate is carried out and the pressure inside the chamber is switched from reduced pressure to atmospheric pressure or from atmospheric pressure to reduced pressure, a transfer chamber 2704 through which a substrate is transferred in a vacuum, and chambers 2706a, 2706b, 2706c, and 2706d.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chambers 2706a, 2706b, 2706c, and 2706d.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. In addition, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

In the transfer chamber 2704 and each of the chambers 2706a to 2706d, the back pressure (total pressure) is, for example, lower than or equal to $1 \times 10^{-4}$ Pa, preferably lower than or equal to $3 \times 10^{-5}$ Pa, further preferably lower than or equal to $1 \times 10^{-5}$ Pa. In the transfer chamber 2704 and each of the chambers 2706a to 2706d, the partial pressure of a gas molecule (atom) having a mass-to-charge ratio (m/z) of 18 is, for example, lower than or equal to $3 \times 10^{-5}$ Pa, preferably lower than or equal to $1 \times 10^{-5}$ Pa, further preferably lower than or equal to $3 \times 10^{-6}$ Pa. Moreover, in the transfer chamber 2704 and each of the chambers 2706a to 2706d, the partial pressure of a gas molecule (atom) having a mass-to-charge ratio (m/z) of 28 is, for example, lower than or equal to $3 \times 10^{-5}$ Pa, preferably lower than or equal to $1 \times 10^{-5}$ Pa, further preferably lower than or equal to $3 \times 10^{-6}$ Pa. Further, in the transfer chamber 2704 and each of the chambers 2706a to 2706d, the partial pressure of a gas molecule (atom) having a mass-to-charge ratio (m/z) of 44 is, for example, lower than or equal to $3 \times 10^{-5}$ Pa, preferably lower than or equal to $1 \times 10^{-5}$ Pa, further preferably lower than or equal to $3 \times 10^{-6}$ Pa.

Note that the total pressure and the partial pressure in the transfer chamber 2704 and each of the chambers 2706a to 2706d can be measured using a mass analyzer. For example, Qulee CGM-051, a quadrupole mass analyzer (also referred to as Q-mass) manufactured by ULVAC, Inc. can be used.

Moreover, the transfer chamber 2704 and each of the chambers 2706a to 2706d preferably have a small amount of external leakage or internal leakage. For example, in the transfer chamber 2704 and each of the chambers 2706a to 2706d, the leakage rate is less than or equal to $3 \times 10^{-6}$ Pa·m³/s, preferably less than or equal to $1 \times 10^{-6}$ Pa·m³/s. For example, the leakage rate of a gas molecule (atom) having a mass-to-charge ratio (m/z) of 18 is less than or equal to $1 \times 10^{-7}$ Pa·m³/s, preferably less than or equal to $3 \times 10^{-8}$ Pa·m³/s. For example, the leakage rate of a gas molecule (atom) having a mass-to-charge ratio (m/z) of 28 is less than or equal to $1 \times 10^{-5}$ Pa·m³/s, preferably less than or equal to $1\times10^{-6}$ Pa·m³/s. For example, the leakage rate of a gas molecule (atom) having a mass-to-charge ratio (m/z) of 44 is less than or equal to $3\times10^{-6}$ Pa·m³/s, preferably less than or equal to $1\times10^{-6}$ Pa·m³/s.

Note that a leakage rate can be derived from the total pressure and partial pressure measured using the mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above-mentioned value.

For example, open/close portions of the transfer chamber 2704 and the chambers 2706a to 2706d can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the manufacturing apparatus 2700, aluminum, chromium, titanium, zirconium, nickel, or vanadium, which releases a small amount of gas containing impurities, is used. Alternatively, an alloy containing iron, chromium, nickel, or the like covered with the above material may be used. The alloy containing iron, chromium, nickel, or the like is rigid, resistant to heat, and suitable for processing. Here, when surface unevenness of the member is decreased by polishing or the like to reduce the surface area, the release of gas can be reduced.

Alternatively, the above member of the manufacturing apparatus 2700 may be covered with iron fluoride, aluminum oxide, chromium oxide, or the like.

The member of the manufacturing apparatus 2700 is preferably formed using only metal when possible. For example, in the case where a viewing window formed of quartz or the like is provided, it is preferable that the surface of the viewing window be thinly covered with iron fluoride, aluminum oxide, chromium oxide, or the like so as to suppress release of gas.

When an adsorbed substance is present in the transfer chamber 2704 and each of the chambers 2706a to 2706d, although the adsorbed substance does not affect the pressure in the transfer chamber 2704 and each of the chambers 2706a to 2706d because it is adsorbed onto an inner wall or the like, the adsorbed substance causes a release of gas when the inside of the transfer chamber 2704 and each of the chambers 2706a to 2706d is evacuated. Therefore, although there is no correlation between the leakage rate and the exhaust rate, it is important that the adsorbed substance present in the transfer chamber 2704 and each of the chambers 2706a to 2706d be desorbed as much as possible and exhaust be performed in advance with the use of a pump with high exhaust capability. Note that the transfer chamber 2704 and each of the chambers 2706a to 2706d may be subjected to baking to promote desorption of the adsorbed substance. By the baking, the desorption rate of the adsorbed substance can be increased about tenfold. The baking can be performed at a temperature of higher than or equal to 100° C. and lower than or equal to 450° C. At this time, when the adsorbed substance is removed while an inert gas is introduced into the transfer chamber 2704 and each of the chambers 2706a to 2706d, the desorption rate of water or the like, which is difficult to desorb simply by exhaust, can be further increased. Note that when the inert gas that is introduced is heated to substantially the same temperature as the baking temperature, the desorption rate of the adsorbed substance can be further increased. Here, a rare gas is preferably used as the inert gas.

Alternatively, treatment for evacuating the inside of the transfer chamber 2704 and each of the chambers 2706a to 2706d is preferably performed a certain period of time after heated oxygen, a heated inert gas such as a heated rare gas, or the like is introduced to increase the pressure in the transfer chamber 2704 and each of the chambers 2706a to 2706d. The introduction of the heated gas can desorb the adsorbed substance in the transfer chamber 2704 and each of the chambers 2706a to 2706d, and the impurities present in the transfer chamber 2704 and each of the chambers 2706a to 2706d can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the transfer chamber 2704 and each of the chambers 2706a to 2706d, so that the pressure therein can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the inside of the transfer chamber 2704 and each of the chambers 2706a to 2706d is evacuated in the time range of 5 minutes to 300 minutes, preferably 10 minutes to 120 minutes.

Next, the chambers 2706b and 2706c are described with reference to a schematic cross-sectional view of FIG. 21.

The chambers 2706b and 2706c are chambers capable of performing high-density plasma treatment on an object, for example. Because the chambers 2706b and 2706c have a common structure with the exception of the atmosphere used in the high-density plasma treatment, they are collectively described below.

The chambers 2706b and 2706c each include a slot antenna plate 2808, a dielectric plate 2809, a substrate stage 2812, and an exhaust port 2819. A gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chambers 2706b and 2706c.

The high-frequency generator 2803 is connected to the mode converter 2805 through the waveguide 2804. The mode converter 2805 is connected to the slot antenna plate 2808 through the waveguide 2807. The slot antenna plate 2808 is positioned in contact with the dielectric plate 2809. Further, the gas supply source 2801 is connected to the mode converter 2805 through the valve 2802. Gas is transferred to the chambers 2706b and 2706c through the gas pipe 2806 which runs through the mode converter 2805, the waveguide 2807, and the dielectric plate 2809. The vacuum pump 2817 has a function of exhausting gas or the like from the chambers 2706b and 2706c through the valve 2818 and the exhaust port 2819. The high-frequency power source 2816 is connected to the substrate stage 2812 through the matching box 2815.

The substrate stage 2812 has a function of holding a substrate 2811. For example, the substrate stage 2812 has a function of an electrostatic chuck or a mechanical chuck for holding the substrate 2811. In addition, the substrate stage 2812 has a function of an electrode to which electric power is supplied from the high-frequency power source 2816. The substrate stage 2812 includes a heating mechanism 2813 therein and thus has a function of heating the substrate 2811.

As the vacuum pump 2817, a dry pump, a mechanical booster pump, an ion pump, a titanium sublimation pump, a cryopump, a turbomolecular pump, or the like can be used, for example. In addition to the vacuum pump 2817, a cryotrap may be used as well. The combinational use of the cryopump and the cryotrap allows water to be efficiently exhausted and is particularly preferable.

For example, the heating mechanism 2813 may be a heating mechanism which uses a resistance heater or the like for heating. Alternatively, a heating mechanism which utilizes heat conduction or heat radiation from a medium such as a heated gas for heating may be used. For example, RTA such as gas rapid thermal annealing (GRTA) or lamp rapid thermal annealing (LRTA) can be used. In GRTA, heat treatment is performed using a high-temperature gas. An inert gas is used as the gas.

The gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (e.g., an argon gas) may be used.

As the dielectric plate 2809, silicon oxide (quartz), aluminum oxide, yttrium oxide (yttria), or the like may be used, for example. A protective layer may be further formed on a surface of the dielectric plate 2809. As the protective layer, magnesium oxide, titanium oxide, chromium oxide, zirconium oxide, hafnium oxide, tantalum oxide, silicon oxide, aluminum oxide, yttrium oxide, or the like may be used. The dielectric plate 2809 is exposed to an especially high density region of high-density plasma 2810 that is to be described later. Therefore, the protective layer can reduce the damage and consequently prevent an increase of particles or the like during the treatment.

The high-frequency generator 2803 has a function of generating a microwave with a frequency of, for example, more than or equal to 0.3 GHz and less than or equal to 3.0 GHz, or more than or equal to 2.2 GHz and less than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave propagates through the slot holes and the dielectric plate 2809. Then, an electric field is generated below the dielectric plate 2809, and the high-density plasma 2810 can be generated. The high-density plasma 2810 includes ions and radicals depending on the gas species supplied from the gas supply source 2801. For example, oxygen radicals, nitrogen radicals, or the like are included.

At this time, the quality of a film or the like over the substrate 2811 can be modified by the ions and radicals generated in the high-density plasma 2810. Note that it is preferable in some cases to apply a bias to the substrate 2811 using the high-frequency power source 2816. As the high-frequency power source 2816, a radio frequency (RF) power source with a frequency of 13.56 MHz, 27.12 MHz, or the like may be used, for example. The application of a bias to the substrate allows ions in the high-density plasma 2810 to efficiently reach a deep portion of an opening of the film or the like over the substrate 2811.

For example, in the chamber 2706b, oxygen radical treatment using the high-density plasma 2810 can be performed by introducing oxygen from the gas supply source 2801. In the chamber 2706c, nitrogen radical treatment using the high-density plasma 2810 can be performed by introducing nitrogen from the gas supply source 2801.

Next, the chambers 2706a and 2706d are described with reference to a schematic cross-sectional view of FIG. 22.

The chambers 2706a and 2706d are chambers capable of irradiating an object with an electromagnetic wave, for example. Because the chambers 2706a and 2706d have a common structure with the exception of the kind of the electromagnetic wave, they are collectively described below.

The chambers 2706a and 2706d each include one or more lamps 2820, a substrate stage 2825, a gas inlet 2823, and an exhaust port 2830. A gas supply source 2821, a valve 2822, a vacuum pump 2828, and a valve 2829 are provided outside the chambers 2706a and 2706d.

The gas supply source 2821 is connected to the gas inlet 2823 through the valve 2822. The vacuum pump 2828 is connected to the exhaust port 2830 through the valve 2829. The lamp 2820 is provided to face the substrate stage 2825. The substrate stage 2825 has a function of holding a substrate 2824. The substrate stage 2825 includes a heating mechanism 2826 therein and thus has a function of heating the substrate 2824.

As the lamp 2820, a light source having a function of emitting an electromagnetic wave such as visible light or ultraviolet light may be used, for example. For example, a light source having a function of emitting an electromagnetic wave which has a peak in a wavelength region of longer than or equal to 10 nm and shorter than or equal to 2500 nm, longer than or equal to 500 nm and shorter than or equal to 2000 nm, or longer than or equal to 40 nm and shorter than or equal to 340 nm may be used.

As the lamp 2820, a light source such as a halogen lamp, a metal halide lamp, a xenon arc lamp, a carbon arc lamp, a high-pressure sodium lamp, or a high-pressure mercury lamp may be used, for example.

For example, part of or the whole electromagnetic wave emitted from the lamp 2820 is absorbed by the substrate 2824, so that the quality of a film or the like over the substrate 2824 can be modified. For example, defects can be generated or reduced or impurities can be removed. When the substrate 2824 absorbs the electromagnetic wave while being heated, generation or reduction of defects or removal of impurities can be efficiently performed.

Alternatively, for example, the electromagnetic wave emitted from the lamp 2820 may cause heat generation in the substrate stage 2825, by which the substrate 2824 may be heated. In this case, the heating mechanism 2826 inside the substrate stage 2825 may be omitted.

For the vacuum pump 2828, the description of the vacuum pump 2817 is referred to. For the heating mechanism 2826, the description of the heating mechanism 2813 is referred to. For the gas supply source 2821, the description of the gas supply source 2801 is referred to.

With the above-described manufacturing apparatus, the quality of a film can be modified while the entry of impurities into an object suppressed.

The structure and method described in this embodiment can be implemented by being combined as appropriate with any of the other structures and methods described in the other embodiments.

Embodiment 4

In this embodiment, an example of a circuit of a semiconductor device including a transistor or the like of one embodiment of the present invention is described.
<Circuit>

An example of a circuit of a semiconductor device including a transistor or the like of one embodiment of the present invention is described below.
<CMOS Inverter>

Figure 23A:
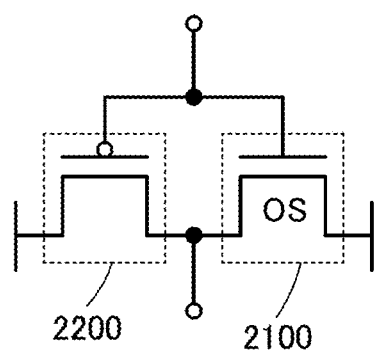
FIGS. 23A and 23B are circuit diagrams of a semiconductor device according to one embodiment of the present invention.

A circuit diagram in FIG. 23A shows a configuration of what is called a CMOS inverter in which a p-channel transistor 2200 and an n-channel transistor 2100 are connected to each other in series and in which gates of them are connected to each other.
<Structure 1 of Semiconductor Device>

Figure 24:
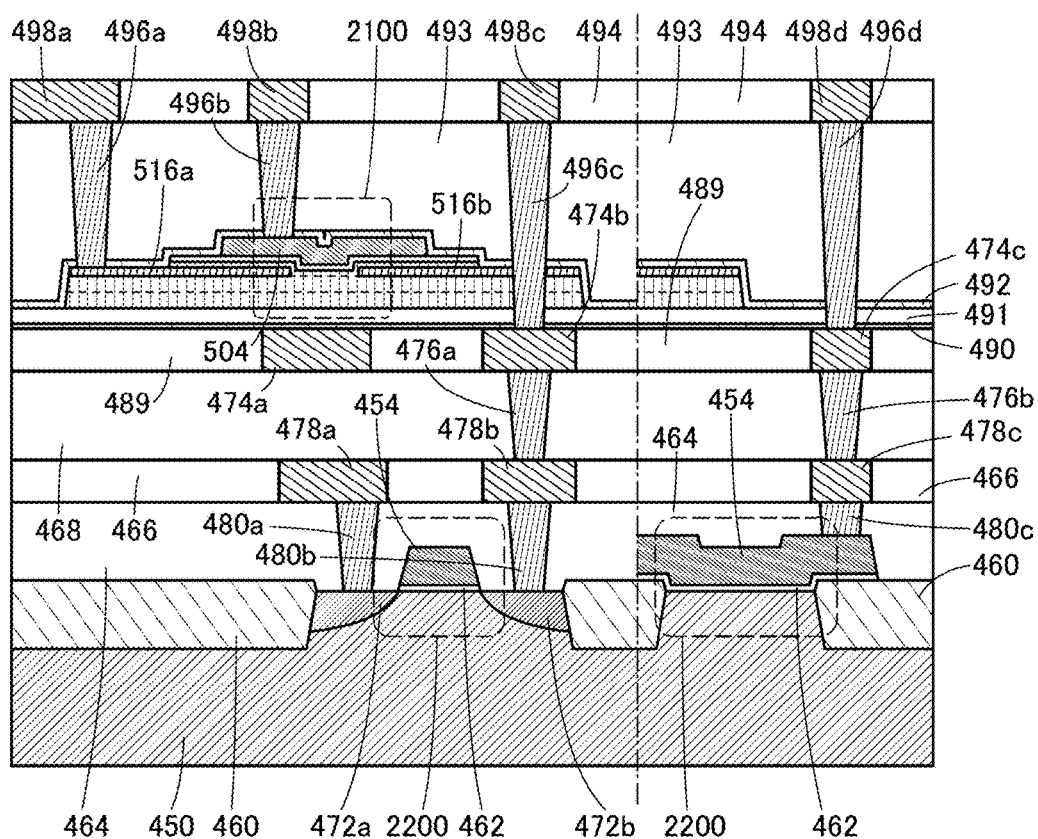
FIG. 24 is a cross-sectional view illustrating a semiconductor device of one embodiment of the present invention.

FIG. 24 is a cross-sectional view of the semiconductor device of FIG. 23A. The semiconductor device shown in FIG. 24 includes the transistor 2200 and the transistor 2100. The transistor 2100 is placed above the transistor 2200. Note that the description of the transistor 20 shown in FIGS. 9A and 9B can be referred to for the transistor 2100, but the semiconductor device of one embodiment of the present invention is not limited thereto. Any of the transistors described in the above embodiments can be used as the transistor 2100. Therefore, the description regarding the above-mentioned transistors is referred to for the transistor 2100 as appropriate.

The transistor 2200 shown in FIG. 24 is a transistor using a semiconductor substrate 450. The transistor 2200 includes a region 472a in the semiconductor substrate 450, a region 472b in the semiconductor substrate 450, an insulator 462, and a conductor 454. As the conductor 454, a conductor including a region containing tungsten and one or more elements selected from silicon, carbon, germanium, tin, aluminum, and nickel is preferably used.

In the transistor 2200, the regions 472a and 472b have functions of a source region and a drain region. The insulator 462 serves as a gate insulator. The conductor 454 serves as a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device illustrated in FIG. 24 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 489, an insulator 490, an insulator 491, an insulator 492, an insulator 493, and an insulator 494. As each of the conductor 480a, 480b, and 480c, a conductor including a region containing tungsten and one or more elements selected from silicon, carbon, germanium, tin, aluminum, and nickel is preferably used.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 493 is placed over the transistor 2100. The insulator 494 is placed over the insulator 493.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may serve as a gate electrode of the transistor 2100. The electrical characteristics of the transistor 2100, such as the threshold voltage, may be controlled by application of a predetermined potential to the conductor 474a, for example. The conductor 474a may be electrically connected to the conductor 504 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable. Note that the conductor 474a corresponds to the conductor 102 in the above embodiment and thus, the description of the conductor 102 can be referred to for details about the conductor 474a.

The insulator 490 includes an opening reaching the conductor 474b and an opening reaching the conductor 474c. Note that the insulator 490 corresponds to the insulator 103 in the above embodiment and thus, the description of the insulator 103 can be referred to for details about the insulator 490. As described in the above embodiment, the insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 2100.

The insulator 491 includes the opening reaching the conductor 474b and the opening reaching the conductor 474c. Note that the insulator 491 corresponds to the insulator 104 in the above embodiment and thus, the description of the insulator 104 can be referred to for details about the insulator 491.

As described in the above embodiment, the amounts of water and hydrogen in the insulator 491 can be reduced, so that defect states can be prevented from being formed in the oxide semiconductor of the transistor 2100. Accordingly, the electrical characteristics of the transistor 2100 can be stabilized.

Such an insulator in which water and hydrogen are reduced may be used as an insulator other than the insulator 491, such as the insulator 466, the insulator 468, the insulator 489, or the insulator 493.

Although insulators that correspond to the insulators 105 and 101 in the transistor 20 are not illustrated in FIG. 24, these insulators may be provided. For example, an insulator that corresponds to the insulator 101 may be provided between the insulator 468 and the insulator 489, and an insulator that corresponds to the insulator 105 may be provided between the insulator 489 and the insulator 490. In particular, the insulator that has a function of blocking water, hydrogen, and the like and corresponds to the insulator 101 may be provided between the insulator 468 and the insulator 489 and the amounts of water and hydrogen in the insulator 491 are reduced in the above-described manner, whereby defect states can be further prevented from being formed in the oxide semiconductor of the transistor 2100.

The insulator 492 includes an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. Note that the insulator 492 corresponds to the insulator 116 in the above embodiment and thus, the description of the insulator 116 can be referred to for details about the insulator 492.

The insulator 493 includes an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. In the openings, the conductor 496a, the conductor 496b, the conductor 496c, and the conductor 496d are embedded. Note that in some cases, an opening provided in a component of the transistor 2100 or the like is positioned between openings provided in other components.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 489, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, 489, 493, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 454, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be a conductor including a region containing tungsten and one or more elements selected from silicon, carbon, germanium, tin, aluminum, and nickel. Specifically, a conductor containing tungsten and silicon is preferable. Alternatively, each of the conductors may be formed to have, a single-layer structure or a stacked-layer structure including a conductor containing one or more kinds of elements selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 25:
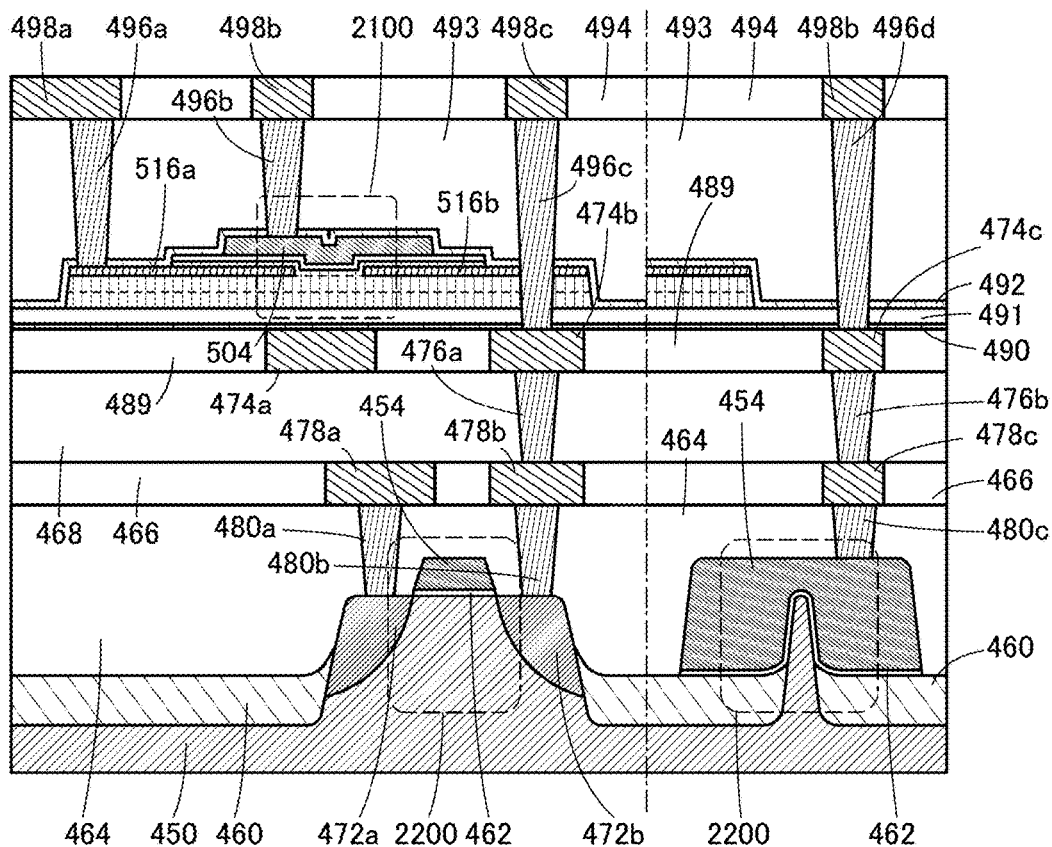
FIG. 25 is a cross-sectional view illustrating a semiconductor device of one embodiment of the present invention.

Note that a semiconductor device in FIG. 25 is the same as the semiconductor device in FIG. 24 except for the structure of the transistor 2200. Therefore, the description of the semiconductor device in FIG. 24 is referred to for the semiconductor device in FIG. 25. In the semiconductor device in FIG. 25, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved.

Figure 26:
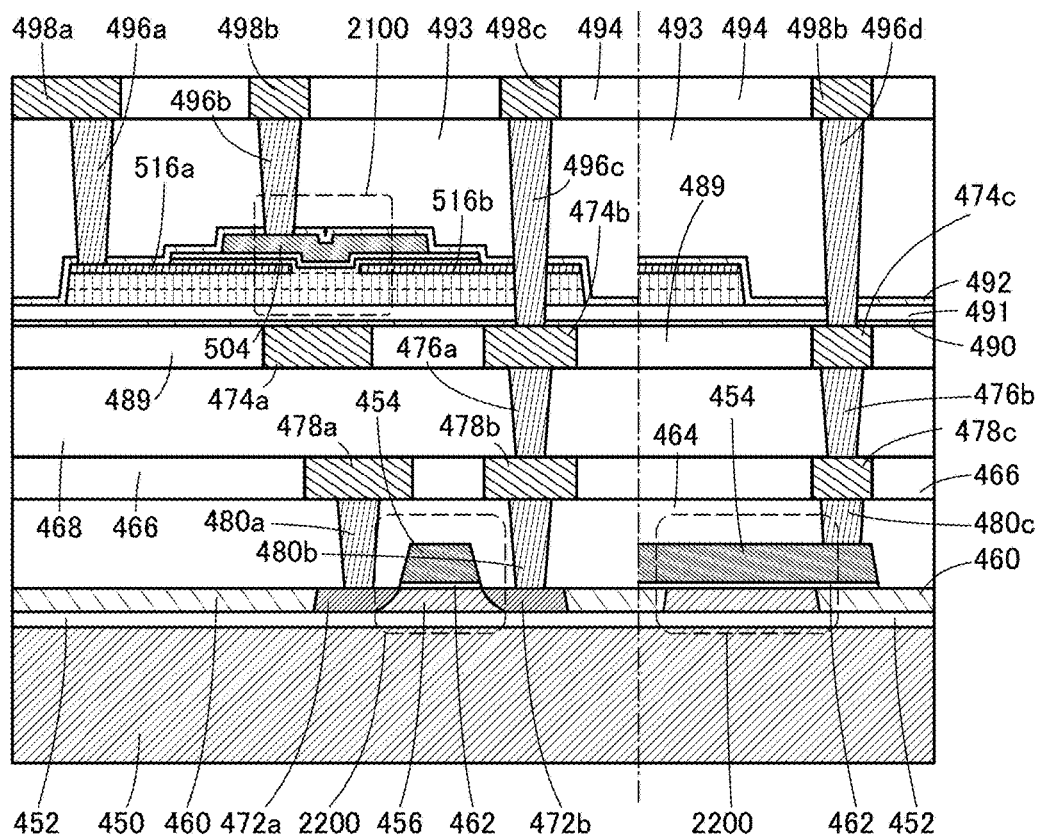
FIG. 26 is a cross-sectional view illustrating a semiconductor device according to one embodiment of the present invention.

Note that a semiconductor device in FIG. 26 is the same as the semiconductor device in FIG. 24 except for the structure of the transistor 2200. Therefore, the description of the semiconductor device in FIG. 24 is referred to for the semiconductor device in FIG. 26. Specifically, in the semiconductor device in FIG. 26, the transistor 2200 is formed in the semiconductor substrate 450 that is an SOI substrate. In the structure in FIG. 26, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 24 to FIG. 26, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 23B:
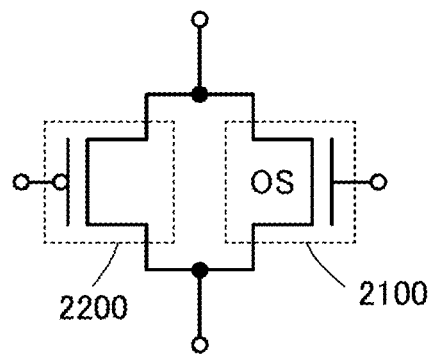

A circuit diagram in FIG. 23B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 27A:
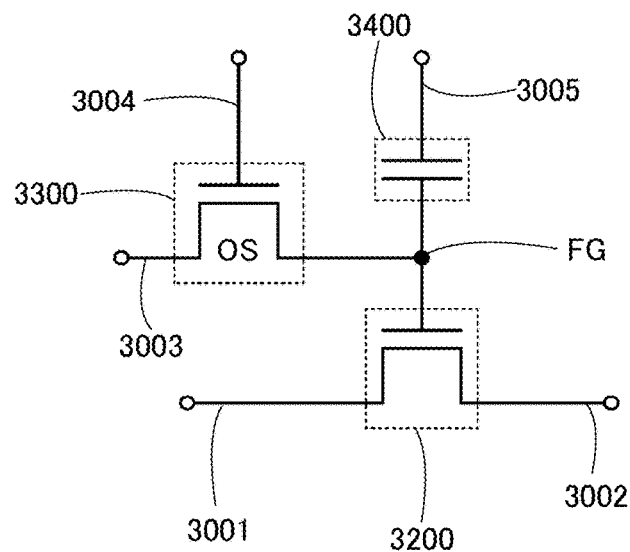
FIGS. 27A to 27C are circuit diagrams illustrating memory devices of embodiments of the present invention.
Figure 27B:
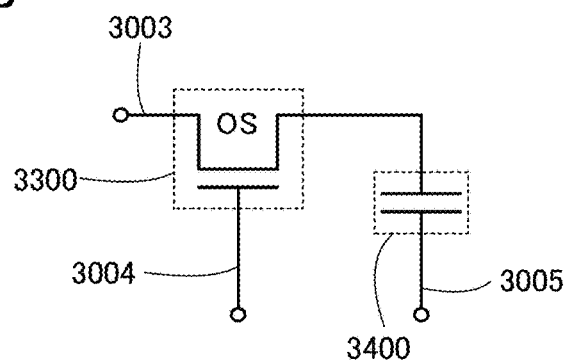
Figure 27C:
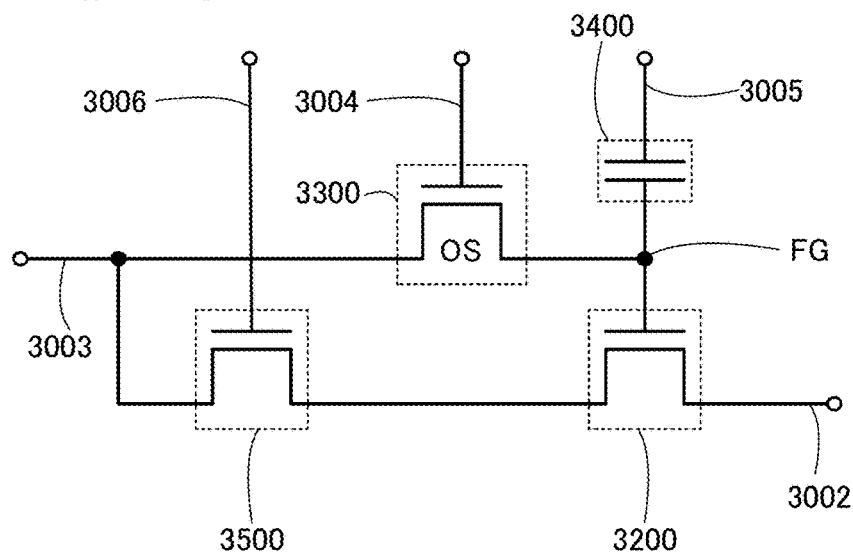

An example of a semiconductor device (memory device) which includes the transistor of one embodiment of the present invention, which can retain stored data even when not powered, and which has an unlimited number of write cycles is shown in FIGS. 27A to 27C.

The semiconductor device illustrated in FIG. 27A includes a transistor 3200 using a first semiconductor, a transistor 3300 using a second semiconductor, and a capacitor 3400. Note that a transistor similar to the transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 27A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 27A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. For example, a configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

<Structure 1 of Memory Device>

Figure 28:
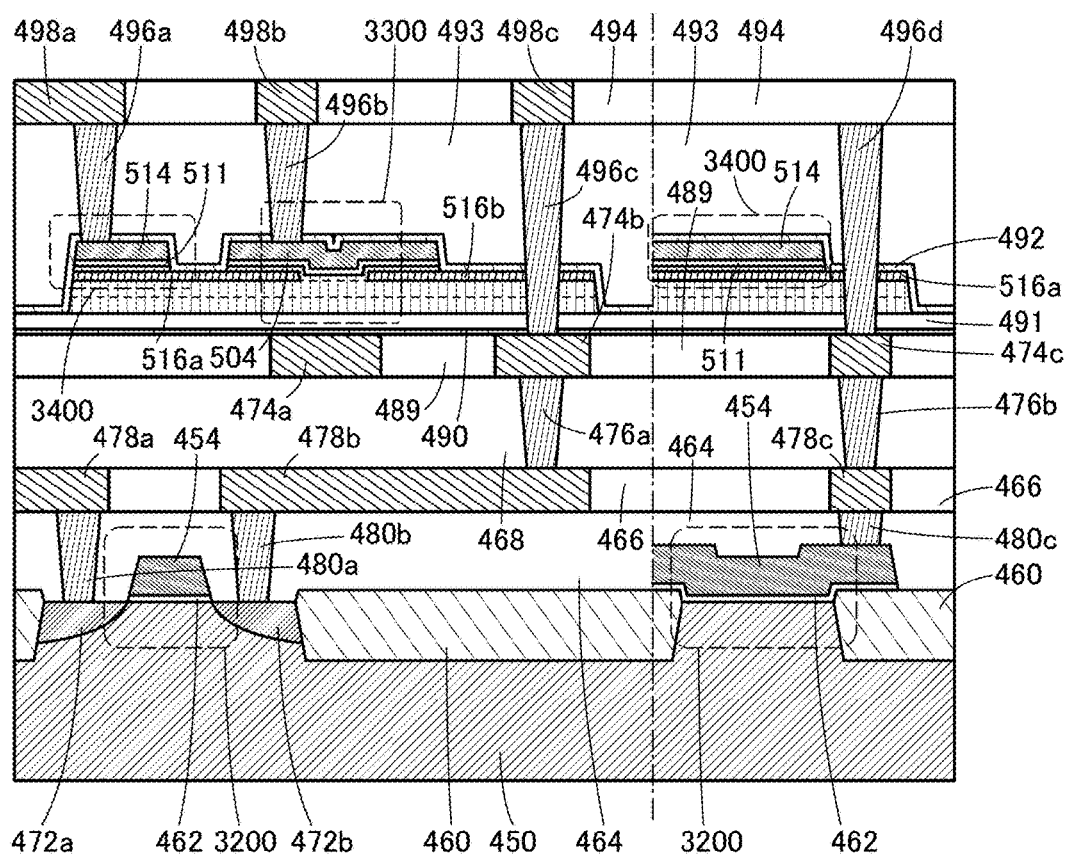
FIG. 28 is a cross-sectional view illustrating a semiconductor device of one embodiment of the present invention.

FIG. 28 is a cross-sectional view of the semiconductor device of FIG. 27A. The semiconductor device shown in FIG. 28 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 24 is referred to. Note that although the transistor 2200 is illustrated as a p-channel transistor in FIG. 24, the transistor 3200 may be an n-channel transistor.

The transistor 3200 illustrated in FIG. 28 is a transistor using the semiconductor substrate 450. The transistor 3200 includes the region 472a in the semiconductor substrate 450, the region 472b in the semiconductor substrate 450, the insulator 462, and the conductor 454.

The semiconductor device illustrated in FIG. 28 includes the insulator 464, the insulator 466, the insulator 468, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, the insulator 489, the insulator 490, the insulator 491, the insulator 492, the insulator 493, and the insulator 494.

The insulator 464 is provided over the transistor 3200. The insulator 466 is provided over the insulator 464. The insulator 468 is provided over the insulator 466. The insulator 489 is provided over the insulator 468. The transistor 3300 is provided over the insulator 489. The insulator 493 is provided over the transistor 3300. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 3300, an opening reaching the conductor 476a, and an opening reaching the conductor 476b. In the openings, the conductor 474a, the conductor 474b, and the conductor 474c are embedded.

The conductor 474a may serve as a bottom gate electrode of the transistor 3300. Alternatively, for example, electrical characteristics such as the threshold voltage of the transistor 3300 may be controlled by application of a constant potential to the conductor 474a. Further alternatively, for example, the conductor 474a and the conductor 504 that is a top gate electrode of the transistor 3300 may be electrically connected to each other. Thus, the on-state current of the transistor 3300 can be increased. A punch-through phenomenon can be suppressed; thus, stable electrical characteristics in a saturation region of the transistor 3300 can be obtained.

The insulator 490 includes an opening reaching the conductor 474b and an opening reaching the conductor 474c. Note that the insulator 490 corresponds to the insulator 103 in the above embodiment and thus, the description of the insulator 103 can be referred to for details about the insulator 490. As described in the above embodiment, the insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 3300.

The insulator 491 includes the opening reaching the conductor 474b and the opening reaching the conductor 474c. Note that the insulator 491 corresponds to the insulator 104 in the above embodiment and thus, the description of the insulator 104 can be referred to for details about the insulator 491.

As described in the above embodiment, the amounts of water and hydrogen in the insulator 491 can be reduced, so that defect states can be prevented from being formed in the oxide semiconductor of the transistor 2100. Accordingly, the electrical characteristics of the transistor 2100 can be stabilized.

Such an insulator in which water and hydrogen are reduced may be used as an insulator other than the insulator 491, such as the insulator 466, the insulator 468, the insulator 489, or the insulator 493.

Although insulators that correspond to the insulators 105 and 101 in the transistor 20 are not illustrated in FIG. 24, these insulators may be provided. For example, an insulator that corresponds to the insulator 101 may be provided between the insulator 468 and the insulator 489, and an insulator that corresponds to the insulator 105 may be provided between the insulator 489 and the insulator 490. In particular, the insulator that has a function of blocking water, hydrogen, and the like and corresponds to the insulator 101 may be provided between the insulator 468 and the insulator 489 and the amounts of water and hydrogen in the insulator 491 are reduced in the above-described manner, whereby defect states can be further prevented from being formed in the oxide semiconductor of the transistor 3300.

The insulator 492 includes an opening reaching the conductor 474b through the conductor 516b that is one of a source electrode and a drain electrode of the transistor 3300, an opening reaching the conductor 514 that overlaps with the conductor 516a that is the other of the source electrode and the drain electrode of the transistor 3300, with the insulator 511 positioned therebetween, an opening reaching the conductor 504 that is a gate electrode of the transistor 3300, and an opening reaching the conductor 474c through the conductor 516a that is the other of the source electrode and the drain electrode of the transistor 3300. Note that the insulator 492 corresponds to the insulator 116 in the above embodiment and thus, the description of the insulator 116 can be referred to for details about the insulator 492.

The insulator 493 includes an opening reaching the conductor 474b through the conductor 516b that is one of a source electrode and a drain electrode of the transistor 3300, an opening reaching the conductor 514 that overlaps with the conductor 516a that is the other of the source electrode and the drain electrode of the transistor 3300, with the insulator 511 positioned therebetween, an opening reaching the conductor 504 that is a gate electrode of the transistor 3300, and an opening reaching the conductor 474c through the conductor 516a that is the other of the source electrode and the drain electrode of the transistor 3300. In the openings, the conductor 496*a*, the conductor 496*b*, the conductor 496*c*, and the conductor 496*d* are embedded. Note that in some cases, an opening provided in a component of the transistor 3300 or the like is positioned between openings provided in other components.

The insulator 494 includes an opening reaching the conductor 496*a*, an opening reaching the conductor 496*b*, an opening reaching the conductor 496*c*, and an opening reaching the conductor 496*d*. In the openings, the conductors 498*a*, 498*b*, 498*c*, and 498*d* are embedded.

At least one of the insulators 464, 466, 468, 489, 493, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The source or drain of the transistor 3200 is electrically connected to the conductor 516*b* that is one of the source electrode and the drain electrode of the transistor 3300 through the conductor 480*b*, the conductor 478*b*, the conductor 476*a*, the conductor 474*b*, and the conductor 496*c*. The conductor 454 that is the gate electrode of the transistor 3200 is electrically connected to the conductor 516*a* that is the other of the source electrode and the drain electrode of the transistor 3300 through the conductor 480*c*, the conductor 478*c*, the conductor 476*b*, the conductor 474*c*, and the conductor 496*d*.

The capacitor 3400 includes the conductor 516*a* that is the other of the source electrode and the drain electrode of the transistor 3300, the conductor 514, and the insulator 511. The insulator 511 is preferably used in some cases because the insulator 511 can be formed in the same step as the insulator functioning as a gate insulator of the transistor 3300, leading to an increase in productivity. A layer formed in the same step as the conductor 504 functioning as the gate electrode of the transistor 3300 is preferably used as the conductor 514 in some cases, leading to an increase in productivity.

For the structures of other components, the description of FIG. 24 and the like can be referred to as appropriate.

Figure 29:
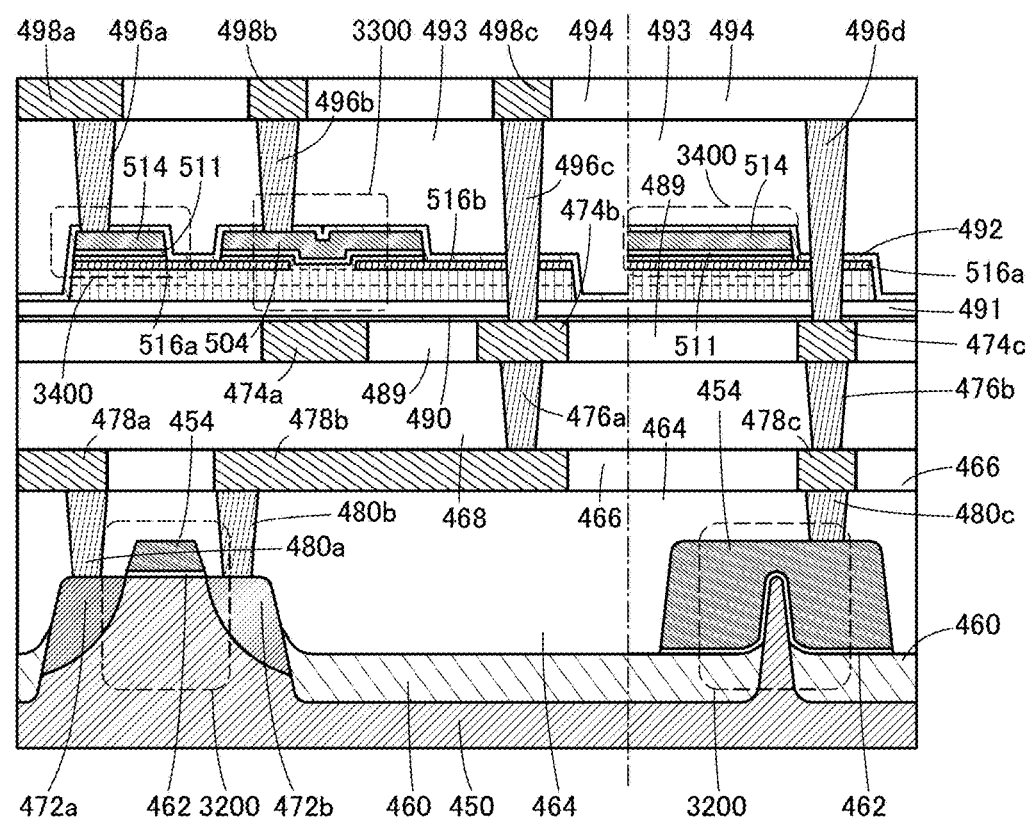
FIG. 29 is a cross-sectional view illustrating a semiconductor device of one embodiment of the present invention.

A semiconductor device in FIG. 29 is the same as the semiconductor device in FIG. 28 except for the structure of the transistor 3200. Therefore, the description of the semiconductor device in FIG. 28 is referred to for the semiconductor device in FIG. 29. Specifically, in the semiconductor device in FIG. 29, the transistor 3200 is a Fin-type transistor. For the Fin-type transistor 3200, the description of the transistor 2200 in FIG. 25 is referred to. Note that although the transistor 2200 is illustrated as a p-channel transistor in FIG. 25, the transistor 3200 may be an n-channel transistor.

Figure 30:
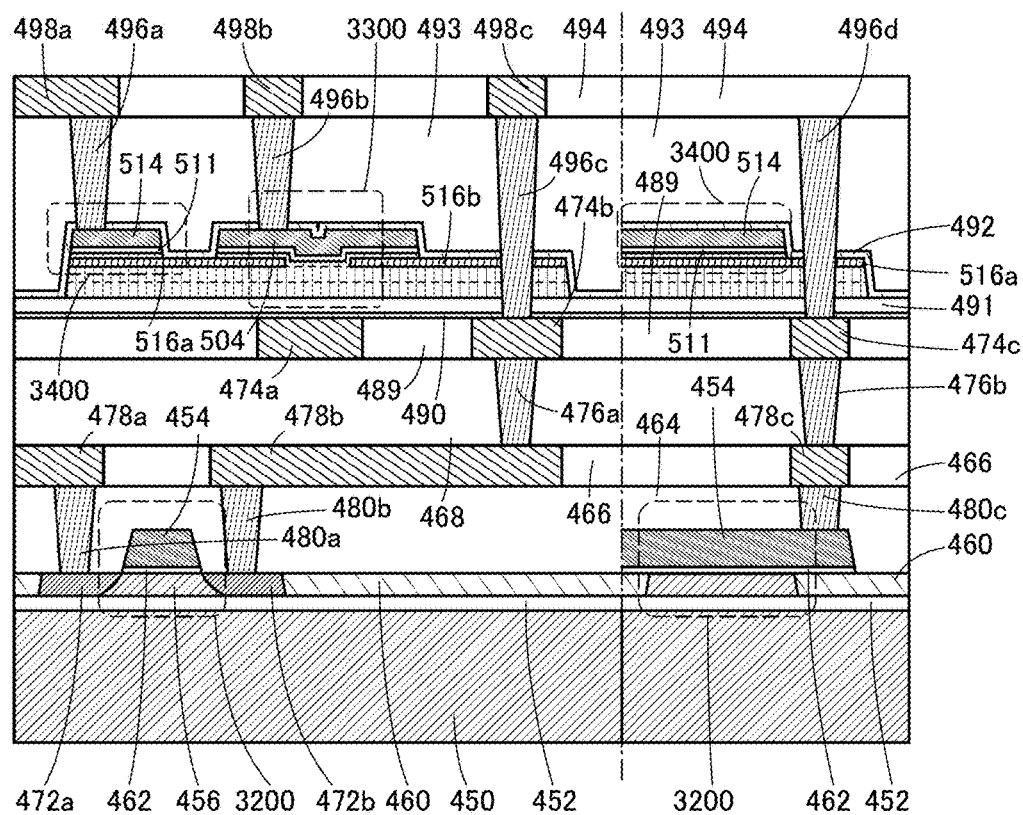
FIG. 30 is a cross-sectional view illustrating a semiconductor device of one embodiment of the present invention.

A semiconductor device in FIG. 30 is the same as the semiconductor device in FIG. 28 except for the structure of the transistor 3200. Therefore, the description of the semiconductor device in FIG. 28 is referred to for the semiconductor device in FIG. 30. Specifically, in the semiconductor device in FIG. 30, the transistor 3200 is provided in the semiconductor substrate 450 that is an SOI substrate. For the transistor 3200, which is provided in the semiconductor substrate 450 (SOI substrate), the description of the transistor 2200 in FIG. 26 is referred to. Note that although the transistor 2200 is illustrated as a p-channel transistor in FIG. 26, the transistor 3200 may be an n-channel transistor.

<Memory Device 2>

The semiconductor device in FIG. 27B is different from the semiconductor device in FIG. 27A in that the transistor 3200 is not provided. Also in this case, data can be written and retained in a manner similar to that of the semiconductor device in FIG. 27A.

Reading of data in the semiconductor device in FIG. 27B is described. When the transistor 3300 is brought into an on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + CV)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($= (C_B \times V_{B0} + CV_1)/(C_B + C)$) is higher than the potential of the third wiring 3003 in the case of retaining the potential $V_0$ ($= (C_B \times V_{B0} + CV_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, a high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 27A is described with reference to a circuit diagram in FIG. 31.

Figure 31:
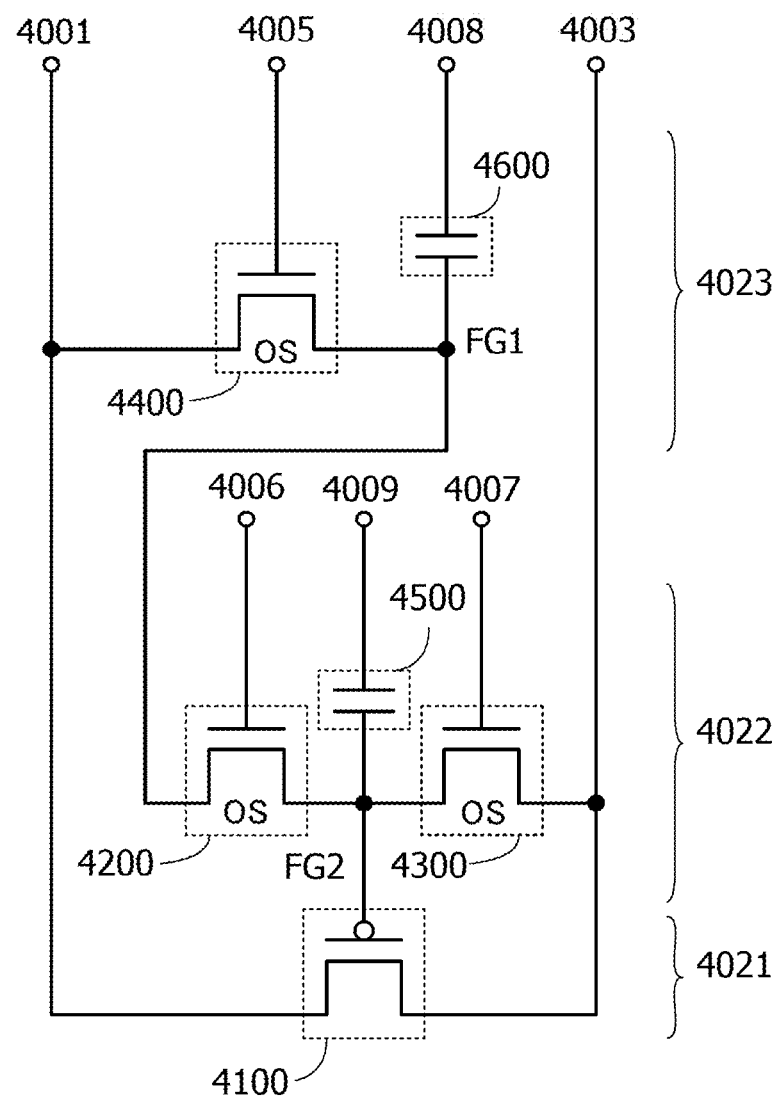
FIG. 31 is a circuit diagram illustrating a semiconductor device of one embodiment of the present invention.

The semiconductor device illustrated in FIG. 31 includes a transistor 4100, a transistor 4200, a transistor 4300, a transistor 4400, a capacitor 4500, and a capacitor 4600. Here, a transistor similar to the transistor 3200 can be used as the transistor 4100, and transistors similar to the transistor 3300 can be used as the transistors 4200, 4300, and 4400. Although not illustrated in FIG. 31, a plurality of semiconductor devices in FIG. 31 are provided in a matrix. The semiconductor devices in FIG. 31 can control writing and reading of a data voltage in accordance with a signal or a potential supplied to a wiring 4001, a wiring 4003, a wiring 4005, a wiring 4006, a wiring 4007, a wiring 4008, and a wiring 4009.

One of a source and a drain of the transistor 4100 is connected to the wiring 4003. The other of the source and the drain of the transistor 4100 is connected to the wiring 4001. Although the transistor 4100 is a p-channel transistor in FIG. 31, the transistor 4100 may be an n-channel transistor.

The semiconductor device in FIG. 31 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be formed to overlap with a transistor including silicon, for example. Although the transistors 4200, 4300, and 4400 are n-channel transistors in FIG. 31, the transistors 4200, 4300, and 4400 may be p-channel transistors.

The transistors 4200 and 4300 and the transistor 4400 are preferably provided in different layers even when the transistors 4200, 4300, and 4400 are transistors including oxide semiconductors. In other words, the semiconductor device in FIG. 31 preferably includes, as illustrated in FIG. 31, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 31 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between the gate and the source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 31, after data voltages are written to the plurality of data retention portions, the wiring 4009 is set at the high level, so that the potentials of the nodes FG1 and FG2 are increased. Then, the transistors are turned off to stop movement of electric charges; thus, the written data voltages are retained.

By the above-described writing operation of the data voltage to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multilevel data. Therefore, in the case where the data retention portions each retain 4-bit data, 16-value "$V_{D1}-V_{th}$" and 16-value "$V_{D2}-V_{th}$" can be obtained.

Next, operation of reading data from the semiconductor device illustrated in FIG. 31 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$." The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$," by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$." In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$." Thus, the capacitance of the capacitor 4600 is preferably larger than the capacitance of the capacitor 4500. Alternatively, the potential written to the node FG1, "$V_{D1}-V_{th}$," is preferably larger than the potential corresponding to the same data, "$V_{D2}-V_{th}$." By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$." The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$," by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$." In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 31, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled to be read. As a result, the storage capacity per memory cell can be improved and read data can be close to accurate data; thus, the data reliability becomes excellent.

Figure 32:
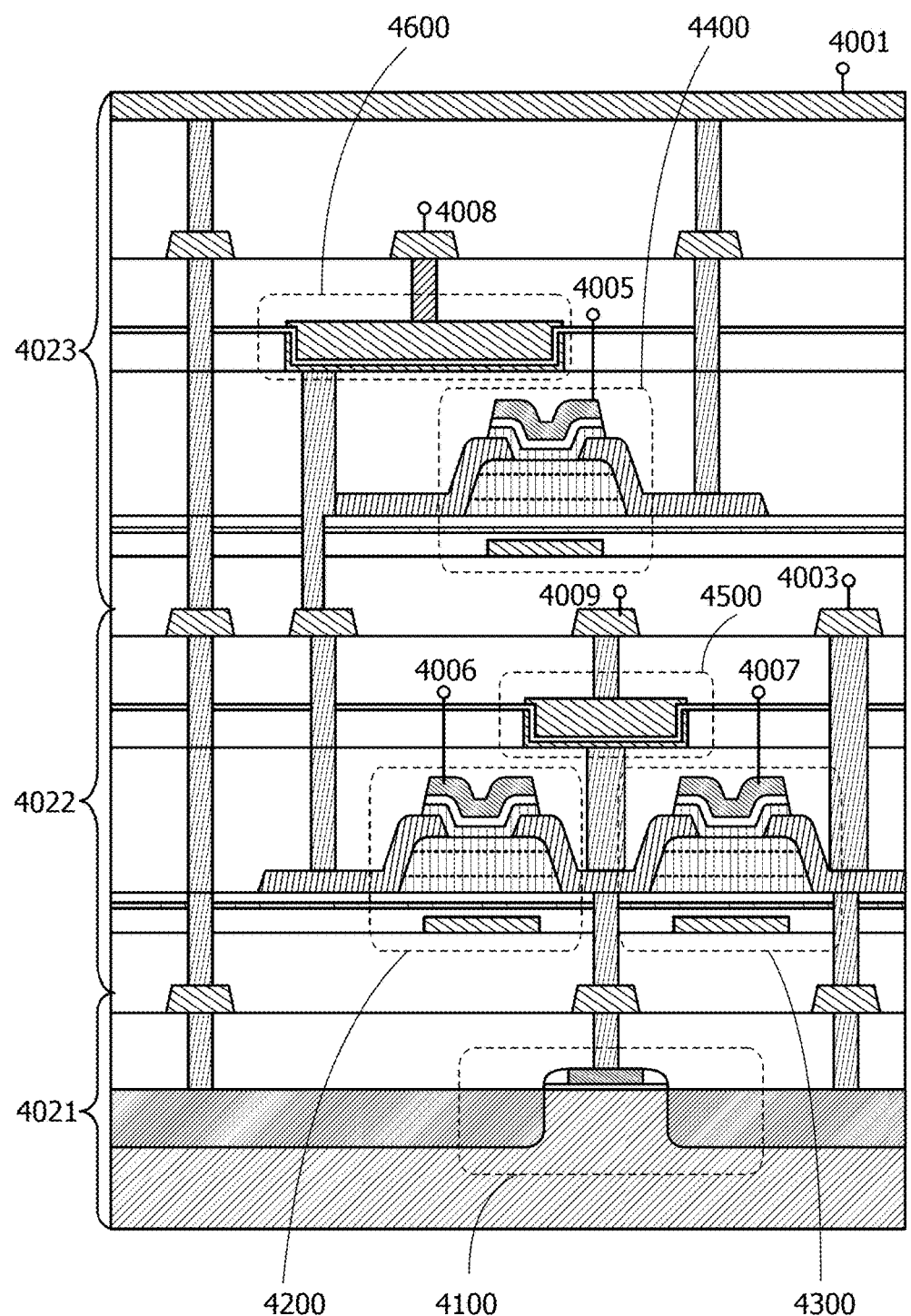
FIG. 32 is a cross-sectional view illustrating a semiconductor device of one embodiment of the present invention.

FIG. 32 is a cross-sectional view of a semiconductor device that corresponds to FIG. 31. The semiconductor device illustrated in FIG. 32 includes the transistors 4100, 4200, 4300, and 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023.

Here, the description of the transistor 3300 can be referred to for the transistors 4200, 4300, and 4400, and the description of the transistor 3200 can be referred to for the transistor 4100. The description made with reference to FIG. 28 can be appropriately referred to for other wirings, other insulators, and the like.

Note that the capacitors 4500 and 4600 are formed by including the conductive layers each having a trench-like shape, while the conductive layer of the capacitor 3400 in the semiconductor device in FIG. 28 is parallel to the substrate. With this structure, a larger capacity can be obtained without increasing the occupation area.

<Memory Device 4>

The semiconductor device in FIG. 27C is different from the semiconductor device in FIG. 27A in that the transistor 3500 and a sixth wiring 3006 are included. Also in this case, data can be written and retained in a manner similar to that of the semiconductor device in FIG. 27A. A transistor similar to the transistor 3200 described above can be used as the transistor 3500.

The sixth wiring 3006 is electrically connected to a gate of the transistor 3500, one of a source and a drain of the transistor 3500 is electrically connected to the drain of the transistor 3200, and the other of the source and the drain of the transistor 3500 is electrically connected to the third wiring 3003.

Figure 33:
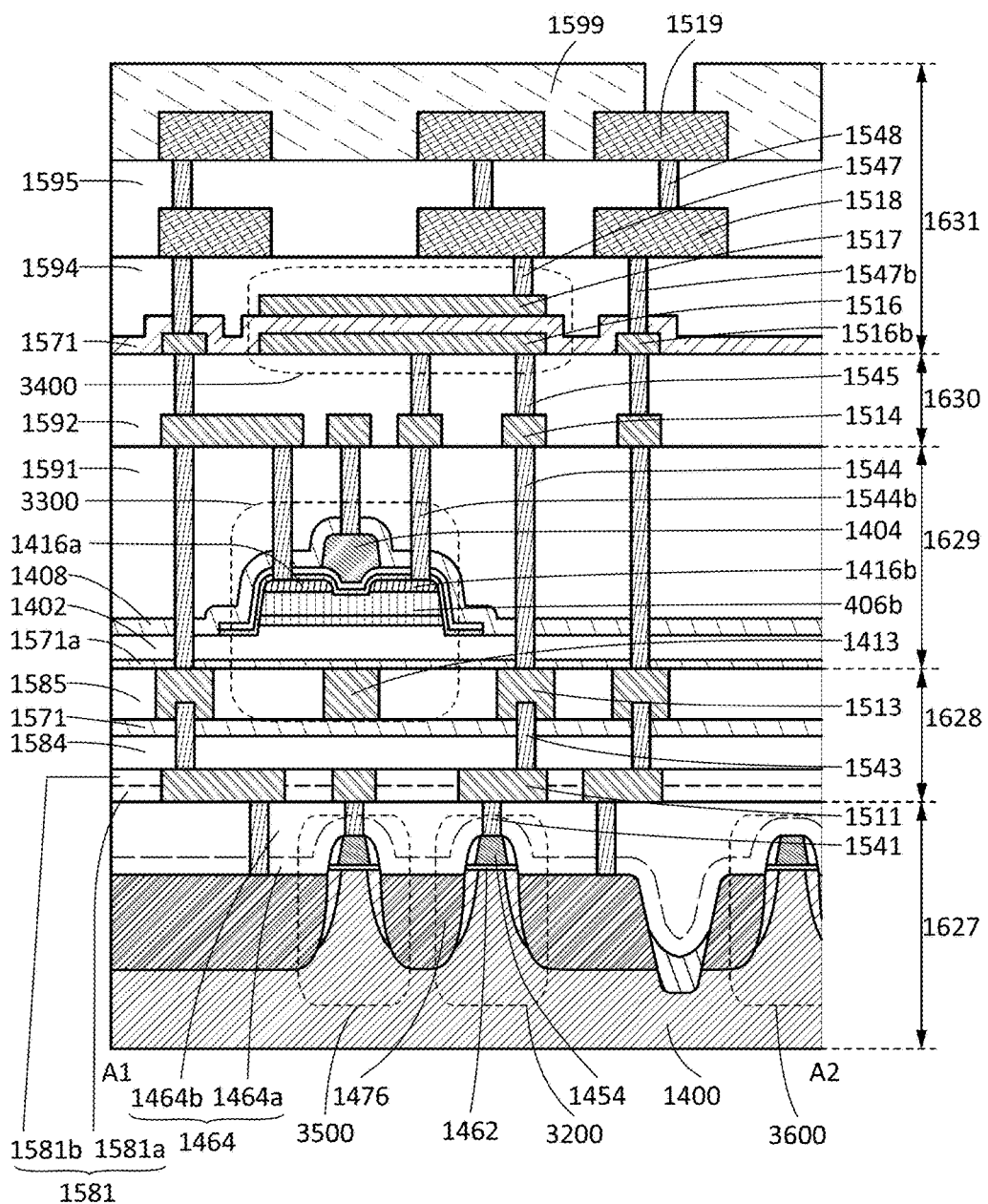
FIG. 33 is a cross-sectional view illustrating a semiconductor device of one embodiment of the present invention.
Figure 34:
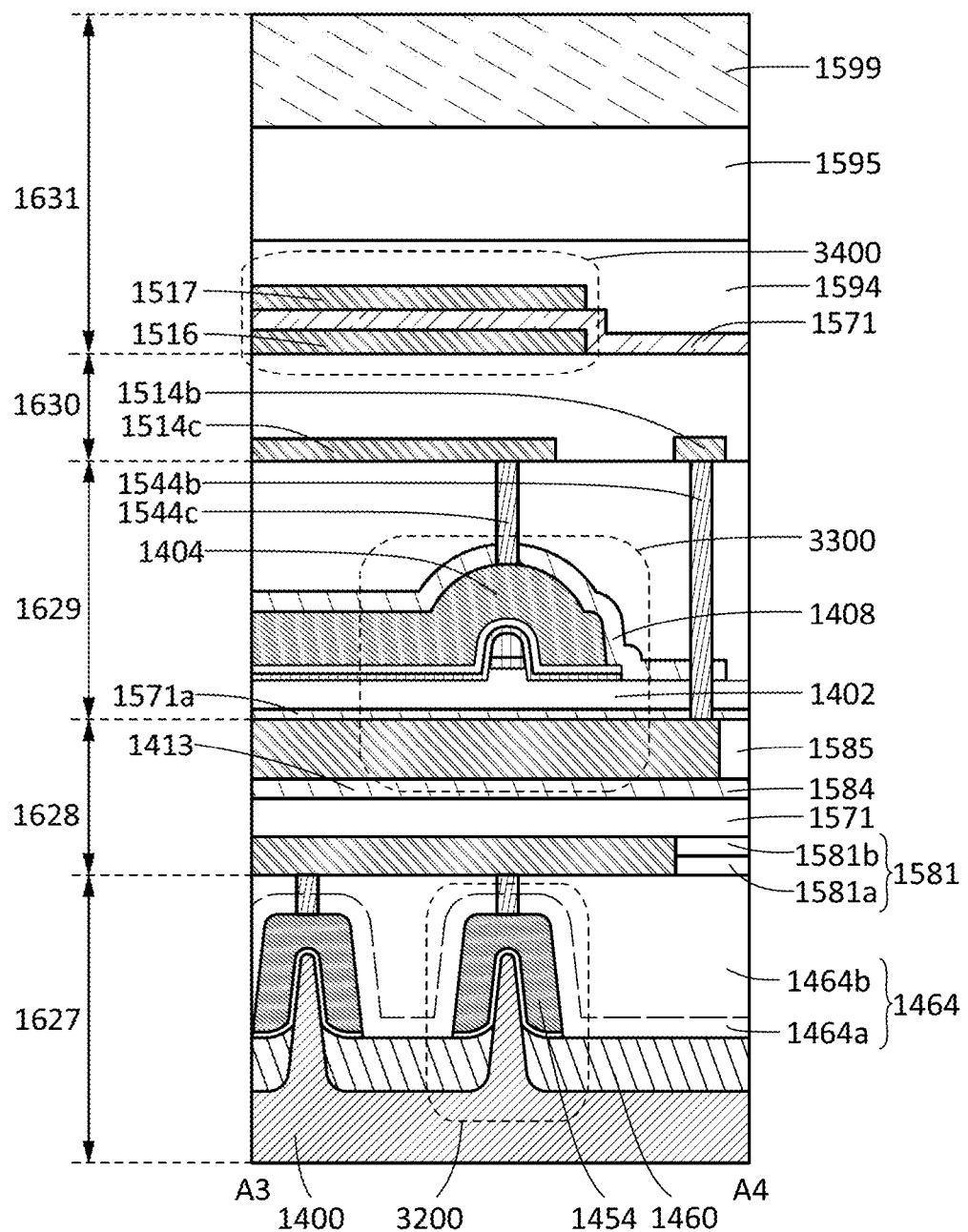
FIG. 34 is a cross-sectional view illustrating a semiconductor device of one embodiment of the present invention.

FIG. 33 illustrates an example of a cross-sectional view of the semiconductor device illustrated in FIG. 27C. FIG. 34 illustrates an example of a cross section that is substantially perpendicular to a A1-A2 direction in FIG. 33. The semiconductor device illustrated in FIG. 27C, FIG. 33, and FIG. 34 includes five layers 1627 to 1631. The layer 1627 includes the transistor 3200, the transistor 3500, and a transistor 3600. The layer 1628 and the layer 1629 include the transistor 3300.

The layer 1627 includes a substrate 1400, the transistors 3200, 3500, and 3600 over the substrate 1400, an insulator 1464 over the transistor 3200 and the like, and plugs such as a plug 1541. The plug 1541 or the like is connected to, for example, a gate electrode, a source electrode, a drain electrode, or the like of the transistor 3200 or the like. The plug 1541 is preferably formed to be embedded in the insulator 1464.

The description of the transistor 2200 can be referred to for the transistors 3200, 3500, and 3600.

The insulator 1464 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 1464 can be formed by a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. It is preferable to use a thermal CVD method, an MOCVD method, or an ALD method in order to reduce plasma damage.

Alternatively, the insulator 1464 can be formed using silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method.

The insulator 1464 may have a single-layer structure or a stacked-layer structure of a plurality of materials.

In FIG. 33, the insulator 1464 is formed of two layers, i.e., an insulator 1464a and an insulator 1464b over the insulator 1464a.

The insulator 1464a is preferably formed over a region 1476 of the transistor 3200, a conductor 1454 functioning as a gate of the transistor 3200 and the like, and the like with high adhesion or high coverage.

As an example of the insulator 1464a, silicon nitride formed by a CVD method can be used. Here, the insulator 1464a preferably contains hydrogen in some cases. When the insulator 1464a contains hydrogen, a defect or the like in the substrate 1400 is reduced and the characteristics of the transistor 3200 and the like are improved in some cases. For example, in the case where the substrate 1400 is formed using a material containing silicon, a defect such as a dangling bond in the silicon can be terminated by hydrogen.

The parasitic capacitance formed between a conductor under the insulator 1464a, such as the conductor 1454, and a conductor over the insulator 1464b, such as a conductor 1511, is preferably small. Thus, the insulator 1464b preferably has a low dielectric constant. The dielectric constant of the insulator 1464b is preferably lower than that of an insulator 1462 that functions as a gate insulator of the transistor 3200 and the like. The dielectric constant of the insulator 1464b is preferably lower than that of the insulator 1464a. For example, the relative dielectric constant of the insulator 1464b is preferably lower than 4, more preferably lower than 3. For example, the relative dielectric constant of the insulator 1464b is preferably 0.7 times or less that of the insulator 1464a, more preferably 0.6 times or less that of the insulator 1464a.

Here, for example, silicon nitride and USG can be used as the insulator 1464a and the insulator 1464b, respectively.

When the insulator 1464a, an insulator 1581a, and the like are formed using a material with low copper permeability, such as silicon nitride or silicon carbonitride, the diffusion of copper into a layer under the insulator 1464a or the like and a layer over the insulator 1581a or the like can be suppressed when copper is included in the conductor 1511 or the like.

An impurity such as copper released from a top surface of the conductor 1511 might be diffused into a layer over the conductor 1511 through an insulator 1584 or the like, for example. Thus, the insulator 1584 over the conductor 1511b is preferably formed using a material through which an impurity such as copper is hardly allowed to pass. For example, the insulator 1584 may have a stacked structure of the insulator 1581a and an insulator 1581b.

The layer 1628 includes an insulator 1581, the insulator 1584 over the insulator 1581, an insulator 1571 over the insulator 1584, an insulator 1585 over the insulator 1571, the conductor 1511 and the like over the insulator 1464, a plug 1543 and the like connected to the conductor 1511 and the like, and a conductor 1513 over the insulator 1571. The conductor 1511 is preferably formed to fill an opening in the insulator 1581. The plug 1543 and the like are preferably formed to fill openings in the insulator 1584 and the insulator 1571. The conductor 1513 is preferably formed to fill an opening in the insulator 1585.

The layer 1628 may include a conductor 1413. The conductor 1413 is preferably formed to fill an opening in the insulator 1585.

The insulator 1584 and the insulator 1585 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 1584 and the insulator 1585 can be formed by a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. It is preferable to use a thermal CVD method, an MOCVD method, or an ALD method in order to reduce plasma damage.

Alternatively, the insulator 1584 and the insulator 1585 can be formed using silicon carbide, silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method.

Each of the insulators 1584 and 1585 may have a single-layer structure or a stacked-layer structure of a plurality of materials.

The insulator 1581 may have a stacked-layer structure of a plurality of layers. For example, the insulator 1581 has a two-layer structure of the insulator 1581a and the insulator 1581b over the insulator 1581a as shown in FIG. 33.

The plug 1543 has a portion projecting above the insulator 1571.

A conductive material such as a metal material, an alloy material, or a metal oxide material can be used as a material of the conductor 1511, the conductor 1513, the conductor 1413, the plug 1543, and the like. For example, a single-layer structure or a stacked-layer structure using any of metals such as aluminum, titanium, chromium, nickel, copper, yttrium, zirconium, niobium, molybdenum, silver, tantalum, and tungsten, or an alloy containing any of these metals as a main component can be used. Alternatively, a metal nitride such as tungsten nitride, molybdenum nitride, or titanium nitride can be used.

The conductors such as the conductor 1511 and the conductor 1513 preferably function as wirings in the semiconductor device illustrated in FIG. 27C. Therefore, these conductors are also referred to as wirings or wiring layers in some cases. These conductors are preferably connected to each other via plugs such as the plug 1543.

For the insulator 1581, the description of the insulator 1464 is referred to. The insulator 1581 may have a single-layer structure or a stacked-layer structure of a plurality of materials. In the example shown in FIG. 33, the insulator 1581 has a two-layer structure of the insulator 1581a and the insulator 1581b over the insulator 1581a. For a material and a formation method that can be used for the insulator 1581a and the insulator 1581b, the description of the material and the formation method that can be used for the insulator 1464a and the insulator 1464b can be referred to.

As an example of the insulator 1581a, silicon nitride formed by a CVD method can be used. In a semiconductor element included in the semiconductor device illustrated in FIG. 27C, such as the transistor 3300, hydrogen is diffused into the semiconductor element, so that the characteristics of the semiconductor element are degraded in some cases. In view of this, a film that releases a small amount of hydrogen is preferably used as the insulator 1581a. The released amount of hydrogen can be measured by TDS, for example. In TDS, the amount of hydrogen released from the insulator 1581a which is converted into hydrogen atoms is, for example, less than or equal to $5\times10^{20}$ atoms/cm$^3$, preferably less than or equal to $2\times10^{20}$ atoms/cm$^3$, more preferably less than or equal to $1\times10^{20}$ atoms/cm$^3$ in the range of 50° C. to 500° C. The amount of hydrogen released from the insulator 1581a per area of the insulating film, which is converted into hydrogen atoms, is less than or equal to $5\times10^{15}$ atoms/cm$^2$, preferably less than or equal to $2\times10^{15}$ atoms/cm$^2$, more preferably less than or equal to $1\times10^{15}$ atoms/cm$^2$, for example.

Silicon nitride from which a small number of hydrogen atoms are released may be used for not only the insulator 1581a but also an insulator in a layer over the insulator 1581a illustrated in FIG. 33. Instead of the silicon nitride, an insulator similar to the insulator 104 described in the above embodiment in which hydrogen and water are reduced may be used.

The dielectric constant of the insulator 1581b is preferably lower than that of the insulator 1581a. For example, the relative dielectric constant of the insulator 1581b is preferably lower than 4, more preferably lower than 3. For example, the relative dielectric constant of the insulator 1581b is preferably 0.7 times or less that of the insulator 1581a, more preferably 0.6 times or less that of the insulator 1581a.

The insulator 1571 is preferably formed using an insulating material through which an impurity hardly passes. Preferably, the insulator 1571 has low oxygen permeability, for example. Preferably, the insulator 1571 has low hydrogen permeability, for example. Preferably, the insulator 1571 has low water permeability, for example.

The insulator 1571 can be formed using a single-layer structure or a stacked-layer structure using, for example, aluminum oxide, hafnium oxide, tantalum oxide, zirconium oxide, lead zirconate titanate (PZT), strontium titanate (SrTiO$_3$), (Ba,Sr)TiO$_3$ (BST), silicon nitride, or the like. Alternatively, aluminum oxide, bismuth oxide, germanium oxide, niobium oxide, silicon oxide, titanium oxide, tungsten oxide, yttrium oxide, zirconium oxide, or gallium oxide may be added to the insulator, for example. Alternatively, the insulator may be subjected to nitriding treatment to be oxynitride. A layer of silicon oxide, silicon oxynitride, or silicon nitride may be stacked over the insulator. Aluminum oxide is particularly preferable because of its excellent barrier property against water and hydrogen.

The insulator 1571 is formed using, for example, silicon carbide, silicon carbonitride, or silicon oxycarbide.

The insulator 1571 may be a stack including a layer of a material through which water and hydrogen are hardly allowed to pass and a layer containing an insulating material. The insulator 1571 may be, for example, a stack of a layer containing silicon oxide or silicon oxynitride, a layer containing a metal oxide, and the like.

The insulator 1571 included in the semiconductor device illustrated in FIG. 27C can suppress the diffusion of an element included in the conductor 1513, the conductor 1413, and the like into the insulator 1571 and layers under the insulator 1571 (e.g., the insulator 1584, the insulator 1581, and the layer 1627), for example.

In the case where the dielectric constant of the insulator 1571 is higher than that of the insulator 1584, the thickness of the insulator 1571 is preferably smaller than that of the insulator 1584. Here, the relative dielectric constant of the insulator 1584 is 0.7 times or less that of the insulator 1571, more preferably 0.6 times or less that of the insulator 1571, for example. The thickness of the insulator 1571 is preferably greater than or equal to 5 nm and less than or equal to 200 nm, more preferably greater than or equal to 5 nm and less than or equal to 60 nm, and the thickness of the insulator 1584 is preferably greater than or equal to 30 nm and less than or equal to 800 nm, more preferably greater than or equal to 50 nm and less than or equal to 500 nm, for example. The thickness of the insulator 1571 is preferably less than or equal to one-third of the thickness of the insulator 1584, for example.

FIG. 33 is a cross-sectional view showing some of components of the semiconductor device illustrated in FIG. 27C. The insulator 1464b, the plug 1541 formed to be embedded in the insulator 1464b, the insulator 1581 over the insulator 1464b, the conductor 1511 over the plug 1541 and the insulator 1464b, the insulator 1584 over the insulator 1581, the insulator 1571 over the insulator 1584, the plug 1543 formed to be embedded in the insulator 1584 and the insulator 1571 and positioned over the conductor 1511, the insulator 1585 over the insulator 1571, and the conductor 1513 over the plug 1543 and the insulator 1571 are shown in FIG. 33. In the cross section shown in FIG. 33, a level of the highest region in a top surface of the plug 1543 is preferably higher than a level of the highest region in a top surface of the insulator 1571.

In some cases, a part of the insulator 1571 is removed when an opening for forming the conductor 1513 is formed.

The insulator 1464*a* and the insulator 1581*a* are formed using, for example, silicon nitride and silicon carbonitride, respectively. Here, a material with low hydrogen permeability is used as at least one of an insulator 1571*a* and the insulator 1571. When titanium nitride is used as the conductor 1513*b*, for example, diffusion of hydrogen contained in silicon nitride and silicon carbonitride into the transistor 3300 can be suppressed.

The layer 1629 includes the transistor 3300 and plugs such as a plug 1544 and a plug 1544*b*. The plugs such as the plug 1544 and the plug 1544*b* are connected to the conductor 1513 in the layer 1628 and a gate electrode, a source electrode, and a drain electrode of the transistor 3300. The description of the transistor 20, the transistor 2100, and the like can be referred to for the structure of the transistor 3300.

The transistor 3300 includes the conductor 1413, an insulator 1571*a*, an insulator 1402, a conductor 1416*a*, a conductor 1416*b*, a conductor 1404, an insulator 1408, and an insulator 591. The descriptions of the components of the transistor 20 can be referred to for the components of the transistor 3300. For the conductor 1413, the insulator 1571*a*, the insulator 1402, the conductor 1416*a*, the conductor 1416*b*, the conductor 1404, the insulator 1408, and the insulator 591, the description of the conductor 102, the insulator 103, the insulator 104, the conductor 108*a*, the conductor 108*b*, the conductor 114, the insulator 116, and the insulator 118, respectively, can be referred to. Although an insulator that corresponds to the insulator 105 in the transistor 20 is not illustrated in FIG. 33, the insulator may be provided. For example, an insulator corresponding to the insulator 105 may be provided between the insulator 1585 and the insulator 1571*a*.

As in the above embodiment, the amounts of water and hydrogen contained in the insulator in a stack of insulators (in this embodiment, a stack of the insulator 1585, the insulator 1571*a*, and the insulator 1402) provided between the insulator 1571 and the insulator corresponding to the insulator 106*a* of the transistor 20 are preferably small. When the insulator 1571 has a function of blocking water and hydrogen as described above, water and hydrogen supplied to an oxide to be the insulator 106*a* and the semiconductor 106*b* of the transistor 20 while the oxide is being deposited are those contained in the insulator 1585, the insulator 1571*a*, and the insulator 1402. Accordingly, when the amounts of water and hydrogen contained in the stack of the insulator 1585, the insulator 1571*a*, and the insulator 1402 (in particular, the amounts of water and hydrogen contained in the insulator 1402) are sufficiently small at the time of deposition for the oxide, the amounts of water and hydrogen supplied to the oxide can be small.

The conductor 1416*a* and the conductor 1416*b* preferably include a material through which an element included in the plug 1544*b* formed in contact with the top surfaces of the conductor 1416*a* and the conductor 1416*b* is unlikely to pass.

Each of the conductor 1416*a* and the conductor 1416*b* may be formed of stacked films. For example, each of the conductor 1416*a* and the conductor 1416*b* is formed of stacked layers of a first layer and a second layer. Here, the first layer is formed over the oxide layer 406*b*, and the second layer is formed over the first layer. For example, tungsten and tantalum nitride are used as the first layer and the second layer, respectively. Here, copper is used as the plug 1544*b* or the like, for example. Copper is preferably used as a conductor such as a plug or a wiring because of its low resistance. On the other hand, copper is easily diffused; the diffusion of copper into a semiconductor layer, a gate insulating film, or the like of a transistor degrades the transistor characteristics in some cases. When tantalum nitride is included in the conductor 1416*a* and the conductor 1416*b*, the diffusion of copper included in the plug 1544*b* or the like into the oxide semiconductor layer 406*b* can be suppressed in some cases.

The semiconductor device illustrated in FIG. 27C of one embodiment of the present invention preferably has a structure in which, in the case where an element and a compound that cause degradation of characteristics of a semiconductor element are included in the plug, the wiring, or the like, the diffusion of the element and the compound into the semiconductor element is suppressed.

The layer 1630 includes an insulator 1592, conductors such as a conductor 1514, and plugs such as a plug 1545. The plug 1545 and the like are connected to the conductors such as the conductor 1514.

The layer 1631 includes a capacitor 3400. The capacitor 3400 includes a conductor 1516, a conductor 1517, and an insulator 1571. The insulator 1571 includes a region positioned between the conductor 1516 and the conductor 1517. The layer 1631 preferably includes an insulator 1594 and a plug 1547 over the conductor 1517. The plug 1547 is preferably formed to fill an opening in the insulator 1594. The layer 1631 preferably includes a conductor 1516*b* connected to the plug included in the layer 1630 and a plug 1547*b* over the conductor 1516*b*.

The layer 1631 may include a wiring layer connected to the plug 1547 and the plug 1547*b*. In the example shown in FIG. 33, the wiring layer includes a conductor 1518 and the like connected to the plug 1547 and the plug 1547*b*, a plug 1548 over the conductor 1518, an insulator 1595, a conductor 1519 over the plug 1548, and an insulator 1599 over the conductor 1519. The plug 1548 is preferably formed to fill an opening in the insulator 1595. The insulator 1599 includes an opening over the conductor 1519.

The structure described in this embodiment can be used in appropriate combination with any of the other structures described in the other embodiments.

Embodiment 5

In this embodiment, an example of an imaging device including the transistor or the like of one embodiment of the present invention is described.
<Imaging Device>

An imaging device of one embodiment of the present invention is described below.

Figure 35A:
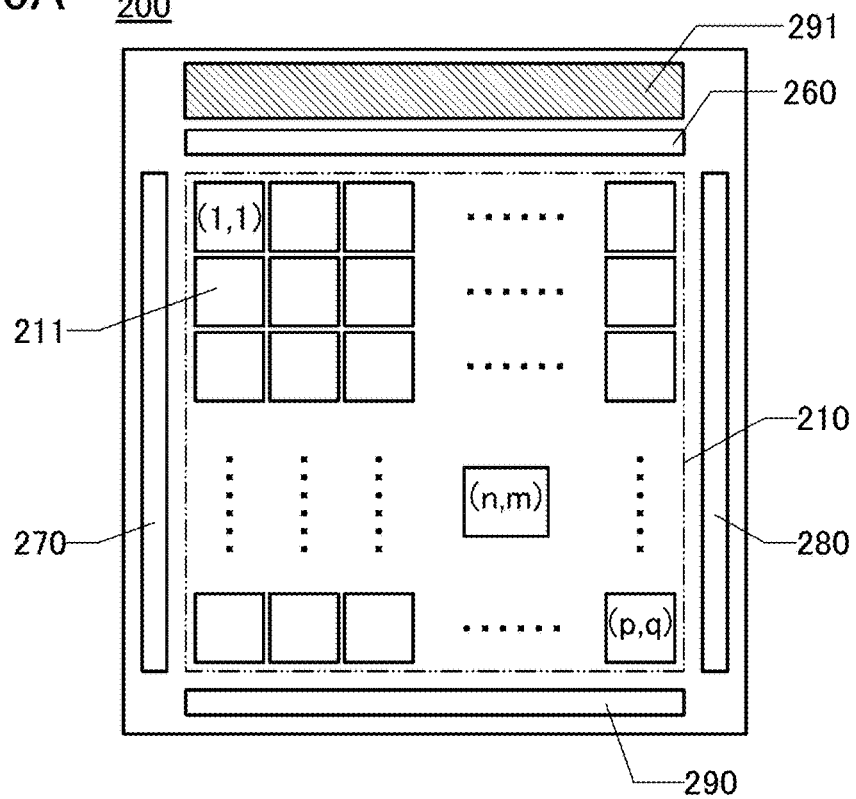
FIGS. 35A and 35B are top views each illustrating a semiconductor device of one embodiment of the present invention.

FIG. 35A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 35B:
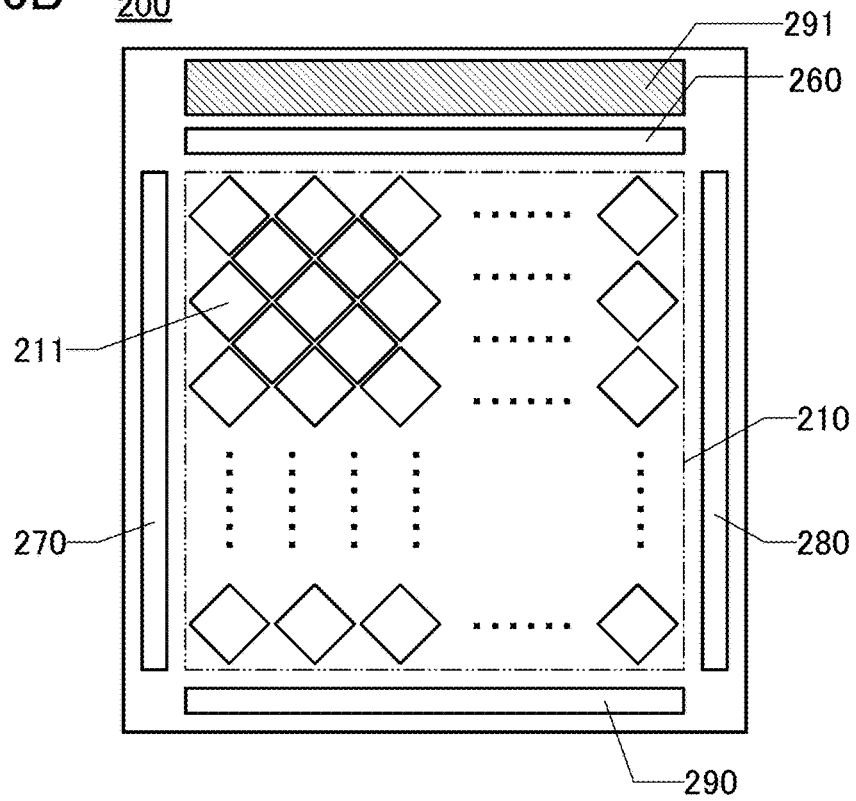

As illustrated in FIG. 35B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter (color filter) which transmits light in a specific wavelength range, whereby data for achieving color image display can be obtained.

Figure 36A:
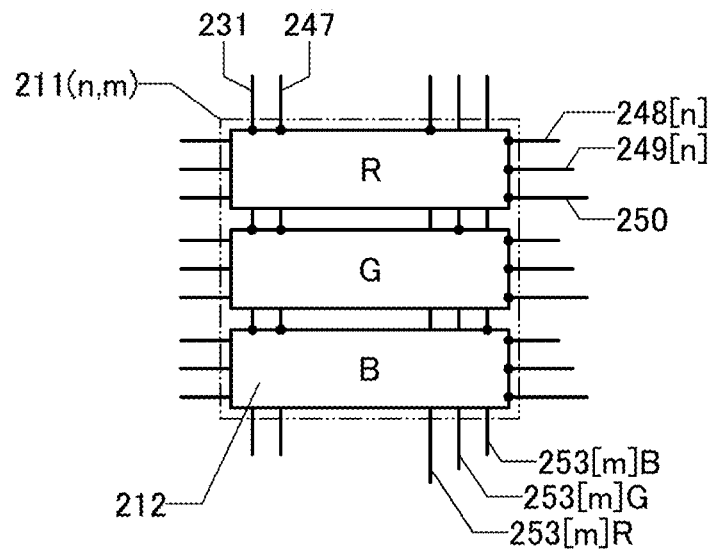
FIGS. 36A and 36B are block diagrams each illustrating a semiconductor device of one embodiment of the present invention.

FIG. 36A is a top view showing an example of the pixel 211 with which a color image is obtained. The pixel 211 illustrated in FIG. 36A includes a subpixel 212 provided with a color filter that transmits light in a red (R) wavelength range (also referred to as a subpixel 212R), a subpixel 212 provided with a color filter that transmits light in a green (G) wavelength range (also referred to as a subpixel 212G), and a subpixel 212 provided with a color filter that transmits light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 36A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 36B:
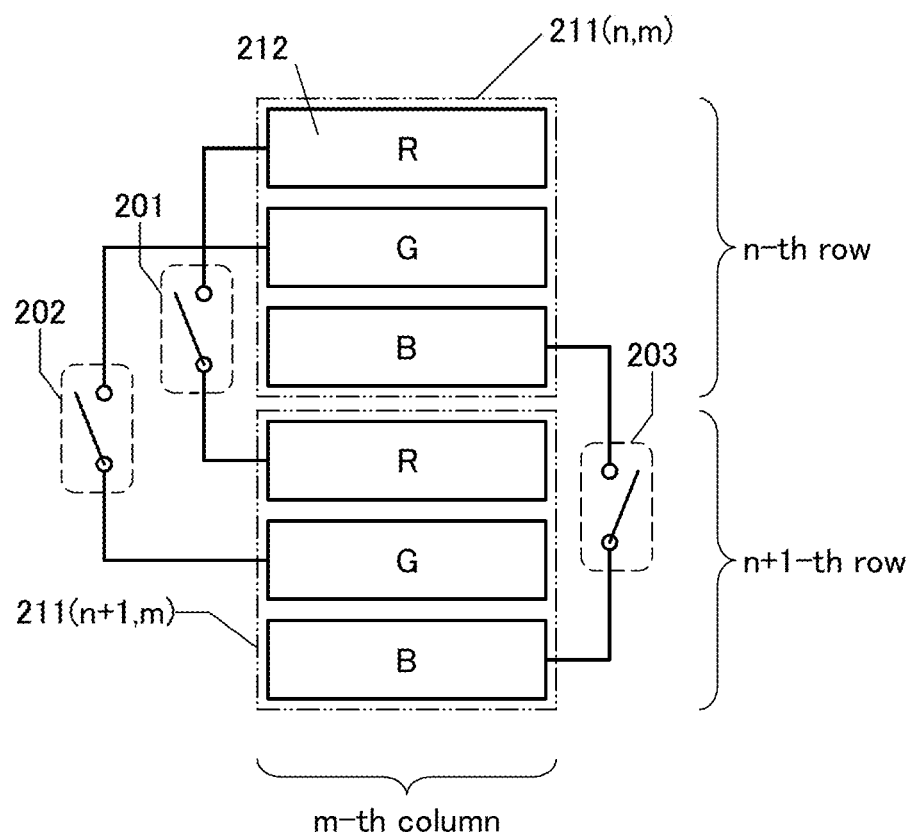

The imaging device 200 has a structure in which the subpixel 212 is electrically connected to the subpixel 212 in an adjacent pixel 211 which is provided with a color filter transmitting light in the same wavelength range as the subpixel 212, via a switch. FIG. 36B shows a connection example of the subpixels 212: the subpixel 212 in the pixel 211 arranged in the n-th (n is an integer greater than or equal to 1 and less than or equal to p) row and the m-th (m is an integer greater than or equal to 1 and less than or equal to q) column and the subpixel 212 in the adjacent pixel 211 arranged in an (n+1)-th row and the m-th column. In FIG. 36B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 36A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 37A and 37B. With the lens 255, the photoelectric conversion element can receive incident light efficiently. Specifically, as illustrated in FIG. 37A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed lines, however, part of the light 256 indicated by arrows might be blocked by some wirings 257. Thus, a preferable structure is such that the lens 255 and the filter 254 are provided on the photoelectric conversion element 220 side as illustrated in FIG. 37B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 37A:
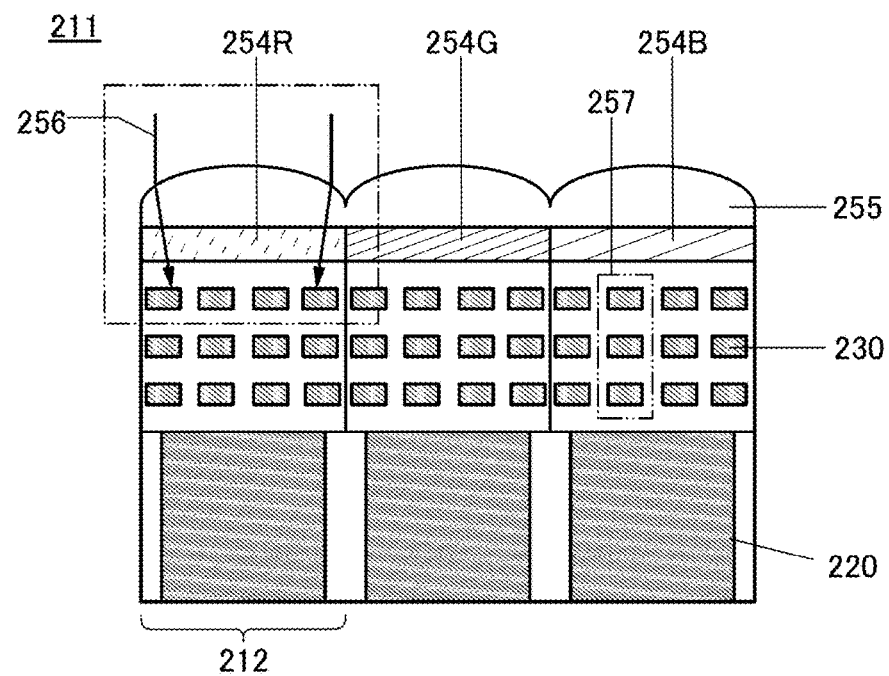
FIGS. 37A and 37B are cross-sectional views each illustrating a semiconductor device of one embodiment of the present invention.
Figure 37B:
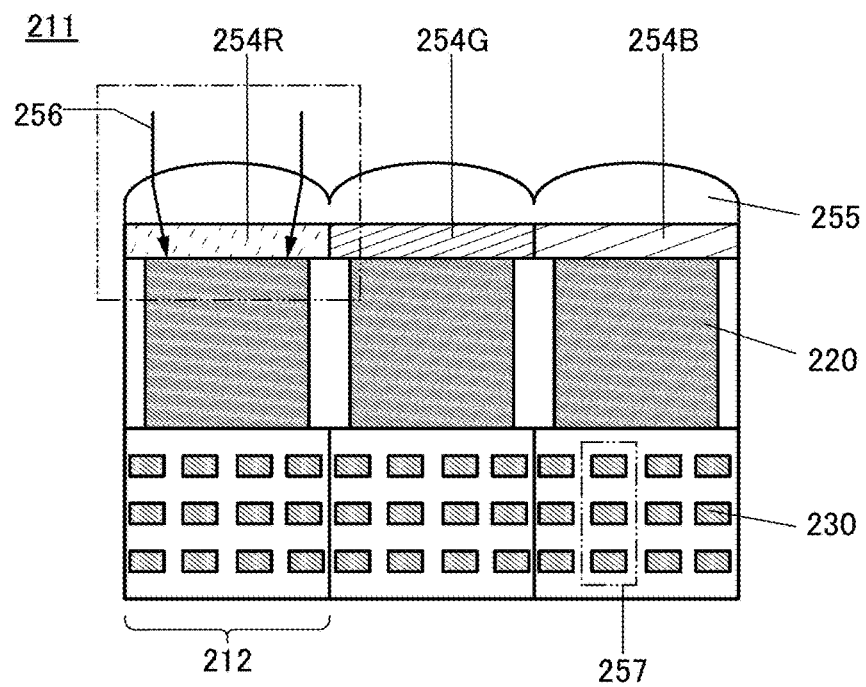

As the photoelectric conversion element 220 illustrated in FIGS. 37A and 37B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 36A and 36B.

<Configuration Example 2 of Pixel>

An example of a pixel including a transistor using silicon and a transistor using an oxide semiconductor is described below.

Figure 38A:
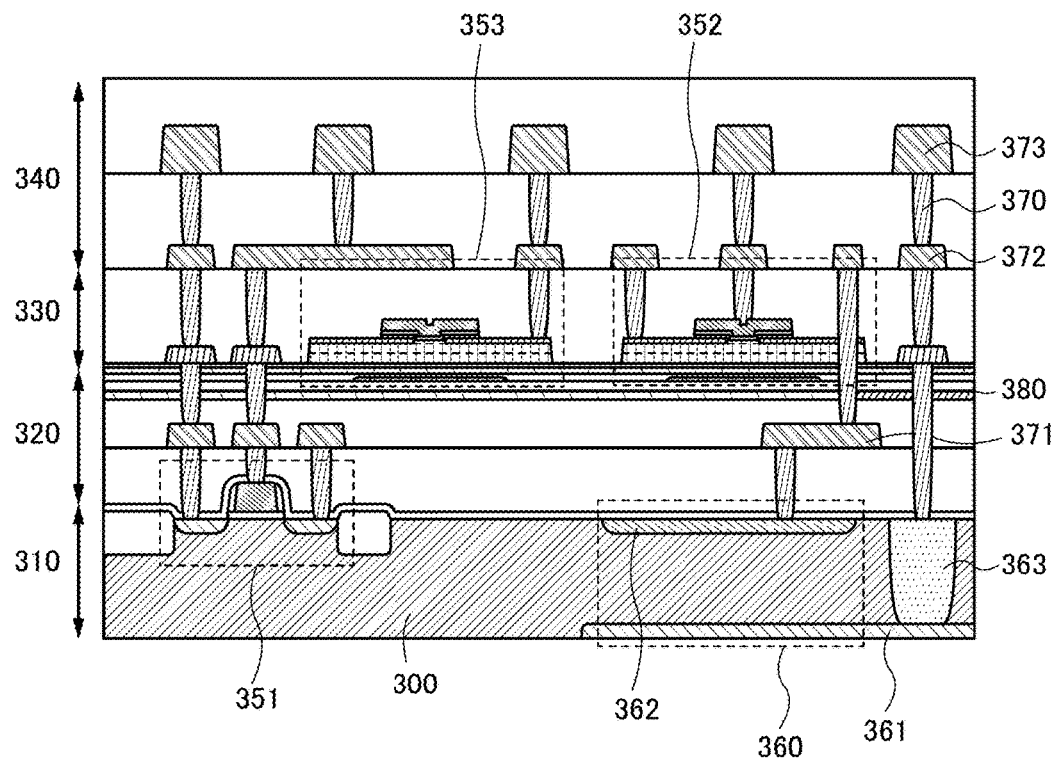
FIGS. 38A and 38B are each a cross-sectional view illustrating a semiconductor device according to one embodiment of the present invention.
Figure 38B:
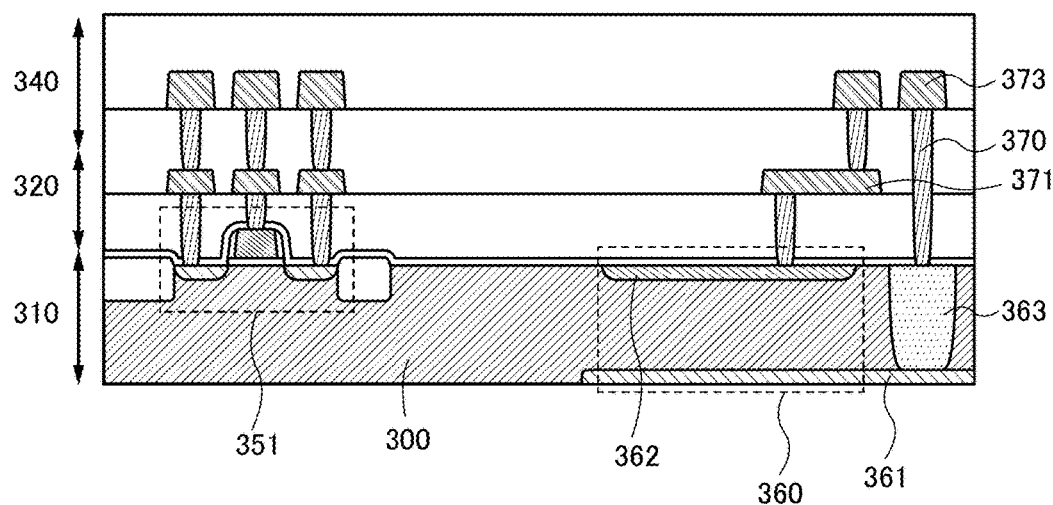

FIGS. 38A and 38B are each a cross-sectional view of an element included in an imaging device. The imaging device illustrated in FIG. 38A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 38A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 may be omitted. An example of a cross-sectional view in which the layer 330 is not provided is shown in FIG. 38B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 38A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 39A1 and FIG. 39B1, part or the whole of the imaging device can be bent. FIG. 39A1 illustrates a state in which the imaging device is bent in the direction of a dashed-dotted line X1-X2. FIG. 39A2 is a cross-sectional view illustrating a portion indicated by the dashed-dotted line X1-X2 in FIG. 39A1. FIG. 39A3 is a cross-sectional view illustrating a portion indicated by a dashed-dotted line Y1-Y2 in FIG. 39A1.

FIG. 39B1 illustrates a state where the imaging device is bent in the direction of a dashed-dotted line X3-X4 and the direction of a dashed-dotted line Y3-Y4. FIG. 39B2 is a cross-sectional view illustrating a portion indicated by the dashed-dotted line X3-X4 in FIG. 39B1. FIG. 39B3 is a cross-sectional view illustrating a portion indicated by the dashed-dotted line Y3-Y4 in FIG. 39B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

The structures described in this embodiment can be used in appropriate combination with any of the structures described in the other embodiments.

Embodiment 6

In this embodiment, examples of CPUs including semiconductor devices such as the transistor of one embodiment of the present invention and the above-described memory device will be described.

<Configuration of CPU>

Figure 40:
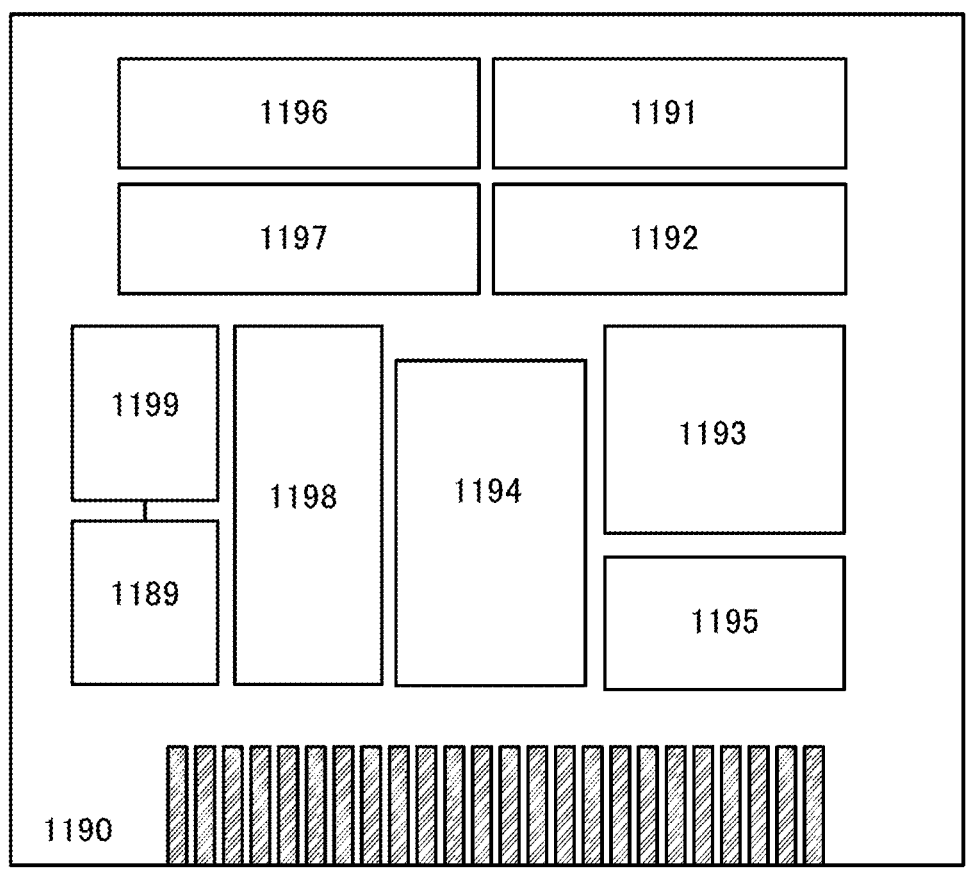
FIG. 40 is a block diagram illustrating a semiconductor device of one embodiment of the present invention.

FIG. 40 is a block diagram illustrating a configuration example of a CPU including any of the above-described transistors as a component.

The CPU illustrated in FIG. 40 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 40 is just an example in which the configuration has been simplified, and an actual CPU may have a variety of configurations depending on the application. For example, the CPU may have the following configuration: a structure including the CPU illustrated in FIG. 40 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 40, a memory cell is provided in the register 1196. For the memory cell of the register 1196, any of the above-described transistors, the above-described memory device, or the like can be used.

In the CPU illustrated in FIG. 40, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 41:
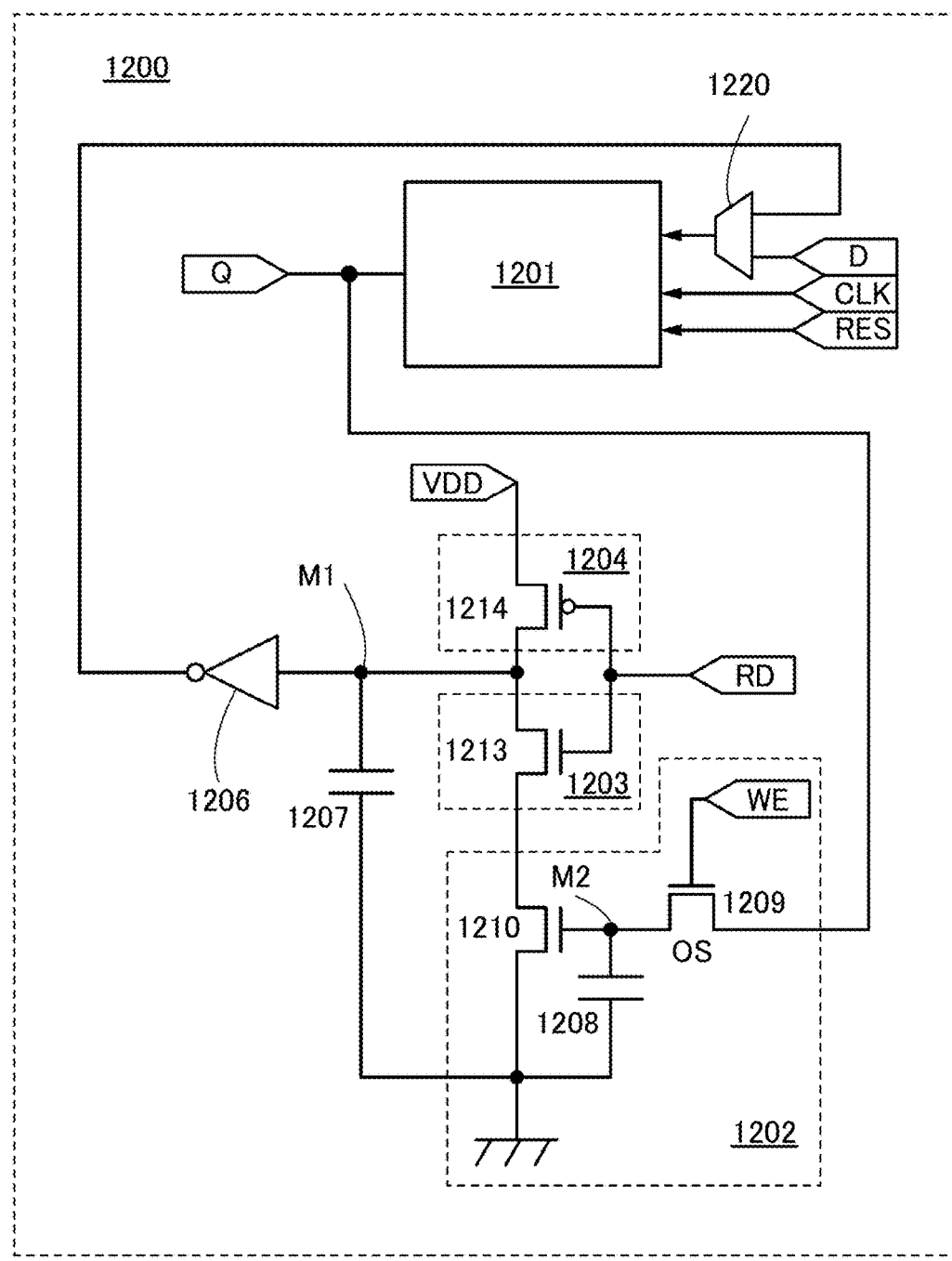
FIG. 41 is a circuit diagram illustrating a semiconductor device of one embodiment of the present invention.

FIG. 41 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 41 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 41, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 41, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 41, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (on state or the off state) is determined depending on the signal retained by the capacitor 1208, and the signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD) and a radio frequency (RF) device.

The structures described in this embodiment can be used in appropriate combination with any of the structures described in the other embodiments.

Embodiment 7

In this embodiment, a display device including the transistor of one embodiment of the present invention and the like is described with reference to FIGS. 42A to 42C and FIGS. 43A and 43B.

<Configuration of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules:

a module provided with a connector such as an FPC or TCP; a module in which a printed wiring board is provided at the end of TCP; and a module in which an integrated circuit (IC) is mounted directly on a display element by a COG method.

Figure 42A:
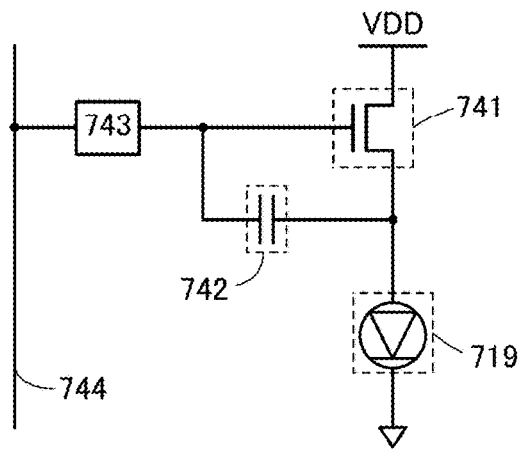
FIGS. 42A to 42C are a circuit diagram, a top view, and a cross-sectional view illustrating a semiconductor device of one embodiment of the present invention.
Figure 42B:
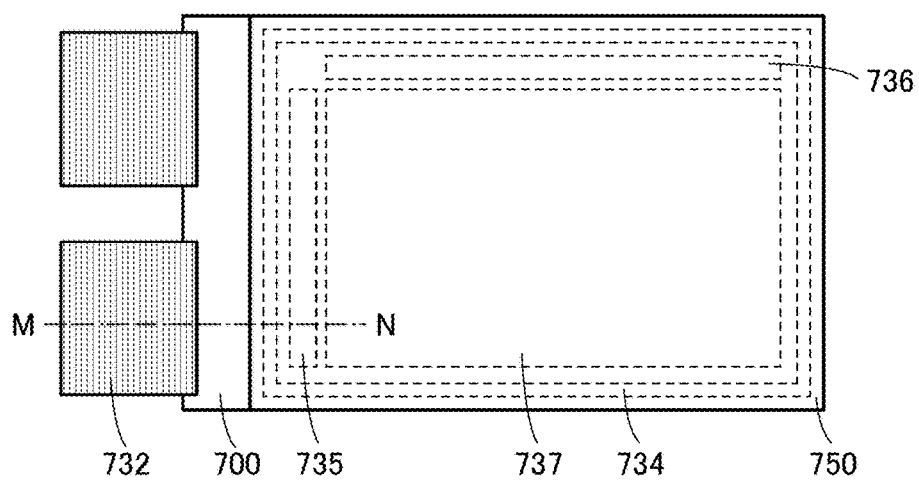
Figure 42C:
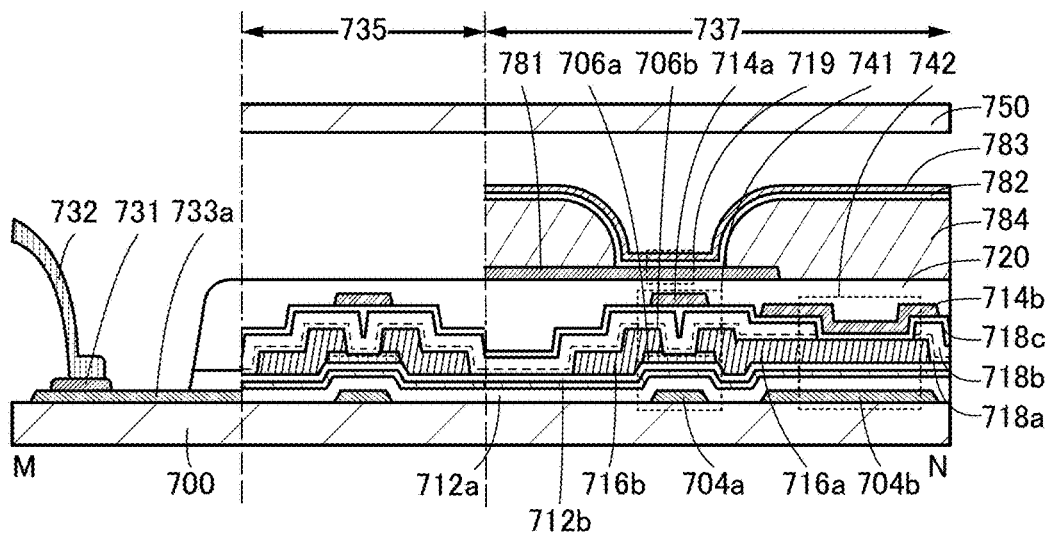

FIGS. 42A to 42C illustrate an example of an EL display device of one embodiment of the present invention. FIG. 42A is a circuit diagram of a pixel in an EL display device. FIG. 42B is a plan view showing the whole of the EL display device. FIG. 42C is a cross-sectional view taken along part of dashed-dotted line M-N in FIG. 42B.

FIG. 42A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 42A includes a switching element 743, a transistor 741, a capacitor 742, and a light-emitting element 719.

Note that FIG. 42A and the like each illustrate an example of a circuit structure; therefore, a transistor can be provided additionally. In contrast, for each node in FIG. 42A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 42B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 42C is a cross-sectional view of the EL display device taken along part of dashed-dotted line M-N in FIG. 42B.

FIG. 42C illustrates a structure of the transistor 741 including a conductor 704a over the substrate 700; an insulator 712a over the conductor 704a; an insulator 712b over the insulator 712a; semiconductors 706a and 706b that are over the insulator 712b and overlap with the conductor 704a; a conductor 716a and a conductor 716b in contact with the semiconductors 706a and 706b; an insulator 718a over the semiconductor 706b, the conductor 716a, and the conductor 716b; an insulator 718b over the insulator 718a; an insulator 718c over the insulator 718b; and a conductor 714a that is over the insulator 718c and overlaps with the semiconductor 706b. Note that the structure of the transistor 741 is just an example; the transistor 741 may have a structure different from that illustrated in FIG. 42C.

Thus, in the transistor 741 illustrated in FIG. 42C, the conductor 704a serves as a gate electrode, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator, and the conductor 714a serves as a gate electrode. Note that in some cases, electrical characteristics of the semiconductors 706a and 706b change if light enters the semiconductors 706a and 706b. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 42C illustrates a structure of the capacitor 742 including a conductor 704b over the substrate; the insulator 712a over the conductor 704b; the insulator 712b over the insulator 712a; the conductor 716a that is over the insulator 712b and overlaps with the conductor 704b; the insulator 718a over the conductor 716a; the insulator 718b over the insulator 718a; the insulator 718c over the insulator 718b; and a conductor 714b that is over the insulator 718c and overlaps with the conductor 716a. In this structure, part of the insulator 718a and part of the insulator 718b are removed in a region where the conductor 716*a* and the conductor 714*b* overlap with each other.

In the capacitor 742, each of the conductor 704*b* and the conductor 714*b* functions as one electrode, and the conductor 716*a* functions as the other electrode.

Thus, the capacitor 742 can be formed using a film of the transistor 741. The conductor 704*a* and the conductor 704*b* are preferably conductors of the same kind, in which case the conductor 704*a* and the conductor 704*b* can be formed through the same step. Furthermore, the conductor 714*a* and the conductor 714*b* are preferably conductors of the same kind, in which case the conductor 714*a* and the conductor 714*b* can be formed through the same step.

The capacitor 742 illustrated in FIG. 42C has a large capacitance per area occupied by the capacitor. Therefore, the EL display device illustrated in FIG. 42C has high display quality. Note that although the capacitor 742 illustrated in FIG. 42C has the structure in which the part of the insulator 718*a* and the part of the insulator 718*b* are removed to reduce the thickness of the region where the conductor 716*a* and the conductor 714*b* overlap with each other, the structure of the capacitor according to one embodiment of the present invention is not limited to the structure. For example, a structure in which part of the insulator 718*c* is removed to reduce the thickness of the region where the conductor 716*a* and the conductor 714*b* overlap with each other may be used.

An insulator 720 is provided over the transistor 741 and the capacitor 742. Here, the insulator 720 may have an opening reaching the conductor 716*a* that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

So far, examples of the EL display device are described. Next, an example of a liquid crystal display device is described.

Figure 43A:
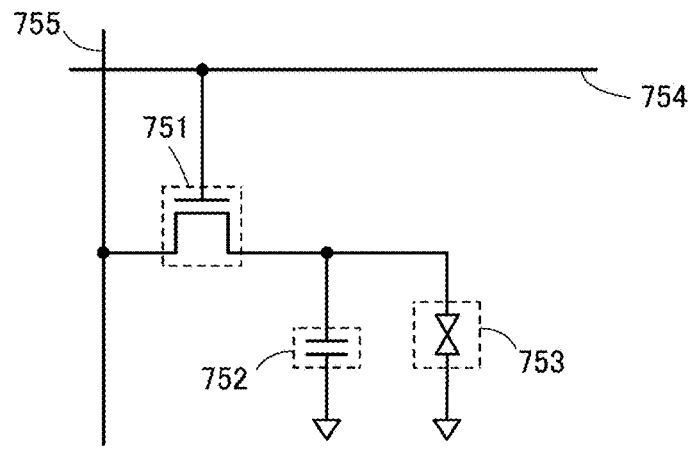
FIGS. 43A and 43B are a circuit diagram and a cross-sectional view illustrating a semiconductor device of one embodiment of the present invention.

FIG. 43A is a circuit diagram illustrating a configuration example of a pixel of a liquid crystal display device. A pixel shown in FIGS. 43A and 43B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 43B:
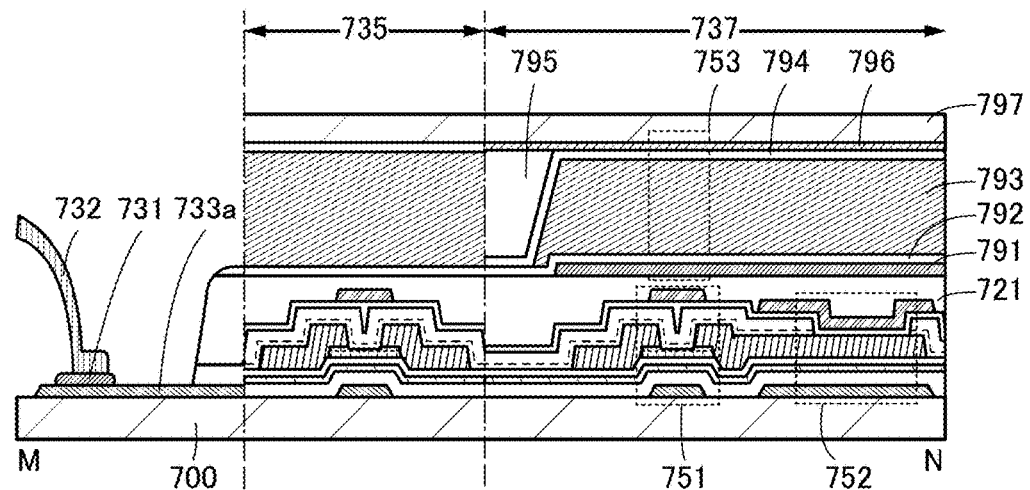

Note that the description of the liquid crystal display device is made on the assumption that the plan view of the liquid crystal display device is similar to that of the EL display device. FIG. 43B is a cross-sectional view of the liquid crystal display device taken along dashed-dotted line M-N in FIG. 42B. In FIG. 43B, the FPC 732 is connected to the wiring 733*a* via the terminal 731. Note that the wiring 733*a* may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 43B corresponds to, but is not limited to, the structure of the capacitor 742 in FIG. 42C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751 (not illustrated). A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display devices having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structures described in this embodiment can be used in appropriate combination with any of the structures described in the other embodiments.

Embodiment 8

In this embodiment, electronic devices each including the transistor or the like of one embodiment of the present invention are described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 44A to 44F illustrate specific examples of these electronic devices.

Figure 44A:
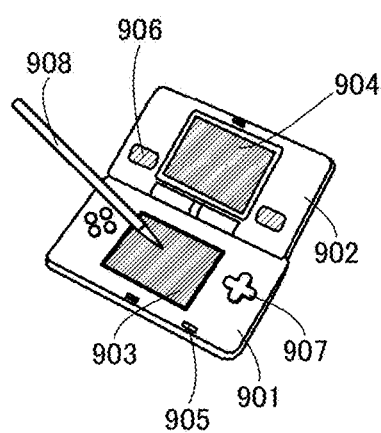
FIGS. 44A to 44F are perspective views each illustrating an electronic device of one embodiment of the present invention.

FIG. 44A illustrates a portable game console including a housing 901, a housing 902, a display portion 903, a display portion 904, a microphone 905, a speaker 906, an operation key 907, a stylus 908, and the like. Although the portable game console in FIG. 44A has the two display portions 903 and 904, the number of display portions included in a portable game console is not limited to this.

Figure 44B:
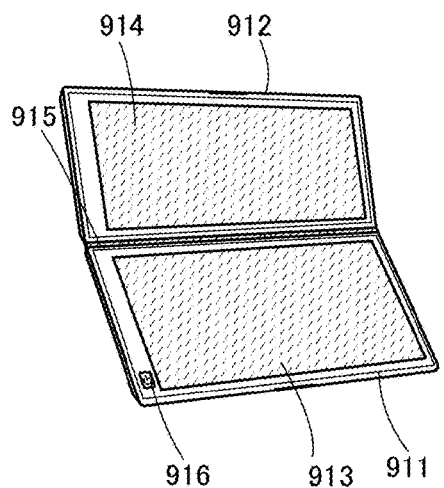

FIG. 44B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 44C:
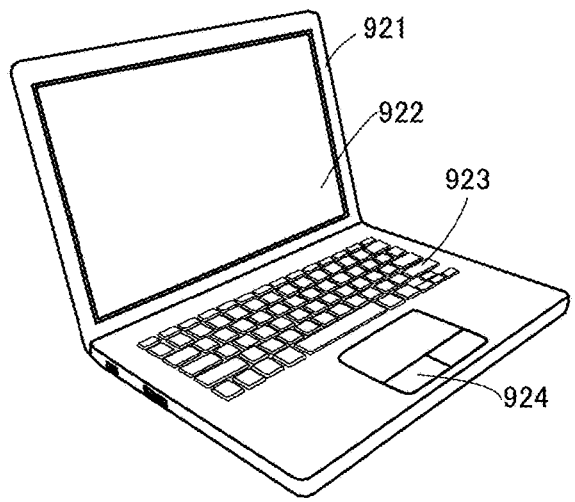

FIG. 44C illustrates a notebook personal computer, which includes a housing 921, a display portion 922, a keyboard 923, a pointing device 924, and the like.

Figure 44D:
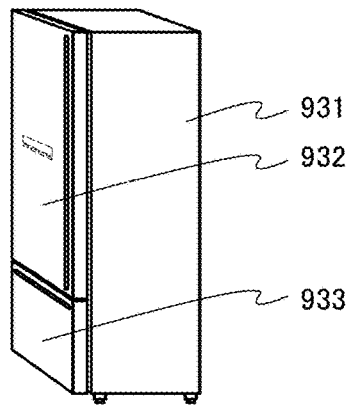

FIG. 44D illustrates an electric refrigerator-freezer, which includes a housing 931, a door for a refrigerator 932, a door for a freezer 933, and the like.

Figure 44E:
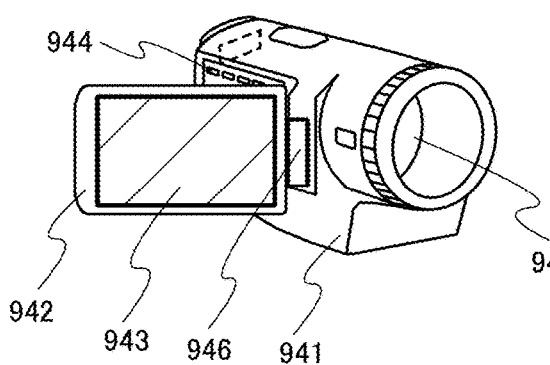

FIG. 44E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 44F:
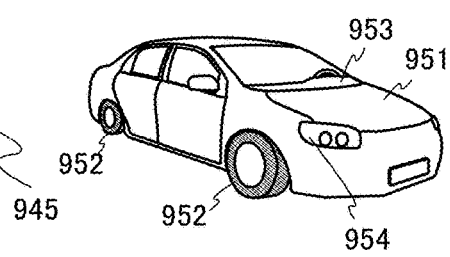

FIG. 44F illustrates a car including a car body 951, wheels 952, a dashboard 953, lights 954, and the like.

This embodiment of the present invention has been described in the above embodiments. Note that one embodiment of the present invention is not limited thereto. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

Example 1

In this example, the results of evaluating the composition of a W—Si film which is used as a conductor of a transistor or the like will be described.

The sample was fabricated in such a manner that a 50-nm-thick silicon oxide (SiO$_x$) was formed over a Si wafer by a thermal oxidation method, and a 50-nm-thick W—Si film was formed thereon with a sputtering apparatus.

The W—Si film was formed under the following conditions: a sputtering apparatus using a W—Si target having a composition ratio of W:Si=1:2.7 (atomic ratio) was used, an atmosphere containing an argon gas at 50 sccm was used, the pressure was controlled to 0.4 Pa, the substrate temperature was set at room temperature, and a power of 1 kW from a DC power source was applied to the target.

Figure 45A:
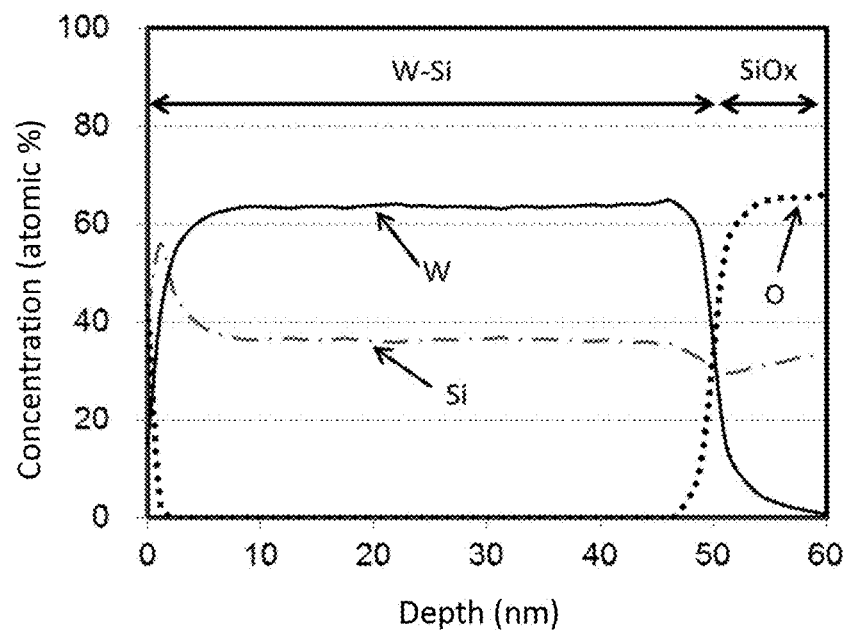
FIGS. 45A and 45B each show an XPS analysis result.
Figure 45B:
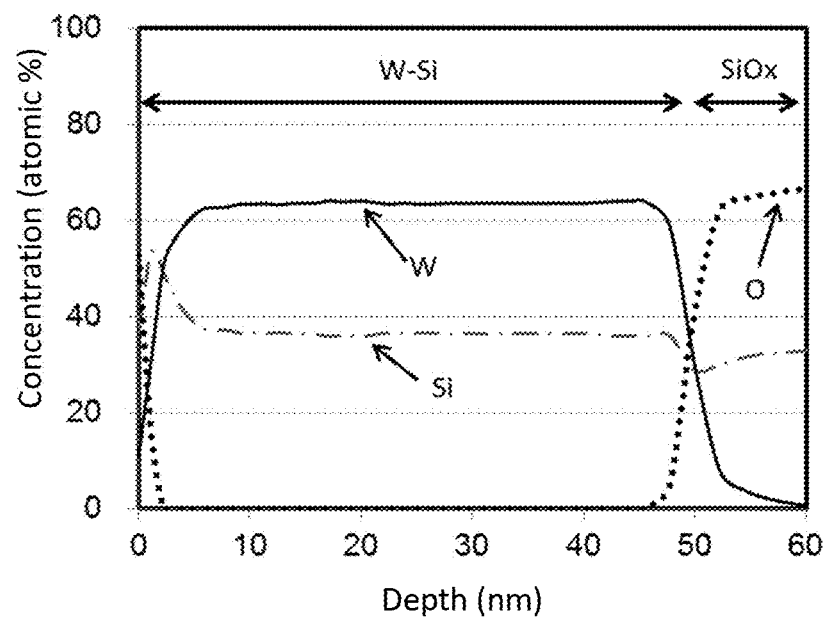

The samples fabricated in the above manner were measured by X-ray photoelectron spectroscopy (XPS). The measurement result of the sample which was not subjected to heat treatment is shown in FIG. 45A. The measurement result of the sample which was subjected to heat treatment in an atmospheric atmosphere at 400° C. for one hour is shown in FIG. 45B. Note that concentration profile in the depth direction was measured from the surface of the W—Si film by XPS.

In the XPS result in FIG. 45A, a region with high concentration of Si and O is measured in the vicinity of the surface of the W—Si film, which indicates that a layer of SiO$_x$ is formed. In the XPS result in FIG. 45B, O concentration on the surface of the W—Si film is only slightly increased as compared to that of the result of FIG. 45A even when the W—Si film is subjected to heat treatment.

According to these results, it is found that the W—Si film is hardly oxidized even when it is subjected to heat treatment.

Example 2

In this example, the results of observing a cross section of a W—Si film which is used as a conductor of a transistor or the like with a scanning transmission electron microscope (STEM) are described.

The sample was fabricated in such a manner that a 50-nm-thick silicon oxide (SiO$_x$) was formed over a Si wafer by a thermal oxidation method, and a 50-nm-thick W—Si film was formed thereon with a sputtering apparatus.

The W—Si film was formed under the following conditions: a sputtering apparatus using a W—Si target having a composition ratio of W:Si=1:2.7 (atomic ratio) was used, an atmosphere containing an argon gas at 50 sccm was used, the pressure was controlled to 0.4 Pa, the substrate temperature was set at room temperature, and a power of 1 kW from a DC power source was applied to the target.

Figure 46A:
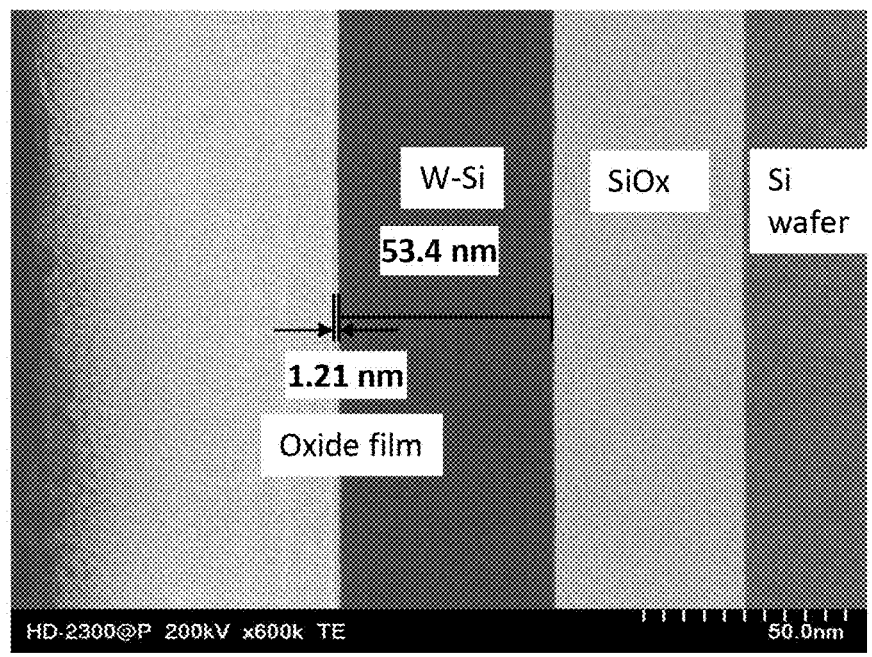
FIGS. 46A and 46B each show a STEM image of a sample.
Figure 46B:
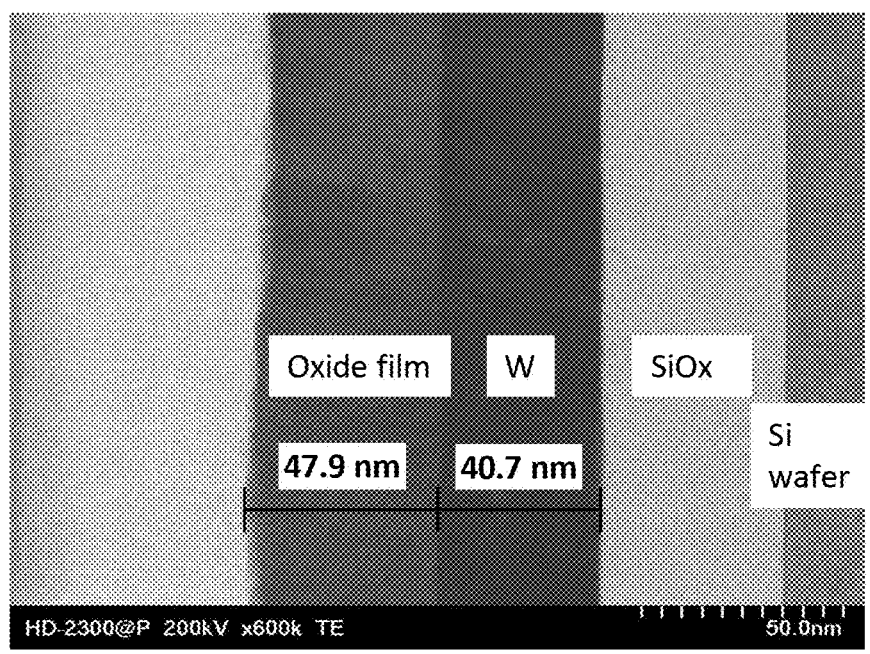

The sample fabricated in the above manner is subjected to heat treatment in an atmospheric atmosphere at 400° C. for one hour. FIG. 46A shows a cross-sectional image of the sample observed by STEM. For comparison, a 50-nm-thick W film was formed instead of the W—Si film, and the film was subjected to heat treatment in an atmospheric atmosphere at 400° C. for one hour. FIG. 46B shows a cross-sectional image of the sample of the W film observed by STEM.

As shown in the STEM image in FIG. 46A, a thin oxide film is observed on a surface of the W—Si film even in the sample subjected to heat treatment, which means that the W—Si film is hardly oxidized. In contrast, as shown in the STEM image in FIG. 46B, a thick oxide film is formed on the surface of the W film.

The results show that the W—Si film has higher oxidation resistance than the W film.

The above results show that the use of the W—Si film for a conductor of a transistor can suppress an increase in electric resistance due to oxidation of the conductor through heat treatment or the like in manufacturing the transistor, whereby a transistor can have favorable and stable electrical characteristics.

This application is based on Japanese Patent Application serial no. 2015-140794 filed with Japan Patent Office on Jul. 14, 2015, the entire contents of which are hereby incorporated by reference.

What is claimed is:

1. A semiconductor device comprising:
   an oxide semiconductor;
   a first insulator in contact with the oxide semiconductor;
   a second insulator in contact with the first insulator;
   a first conductor overlapping with the oxide semiconductor with the first and second insulators between the oxide semiconductor and the first conductor; and
   second and third conductors in contact with and between the oxide semiconductor and the first insulator,
   wherein at least one of the second and third conductors includes a first region containing tungsten and one or more elements selected from silicon, carbon, germanium, tin, aluminum, and nickel,
   wherein the first region includes a second region containing silicon and oxygen on a surface of the first region, and
   wherein a thickness of the second region is greater than or equal to 0.2 nm and less than or equal to 20 nm.

2. The semiconductor device according to claim 1, wherein a silicon concentration of the first region is greater than or equal to 5 atomic % and less than or equal to 70 atomic % measured by Rutherford back scattering spectrometry.

3. The semiconductor device according to claim 1, wherein the oxide semiconductor comprises a pair of regions and a channel between the pair of regions, and wherein the pair of regions is respectively in contact with the second and third conductors, and has a lower resistivity than the channel.

4. The semiconductor device according to claim 3, wherein the pair of regions has a lower oxygen concentration than the channel owing to extraction of oxygen from the pair of regions by the second and third conductors.

5. The semiconductor device according to claim 1, wherein the first insulator comprises an oxide containing at least one metal element contained in the oxide semiconductor.

6. A semiconductor device comprising:
   an oxide semiconductor;
   a first insulator in contact with a first surface of the oxide semiconductor;
   a second insulator in contact with the first insulator;
   a first conductor overlapping with the oxide semiconductor with the first and second insulators between the oxide semiconductor and the first conductor;

second and third conductors in contact with and between the first surface of the oxide semiconductor and the first insulator;

a third insulator in contact with a second surface of the oxide semiconductor; and a fourth conductor under the third insulator, wherein at least one of the second and third conductors includes a first region containing tungsten and one or more elements selected from silicon, carbon, germanium, tin, aluminum, and nickel, wherein the fourth conductor includes a second region containing tungsten and one or more elements selected from silicon, carbon, germanium, tin, aluminum, and nickel, wherein the first region includes a third region containing silicon and oxygen, and wherein a thickness of the third region is greater than or equal to 0.2 nm and less than or equal to 20 nm.

7. The semiconductor device according to claim 6, wherein a silicon concentration of the first region is greater than or equal to 5 atomic % and less than or equal to 70 atomic % measured by Rutherford back scattering spectrometry.

8. The semiconductor device according to claim 6, wherein a silicon concentration of the second region is greater than or equal to 5 atomic % and less than or equal to 70 atomic % measured by Rutherford back scattering spectrometry.

9. The semiconductor device according to claim 6, wherein the second region includes a fourth region containing silicon and oxygen on a surface of the second region, and wherein a thickness of the fourth region is greater than or equal to 0.2 nm and less than or equal to 20 nm.

10. The semiconductor device according to claim 6, wherein the oxide semiconductor and the first insulator each contain In, Ga, and Zn.

11. The semiconductor device according to claim 6, wherein the oxide semiconductor comprises a pair of regions and a channel between the pair of regions, and wherein the pair of regions is respectively in contact with the second and third conductors, and has a lower resistivity than the channel.

12. The semiconductor device according to claim 11, wherein the pair of regions has a lower oxygen concentration than the channel owing to extraction of oxygen from the pair of regions by the second and third conductors.

13. The semiconductor device according to claim 6, wherein the first insulator comprises an oxide containing at least one metal element contained in the oxide semiconductor.

14. A semiconductor device comprising:

an oxide semiconductor;

a first insulator in contact with the oxide semiconductor;

a second insulator in contact with the first insulator;

a first conductor overlapping with the oxide semiconductor with the first and second insulators between the oxide semiconductor and the first conductor; and second and third conductors in contact with and between the oxide semiconductor and the first insulator, wherein at least one of the second and third conductors includes a first region containing tungsten and one or more elements selected from silicon, carbon, germanium, tin, aluminum, and nickel, and wherein the oxide semiconductor and the first insulator each contain In, Ga, and Zn.

15. The semiconductor device according to claim 14, wherein a silicon concentration of the first region is greater than or equal to 5 atomic % and less than or equal to 70 atomic % measured by Rutherford back scattering spectrometry.

16. The semiconductor device according to claim 14, wherein the first region includes a second region containing silicon and oxygen on a surface of the first region, and wherein a thickness of the second region is greater than or equal to 0.2 nm and less than or equal to 20 nm.

17. The semiconductor device according to claim 14, wherein the first insulator comprises an oxide containing at least one metal element contained in the oxide semiconductor.

* * * * *